US012712535B2

(12) United States Patent
Chiang et al.

(10) Patent No.: US 12,712,535 B2
(45) Date of Patent: Aug. 18, 2026

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Yueh Chiang, Hsinchu (TW); Shang-Hsuan Chiu, Hsinchu (TW); Ming-Xiang Lu, Hsinchu (TW); Kuang-Ching Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 28 days.

(21) Appl. No.: 18/791,112

(22) Filed: Jul. 31, 2024

(65) Prior Publication Data

US 2024/0396536 A1 Nov. 28, 2024

Related U.S. Application Data

(62) Division of application No. 18/309,217, filed on Apr. 28, 2023, now Pat. No. 12,199,615.

(Continued)

(51) Int. Cl.
*H03K 3/356* (2006.01)
*G06F 30/39* (2020.01)

(Continued)

(52) U.S. Cl.
CPC ......... *H03K 3/35625* (2013.01); *G06F 30/39* (2020.01); *H03K 3/356139* (2013.01);

(Continued)

(58) Field of Classification Search
CPC .......... H03K 3/02; H03K 3/027; H03K 3/037; H03K 3/0372; H03K 3/353; H03K 3/356; H03K 3/3562; H03K 3/35625; H03K 3/356104; H03K 3/356139; H03K 19/20; G06F 30/30; G06F 30/39; H01L 27/0207; H01L 27/0922; H10D 84/856; H10D 89/10

See application file for complete search history.

(56) References Cited

U.S. PATENT DOCUMENTS 9,711,097 B2 * 7/2017 Yokoyama ........... G09G 3/3611
11,742,838 B2 8/2023 Kim (Continued)

FOREIGN PATENT DOCUMENTS

KR 10-2001-0093665 10/2001
KR 10-2018-0009036 1/2018

*Primary Examiner* — Long Nguyen
(74) *Attorney, Agent, or Firm* — Hauptman Ham, LLP

(57) ABSTRACT

A flip-flop includes a first input circuit, a first NAND logic gate, a first stacked gate circuit, a first NOR logic gate, a first output circuit and a first set buffer circuit. The first input circuit is coupled to a first node. The first NAND logic gate is coupled between the first and second node. The first stacked gate circuit is coupled between the first and third node, and configured to generate a third signal responsive to the first signal. The first NOR logic gate is coupled between the third node and a fourth node. The first output circuit is coupled to the fourth node. The first set buffer circuit is coupled to the first NOR logic gate.

20 Claims, 30 Drawing Sheets

Related U.S. Application Data

(60) Provisional application No. 63/477,705, filed on Dec. 29, 2022.

(51) Int. Cl.

| | |
|---|---|
| ***H03K 3/3562*** | (2006.01) |
| ***H03K 19/20*** | (2006.01) |
| ***H10D 84/85*** | (2025.01) |
| ***H10D 89/10*** | (2025.01) |

(52) U.S. Cl.

CPC .......... *H03K 19/20* (2013.01); *H10D 84/856* (2025.01); *H10D 89/10* (2025.01)

(56) References Cited

U.S. PATENT DOCUMENTS

| | | | | |
|---|---|---|---|---|
| 12,095,546 | B2 * | 9/2024 | Rahn .................. | H04B 10/0773 |
| 2024/0204759 | A1 | 6/2024 | Chiang | |

* cited by examiner

INTEGRATED CIRCUIT AND METHOD OF FORMING THE SAME

PRIORITY CLAIM

The present application is a divisional of U.S. application Ser. No. 18/309,217, filed Apr. 28, 2023, now U.S. Pat. No. 12,199,719, issued Jan. 14, 2025, which claims the benefit of U.S. Provisional Application No. 63/477,705, filed Dec. 29, 2022, which are herein incorporated by reference in their entireties.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
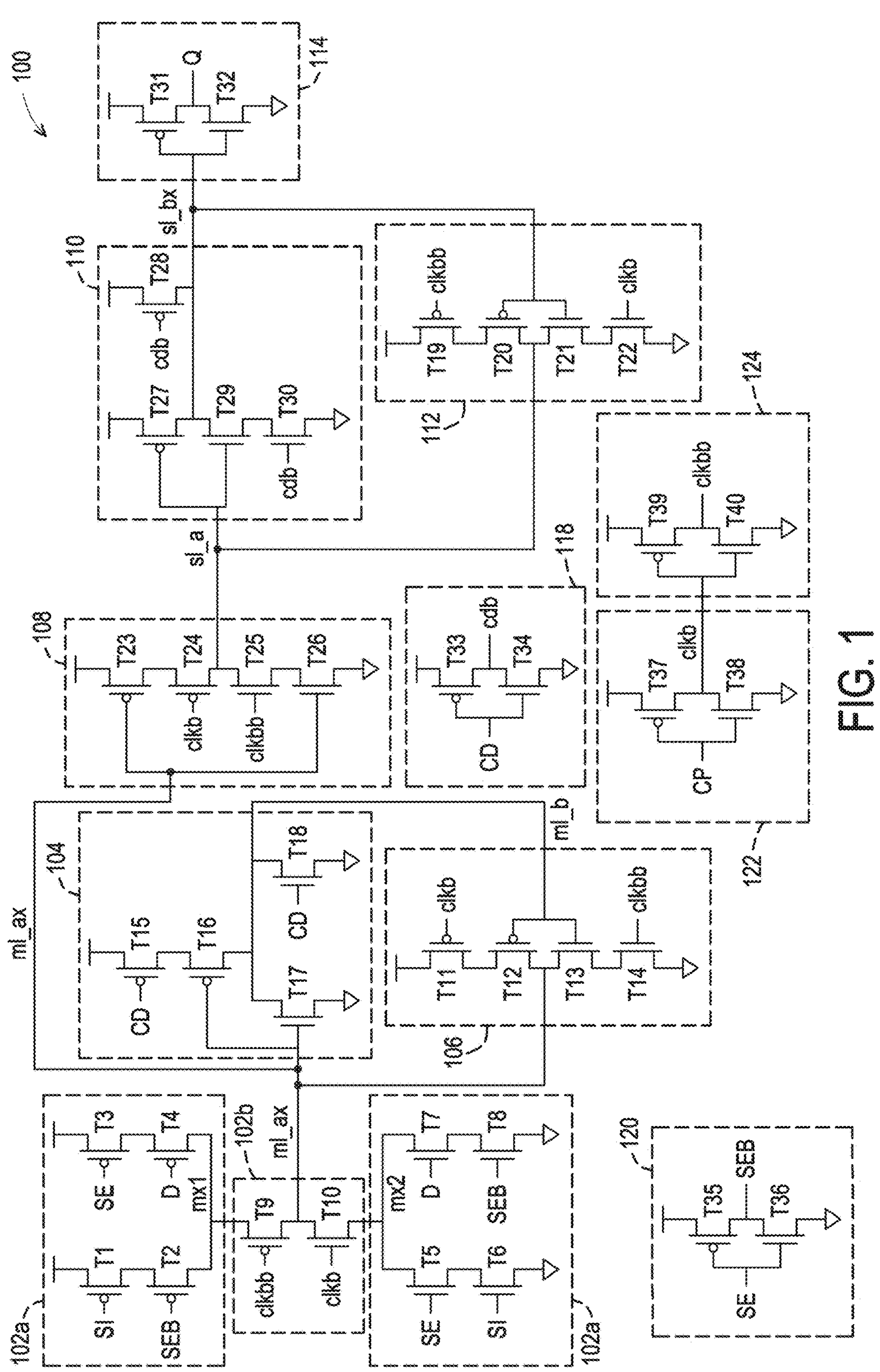
FIG. 1 is a circuit diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a flip-flop includes a first input circuit coupled to a first node. In some embodiments, the first input circuit is configured to generate a first signal responsive to at least a first data signal, a first clock signal, or a second clock signal inverted from the first clock signal.

In some embodiments, the flip-flop further includes a first NOR logic gate coupled between the first node and a second node. In some embodiments, the first NOR logic gate is being configured to generate a second signal responsive to the first signal and a first reset signal.

In some embodiments, the flip-flop further includes a first stacked gate circuit coupled between the first node and a third node. In some embodiments, the first stacked gate circuit is configured to generate a third signal responsive to at least the first signal.

In some embodiments, the flip-flop further includes a first NAND logic gate coupled between the third node and a fourth node. In some embodiments, the first NAND logic gate is configured to generate a fourth signal responsive to the third signal and a second reset signal inverted from the first reset signal.

In some embodiments, the flip-flop further includes a first output circuit coupled to the fourth node. In some embodiments, the first output circuit is configured to generate a first output signal responsive to the fourth signal.

In some embodiments, positioning the NOR logic gate between the first node and the second node in the integrated circuit, reduces a number of sensitive nodes within the integrated circuit, thus increasing reliability and accuracy of the integrated circuit compared to other approaches.

In some embodiments, positioning the NAND logic gate between the third node and the fourth node in the integrated circuit, reduces a number of sensitive nodes within the integrated circuit, thus increasing reliability and accuracy of the integrated circuit compared to other approaches.

FIG. 1 is a circuit diagram of an integrated circuit 100, in accordance with some embodiments.

In some embodiments, integrated circuit 100 is a scan flip-flop circuit. In some embodiments, integrated circuit 100 is a D-flip-flop circuit with an asynchronous reset. In some embodiments, the integrated circuit 100 is triggered by a rising edge of at least a clock signal CP. In some embodiments, integrated circuit 100 is a multi-bit flip-flop (MBFF) circuit.

Integrated circuit 100 is a flip-flop circuit. Integrated circuit 100 is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 100 includes a circuit 102*a*, a circuit 102*b*, a NOR circuit 104, a reversed tri-state gate circuit 106, a stacked gate circuit 108, a NAND circuit 110, a reversed tri-state gate circuit 112, an output circuit 114, an inverter 118, an inverter 120, an inverter 122 and an inverter 124. In some embodiments, circuit 102*a* is a multiplexer. In some embodiments, inverter 118 is a local buffer circuit.

Circuit 102*a* is coupled to circuit 102*b*. Circuit 102*a* includes a first input terminal configured to receive the data signal D, a second input terminal configured to receive the scan in signal SI, a third input terminal configured to receive a scan enable signal SE, and a fourth input terminal configured to receive an inverted scan enable signal SEB. In some embodiments, the scan enable signal SE is a selection signal of circuit 102*a*, and the inverted scan enable signal SEB is an inverted selection signal of circuit 102*a*. A first output terminal of circuit 102*a* is coupled to a first input terminal of circuit 102*b*. A second output terminal of circuit 102*a* is coupled to a second input terminal of circuit 102*b*. In some embodiments, circuit 102*a* is coupled to inverter 120, and is configured to receive inverted scan enable signal SEB.

Circuit 102*b* is coupled to circuit 102*a*, NOR circuit 104, reversed tri-state gate circuit 106, and stacked gate circuit 108. Circuit 102*b* is configured to output a signal ml_ax to NOR circuit 104. In some embodiments, circuit 102*b* is coupled to inverter 122, and is configured to receive clock signal clkb. In some embodiments, circuit 102*b* is coupled to inverter 124, and is configured to receive clock signal clkbb.

NOR circuit 104 is coupled to circuit 102*b*, reversed tri-state gate circuit 106, and stacked gate circuit 108.

A first set of input terminals of NOR circuit 104 is configured to receive signal ml_ax from circuit 102*b* and reversed tri-state gate circuit 106. A second set of input terminals of NOR circuit 104 is configured to receive signal CD from a source (not shown). An output terminal of NOR circuit 104 is coupled to an input terminal of reversed tri-state gate circuit 106. NOR circuit 104 is configured to generate a signal ml_b. NOR circuit 104 is configured to output the signal ml_b to reversed tri-state gate circuit 106 by an output terminal of the NOR circuit 104.

Reversed tri-state gate circuit 106 is coupled to NOR circuit 104, circuit 102*b* and stacked gate circuit 106. In some embodiments, reversed tri-state gate circuit 106 is coupled to inverter 122, and is configured to receive clock signal clkb. In some embodiments, reversed tri-state gate circuit 106 is coupled to inverter 124, and is configured to receive clock signal clkbb.

An input terminal of reversed tri-state gate circuit 106 is coupled to an output terminal of NOR circuit 104. Reversed tri-state gate circuit 106 is configured to generate the signal ml_ax in response to signal ml_b. An output terminal of reversed tri-state gate circuit 106 is configured to output the signal ml_ax to NOR circuit 104 and stacked gate circuit 108.

Stacked gate circuit 108 is coupled to circuit 102*b*, NOR circuit 104, reversed tri-state gate circuit 106, NAND circuit 110 and reversed tri-state gate circuit 112. In some embodiments, stacked gate circuit 108 is coupled to inverter 122, and is configured to receive clock signal clkb. In some embodiments, stacked gate circuit 108 is coupled to inverter 124, and is configured to receive clock signal clkbb.

An input terminal of stacked gate circuit 108 is coupled to the output terminal of circuit 102*b* and the output terminal of reversed tri-state gate circuit 106. Stacked gate circuit 108 is configured to generate a signal sl_a in response to the signal ml_ax. An output terminal of stacked gate circuit 108 is configured to output the signal sl_a to NAND circuit 110.

NAND circuit 110 is coupled to stacked gate circuit 108, reversed tri-state gate circuit 112 and output circuit 114.

A first set of input terminals of NAND circuit 110 is configured to receive signal sl_a from stacked gate circuit 108 and reversed tri-state gate circuit 112. A second set of input terminals of NAND circuit 110 is configured to receive signal cdb from inverter 118. An output terminal of NAND circuit 110 is coupled to an input terminal of reversed tri-state gate circuit 112 and an input terminal of output circuit 114. NAND circuit 110 is configured to generate a signal sl_bx in response to signal sl_a and signal cdb. An output terminal of NAND circuit 110 is configured to output the signal sl_bx to reversed tri-state gate circuit 112 and output circuit 114.

Reversed tri-state gate circuit 112 is coupled to NAND circuit 110, stacked gate circuit 108 and output circuit 114. In some embodiments, reversed tri-state gate circuit 112 is coupled to inverter 122, and is configured to receive clock signal clkb. In some embodiments, reversed tri-state gate circuit 112 is coupled to inverter 124, and is configured to receive clock signal clkbb.

An input terminal of reversed tri-state gate circuit 112 is coupled to an output terminal of NAND circuit 110. Reversed tri-state gate circuit 112 is configured to generate the signal sl_a in response to signal sl_bx. An output terminal of reversed tri-state gate circuit 112 is configured to output the signal sl_a to NAND circuit 110.

Output circuit 114 is coupled to NAND circuit 110. The input terminal of output circuit 114 is configured to receive signal sl_bx from NAND circuit 110. An output terminal of output circuit 114 is configured to output the output signal Q.

An input terminal of inverter 118 is configured to receive the signal CD. An output terminal of inverter 118 is configured to output the signal cdb. In some embodiments, signal cdb is inverted from signal CD, and vice versa.

An input terminal of inverter 120 is configured to receive the scan enable signal SE. In some embodiments, the input terminal of inverter 120 is coupled to the third input terminal of circuit 102*a*. An output terminal of inverter 120 is configured to output the inverted scan enable signal SEB. In some embodiments, the output terminal of inverter 120 is coupled to the fourth input terminal of circuit 102*a*. In some embodiments, inverted scan enable signal SEB is inverted from scan enable signal SE, and vice versa.

An input terminal of inverter 122 is configured to receive clock signal CP. An output terminal of inverter 122 is configured to output the clock signal clkb to at least an input terminal of inverter 124. In some embodiments, clock signal clkb is inverted from clock signal CP, and vice versa.

An input terminal of inverter 124 is coupled to at least the output terminal of inverter 122, and is configured to receive clock signal clkb. An output terminal of inverter 124 is configured to output the clock signal clkbb. In some embodiments, clock signal clkbb is inverted from clock signal clkb, and vice versa.

Circuit 102*a* includes transistors T1-T8. In some embodiments, each of transistors T1, T2, T3 and T4 is a p-type metal oxide semiconductor (PMOS) transistor. In some embodiments, each of transistors T5, T6, T7 and T8 is an n-type metal oxide semiconductor (NMOS) transistor.

A gate terminal of transistor T1 is configured to receive scan in signal SI. A gate terminal of transistor T6 is configured to receive scan in signal SI. In some embodiments, the gate terminal of transistor T1 is coupled to the gate terminal of transistor T6.

A source terminal of transistor T1 is coupled to the voltage supply VDD. A drain terminal of transistor T1 is coupled to a source terminal of transistor T2.

A gate terminal of transistor T2 is configured to receive inverted scan enable signal SEB.

A gate terminal of transistor T3 is configured to receive scan enable signal SE. A source terminal of transistor T3 is coupled to the voltage supply VDD. A drain terminal of transistor T3 is coupled to a source terminal of transistor T4.

A gate terminal of transistor T4 is configured to receive data signal D. A gate terminal of transistor T7 is configured to receive data signal D. In some embodiments, the gate terminal of transistor T4 is coupled to the gate terminal of transistor T7.

A source terminal of transistor T6 is coupled to the reference voltage supply VSS. A drain terminal of transistor T6 is coupled to a source terminal of transistor T5. A gate terminal of transistor T5 is configured to receive scan enable signal SE. In some embodiments, the gate terminal of transistor T5 is coupled to the gate terminal of transistor T3.

A gate terminal of transistor T8 is configured to receive inverted scan enable signal SEB. In some embodiments, the gate terminal of transistor T8 is coupled to the gate terminal of transistor T2. A source terminal of transistor T8 is coupled to the reference voltage supply VSS. A drain terminal of transistor T8 is coupled to a source terminal of transistor T7.

Circuit 102*b* includes transistors T9-T10. In some embodiments, transistor T9 is a PMOS transistor. In some embodiments, transistor T10 is an NMOS transistor.

A gate terminal of transistor T9 is configured to receive clock signal clkbb. A gate terminal of transistor T10 is configured to receive clock signal clkb.

Each of a source terminal of transistor T9, a drain terminal of transistor T2 and a drain terminal of transistor T4 are coupled together. Signal mx1 is the signal of at least the source terminal of transistor T9, the drain terminal of transistor T2 or the drain terminal of transistor T4.

Each of a source terminal of transistor T10, a drain terminal of transistor T5 and a drain terminal of transistor T7 are coupled together. Signal mx2 is the signal of at least the source terminal of transistor T10, the drain terminal of transistor T5 or the drain terminal of transistor T7.

Each of a drain terminal of transistor T9, a drain terminal of transistor T10, a drain terminal of transistor T12, a drain terminal of transistor T13, a gate terminal of transistor T16, a gate terminal of transistor T17, a gate terminal of transistor T23 and a gate terminal of transistor T26 are coupled together. Signal ml_ax is the signal of at least the drain terminal of transistor T9, the drain terminal of transistor T10, the drain terminal of transistor T12, the drain terminal of transistor T13, the gate terminal of transistor T16, the gate terminal of transistor T17, the gate terminal of transistor T23 or the gate terminal of transistor T26.

NOR circuit 104 includes transistors T15-T18. In some embodiments, each of transistors T15 and T16 is a PMOS transistor. In some embodiments, each of transistors T17 and T18 is an NMOS transistor.

Each of a gate terminal of transistor T15 and a gate terminal of transistor T18 is configured to receive signal CD. In some embodiments, each of a gate terminal of transistor T15 and a gate terminal of transistor T18 are coupled together.

A source terminal of transistor T15 is coupled to the voltage supply VDD. A drain terminal of transistor T15 is coupled to a source terminal of transistor T16.

Each of a drain terminal of transistor T16, a drain terminal of transistor T17, a drain terminal of transistor T18, a gate terminal of transistor T12 and a gate terminal of transistor T13 are coupled together. Signal ml_b is the signal of at least the drain terminal of transistor T16, the drain terminal of transistor T17, the drain terminal of transistor T18, the gate terminal of transistor T12 or the gate terminal of transistor T13.

Each of the gate terminal of transistor T16 and the gate terminal of transistor T17 is configured to receive signal ml_ax.

A source terminal of transistor T17 is coupled to the reference voltage supply VSS. A source terminal of transistor T18 is coupled to the reference voltage supply VSS.

In some embodiments, positioning the NOR circuit 104 in integrated circuit 100 as shown, reduces a number of sensitive nodes within integrated circuit 100, thus increasing reliability and accuracy of integrated circuit 100 compared to other approaches.

Reversed tri-state gate circuit 106 includes transistors T11-T14. In some embodiments, each of transistors T11 and T12 is a PMOS transistor. In some embodiments, each of transistors T13 and T14 is an NMOS transistor.

A source terminal of transistor T11 is coupled to the voltage supply VDD. A drain terminal of transistor T11 is coupled to a source terminal of transistor T12.

A gate terminal of transistor T11 is configured to receive clock signal clkb. In some embodiments, the gate terminal of transistor T11 is coupled to at least an output terminal of inverter 122.

Each of the gate terminal of transistor T12 and the gate terminal of transistor T13 is configured to receive signal ml_b.

A source terminal of transistor T13 is coupled to a drain terminal of transistor T14. A gate terminal of transistor T14 is configured to receive clock signal clkbb. In some embodiments, the gate terminal of transistor T14 is coupled to at least an output terminal of inverter 124.

A source terminal of transistor T14 is coupled to the reference voltage supply VSS.

In some embodiments, by using the reversed tri-state gate circuit 106 in integrated circuit 100 as shown, a distance (e.g., distance D1_a_ or D1_b_ in FIG. 2) between a node of signal ml_ax and a node of signal ml_b is reduced compared to other approaches, thus increasing a critical charge $Q_{CRIT}$ of at least the reversed tri-state gate circuit 106 by increasing the corresponding collected charge $Q_{COL}$, thereby increasing the reliability and accuracy of integrated circuit 100 compared to other approaches.

Stacked gate circuit 108 includes transistors T23-T26. In some embodiments, each of transistors T23 and T24 is a PMOS transistor. In some embodiments, each of transistors T25 and T26 is an NMOS transistor.

A source terminal of transistor T23 is coupled to the voltage supply VDD. A drain terminal of transistor T23 is coupled to a source terminal of transistor T24. Each of the gate terminal of transistor T23 and the gate terminal of transistor T26 is configured to receive signal ml_ax.

A gate terminal of transistor T24 is configured to receive clock signal clkb. In some embodiments, the gate terminal of transistor T24 is coupled to at least an output terminal of inverter 122.

Each of a drain terminal of transistor T24, a drain terminal of transistor T25, a drain terminal of transistor T20, a drain terminal of transistor T21, a gate terminal of transistor T27 and a gate terminal of transistor T29 are coupled together. Signal sl_a is the signal of at least the drain terminal of transistor T24, the drain terminal of transistor T25, the drain terminal of transistor T20, the drain terminal of transistor T21, the gate terminal of transistor T27 or the gate terminal of transistor T29.

A gate terminal of transistor T25 is configured to receive clock signal clkbb. In some embodiments, the gate terminal of transistor T25 is coupled to at least an output terminal of inverter 124. A source terminal of transistor T25 is coupled to a drain terminal of transistor T26. A source terminal of transistor T26 is coupled to the reference voltage supply VSS.

In some embodiments, by using the stacked gate circuit 108 in integrated circuit 100 instead of other circuits such as a transmission gate of other approaches, the stacked gate circuit 108 is able to prevent transient noise between a master latch (e.g., NOR circuit 104 and reversed tri-state gate circuit 106) and a slave latch (e.g., NAND circuit 110 and reversed tri-state gate circuit 112) thereby improving at least the soft error rate (SER) of integrated circuit 100 compared to other approaches. In some embodiments, by improving the SER, a number of failures-in-time (FIT) or a mean time between failures (MTBF) of integrated circuit 100 is improved compared to other approaches.

In some embodiments, the SER is the rate at which a device or system encounters or is predicted to encounter soft errors.

NAND circuit 110 includes transistors T27-T30. In some embodiments, each of transistors T27 and T28 is a PMOS transistor. In some embodiments, each of transistors T29 and T30 is an NMOS transistor.

A source terminal of transistor T27 is coupled to the voltage supply VDD. A source terminal of transistor T28 is coupled to the voltage supply VDD.

Each of a gate terminal of transistor T28 and a gate terminal of transistor T30 is configured to receive signal cdb. In some embodiments, each of the gate terminal of transistor T28, the gate terminal of transistor T30 and the output terminal of inverter 118 are coupled together.

Each of the gate terminal of transistor T27 and the gate terminal of transistor T29 is configured to receive signal sl_a.

Each of a drain terminal of transistor T27, a drain terminal of transistor T28, a drain terminal of transistor T29, a gate terminal of transistor T20, a gate terminal of transistor T21, a gate terminal of transistor T31 and a gate terminal of transistor T32 are coupled together. Signal sl_bx is the signal of at least the drain terminal of transistor T27, the drain terminal of transistor T28, the drain terminal of transistor T29, the gate terminal of transistor T20, the gate terminal of transistor T21, the gate terminal of transistor T31 and the gate terminal of transistor T32.

A source terminal of transistor T29 is coupled to a drain terminal of transistor T30. A source terminal of transistor T30 is coupled to the reference voltage supply VSS.

In some embodiments, by positioning the NAND circuit 110 in integrated circuit 100 as shown, reduces a number of sensitive nodes within integrated circuit 100, thus increasing reliability and accuracy of integrated circuit 100 compared to other approaches.

Reversed tri-state gate circuit 112 includes transistors T19-T22. In some embodiments, each of transistors T19 and T20 is a PMOS transistor. In some embodiments, each of transistors T21 and T22 is an NMOS transistor.

A source terminal of transistor T19 is coupled to the voltage supply VDD. A drain terminal of transistor T19 is coupled to a source terminal of transistor T20. A gate terminal of transistor T19 is configured to receive clock signal clkbb. In some embodiments, the gate terminal of transistor T19 is coupled to at least an output terminal of inverter 124.

Each of the gate terminal of transistor T20 and the gate terminal of transistor T21 is configured to receive signal sl_bx. A source terminal of transistor T21 is coupled to a drain terminal of transistor T22.

A gate terminal of transistor T22 is configured to receive clock signal clkb. In some embodiments, the gate terminal of transistor T22 is coupled to at least an output terminal of inverter 122. A source terminal of transistor T22 is coupled to the reference voltage supply VSS.

Figure 2:
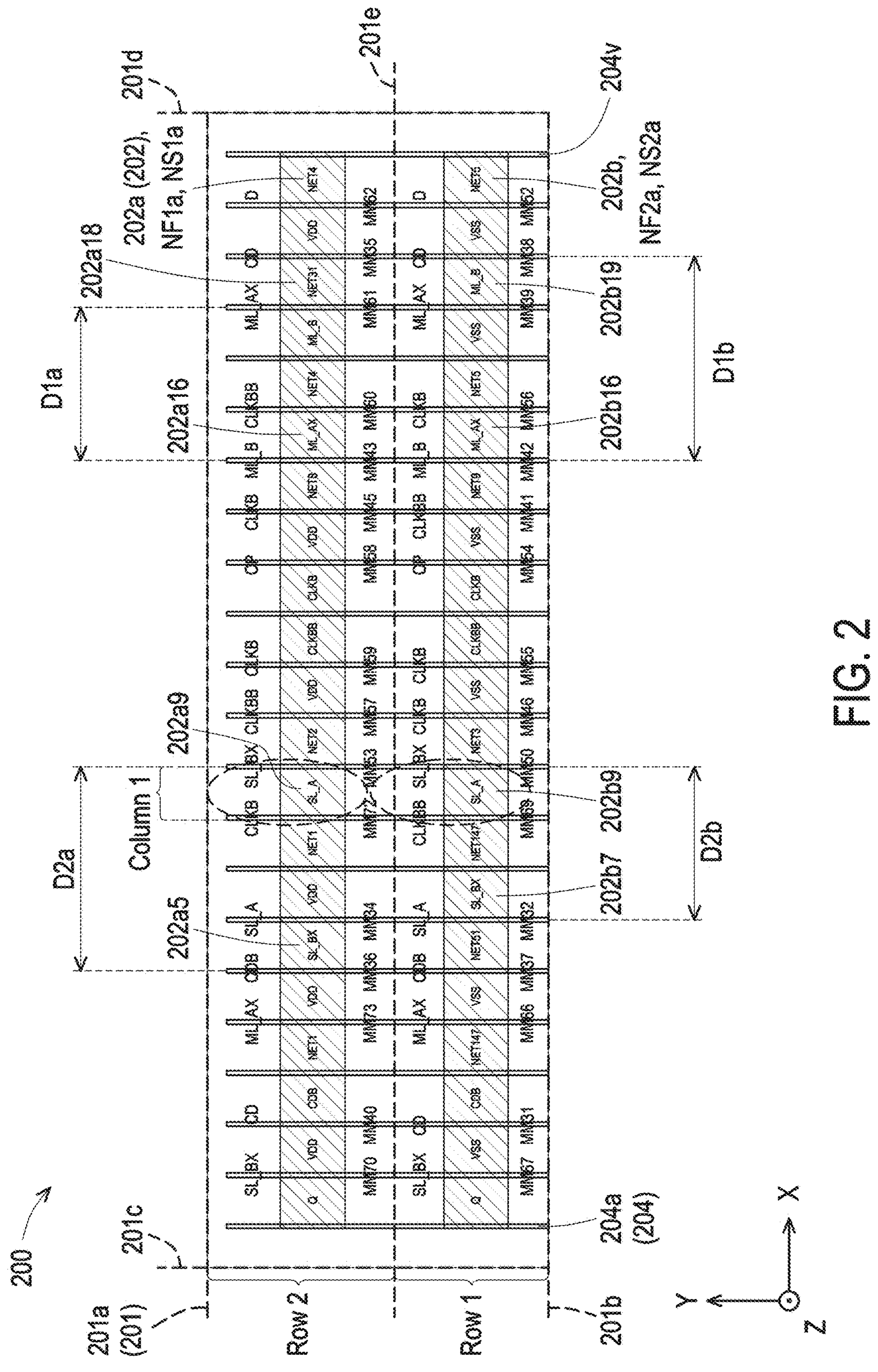
FIG. 2 is a diagram of a top view of an integrated circuit, in accordance with some embodiments.

In some embodiments, at least one of NOR circuit 104, stacked gate circuit 108, NAND circuit 110 or reversed tri-state gate circuit 112 has a corresponding active region with a number of fins NF1*a* (shown in FIG. 2).

In some embodiments, at least one of circuit 102*a*, circuit 102*b*, reversed tri-state gate circuit 106, output circuit 114, inverter 118, inverter 120, inverter 122 or inverter 124 has a corresponding active region with a number of fins NF2*a* (shown in FIG. 2).

In some embodiments, the number of fins NF2*a* is greater than the number of fins NF1*a*.

In some embodiments, the number of fins NF1*a* is at least 1 fin. In some embodiments, the number of fins NF2*a* is greater than 1 fin.

Other numbers of fins for at least NF1*a* or NF2*a* are within the scope of the present disclosure.

In some embodiments, by including a different number of fins NF1*a* and NF2*a* in corresponding active regions of integrated circuit 100 thereby decreases the FIT of integrated circuit 100 compared to other approaches because the charge collection efficiency in transistors with less fins (e.g., number of fins NF1*a*) is lower than the charge collection efficiency in transistors with more fins (e.g., number of fins NF2*a*) thereby causing the critical charge in transistors with less fins (e.g., number of fins NF1*a*) to be higher than the critical charge in transistors with more fins (e.g., number of fins NF2*a*).

In some embodiments, by using the reversed tri-state gate circuit 112 in integrated circuit 100 as shown, a distance (e.g., distance D2*a* or D2*b* in FIG. 2) between a node of signal sl_a and a node of signal sl_bx is reduced compared to other approaches, thus increasing a critical charge $Q_{CRIT}$ of at least the reversed tri-state gate circuit 112 by increasing the corresponding collected charge $Q_{COL}$, thereby increasing the reliability and accuracy of integrated circuit 100 compared to other approaches.

Output circuit 114 includes transistors T31-T32. In some embodiments, transistor T31 is a PMOS transistor. In some embodiments, transistor T32 is an NMOS transistor.

Transistors T31 and T32 are configured as an inverter (not labelled) configured to receive signal sl_bx, and to generate signal Q. The gate terminals of transistors T31 and T32 are coupled together, and configured to receive signal sl_bx. A source terminal of transistor T31 is coupled to the voltage supply VDD. A source terminal of transistor T32 is coupled to the reference voltage supply VSS. The drain terminals of transistors T31 and T32 are coupled together, and configured to output the signal Q.

Inverter 118 includes transistors T33-T34. In some embodiments, transistor T33 is a PMOS transistor. In some embodiments, transistor T34 is an NMOS transistor.

A gate terminal of transistor T33 and a gate terminal of transistor T34 are configured to receive signal CD. In some embodiments, signal CD is a reset signal. The gate terminals of transistor T33 and transistor T34 are coupled together. A source terminal of transistor T33 is coupled to the voltage supply VDD. A drain terminal of transistor T33 and a drain terminal of transistor T34 are coupled together, and are configured to output signal cdb as the output terminal of inverter 118. A source terminal of transistor T34 is coupled to the reference voltage supply VSS.

In some embodiments, inverter 118 is a local reset buffer. In some embodiments, by including a local reset buffer (e.g., inverter 118) in integrated circuit 100, a number of transistors and a corresponding level of the reversed tri-state gate circuit 112 is reduced thereby reducing a distance (e.g., distance D2*a* in FIG. 2) between a node of signal sl_a and a node of signal sl_bx compared to other approaches.

In some embodiments, by including a local reset buffer (e.g., inverter 118) in integrated circuit 100, an inverted reset signal (e.g., signal cdb) is used by the slave latch (e.g., NAND circuit 110 and reversed tri-state gate circuit 112) thereby increasing the signal stability of at least signal sl_bx and the output signal Q of integrated circuit 100 compared to other approaches.

Inverter 120 includes transistors T35-T36. In some embodiments, transistor T35 is a PMOS transistor. In some embodiments, transistor T36 is an NMOS transistor.

A gate terminal of transistor T35 and a gate terminal of transistor T36 are configured to receive scan enable signal SE. The gate terminals of transistor T35 and transistor T36 are coupled together. A source terminal of transistor T35 is coupled to the voltage supply VDD. A drain terminal of transistor T35 and a drain terminal of transistor T36 are coupled together, and are configured to output inverted scan enable signal SEB as the output terminal of inverter 120. A source terminal of transistor T36 is coupled to the reference voltage supply VSS.

Inverter 122 includes transistors T37-T38. In some embodiments, transistor T37 is a PMOS transistor. In some embodiments, transistor T38 is an NMOS transistor.

A gate terminal of transistor T37 and a gate terminal of transistor T38 are configured to receive clock signal CP. The gate terminals of transistor T37 and transistor T38 are coupled together. A source terminal of transistor T37 is coupled to the voltage supply VDD. A drain terminal of transistor T37 and a drain terminal of transistor T38 are coupled together, and are configured to output inverted clock signal clkb as the output terminal of inverter 122. A source terminal of transistor T38 is coupled to the reference voltage supply VSS.

Inverter 124 includes transistors T39-T40. In some embodiments, transistor T39 is a PMOS transistor. In some embodiments, transistor T40 is an NMOS transistor.

Each of the drain terminal of transistor T37, the drain terminal of transistor T38, a gate terminal of transistor T39 and a gate terminal of transistor T40 are coupled together. The gate terminal of transistor T39 and the gate terminal of transistor T40 are configured to receive clock signal clkb as the input terminal of inverter 124. A source terminal of transistor T39 is coupled to the voltage supply VDD. A drain terminal of transistor T39 and a drain terminal of transistor T40 are coupled together, and are configured to output inverted clock signal clkbb as the output terminal of inverter 124. A source terminal of transistor T40 is coupled to the reference voltage supply VSS.

In some embodiments, one or more NMOS transistors in the present disclosure are changed to one or more PMOS transistors, and vice versa. In some embodiments, one or more of the drains or sources in the present disclosure are flipped with the other. Other configurations, arrangements or other circuits in integrated circuit 100 are within the scope of the present disclosure.

FIG. 2 is a diagram of a top view of an integrated circuit 200, in accordance with some embodiments.

Integrated circuit 200 is an embodiment of integrated circuit 100, and similar detailed description is omitted. For example, in some embodiments, integrated circuit 200 is a top view of integrated circuit 100 of FIG. 1, and similar detailed description is therefore omitted.

Figure 3:
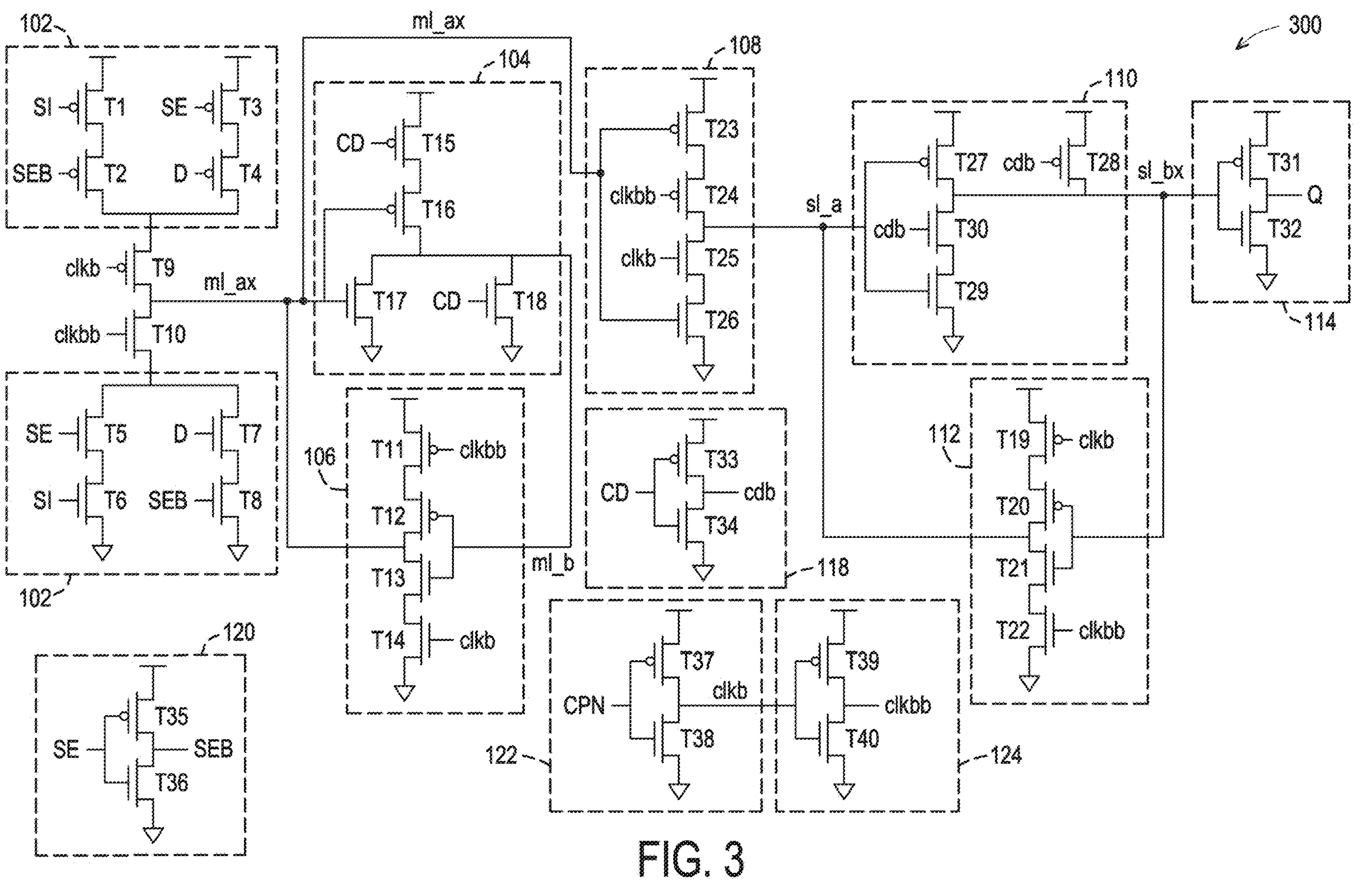
FIG. 3 is a circuit diagram of an integrated circuit, in accordance with some embodiments.
Figure 4:
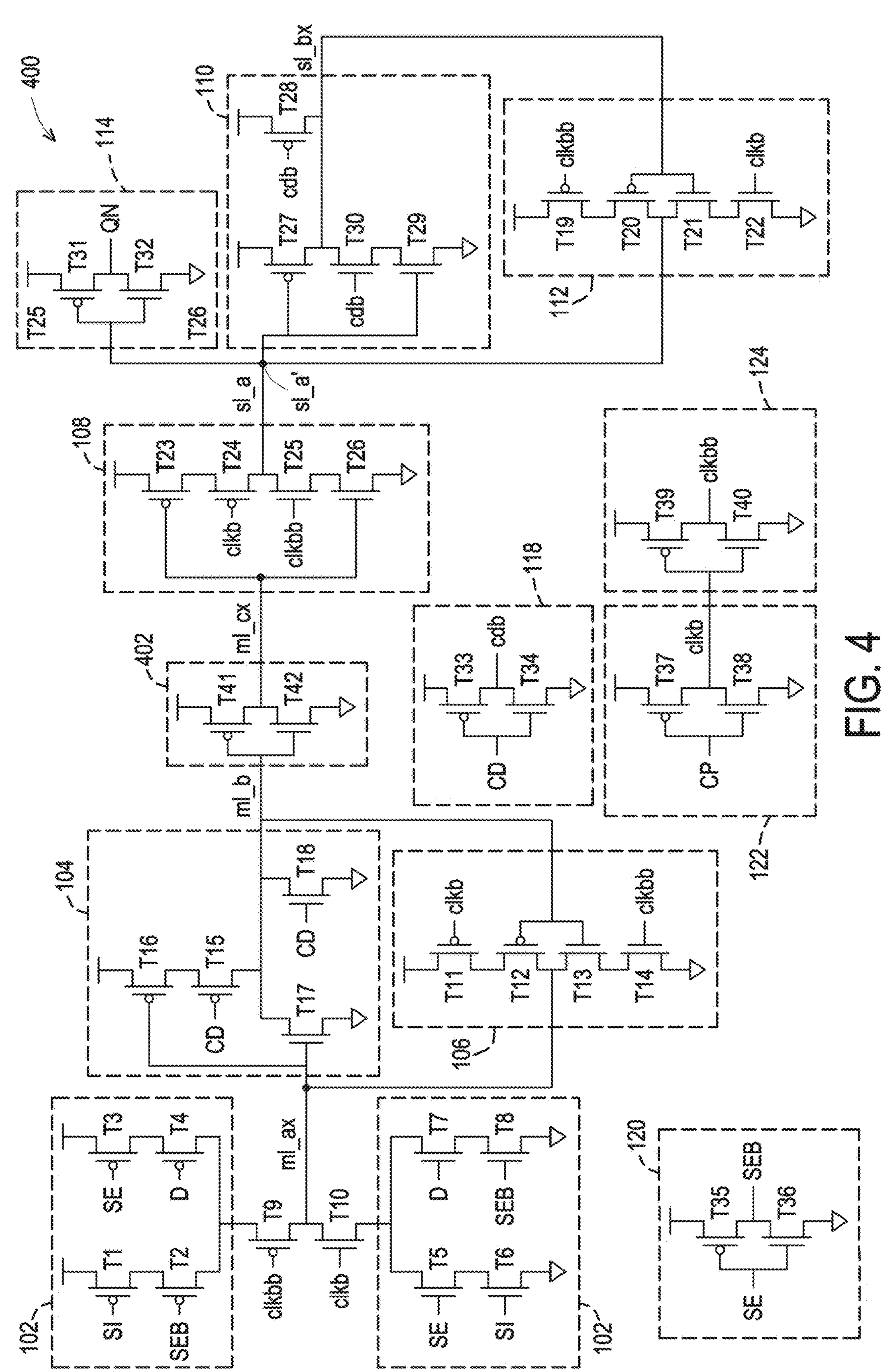
FIG. 4 is a circuit diagram of an integrated circuit, in accordance with some embodiments.
Figure 5:
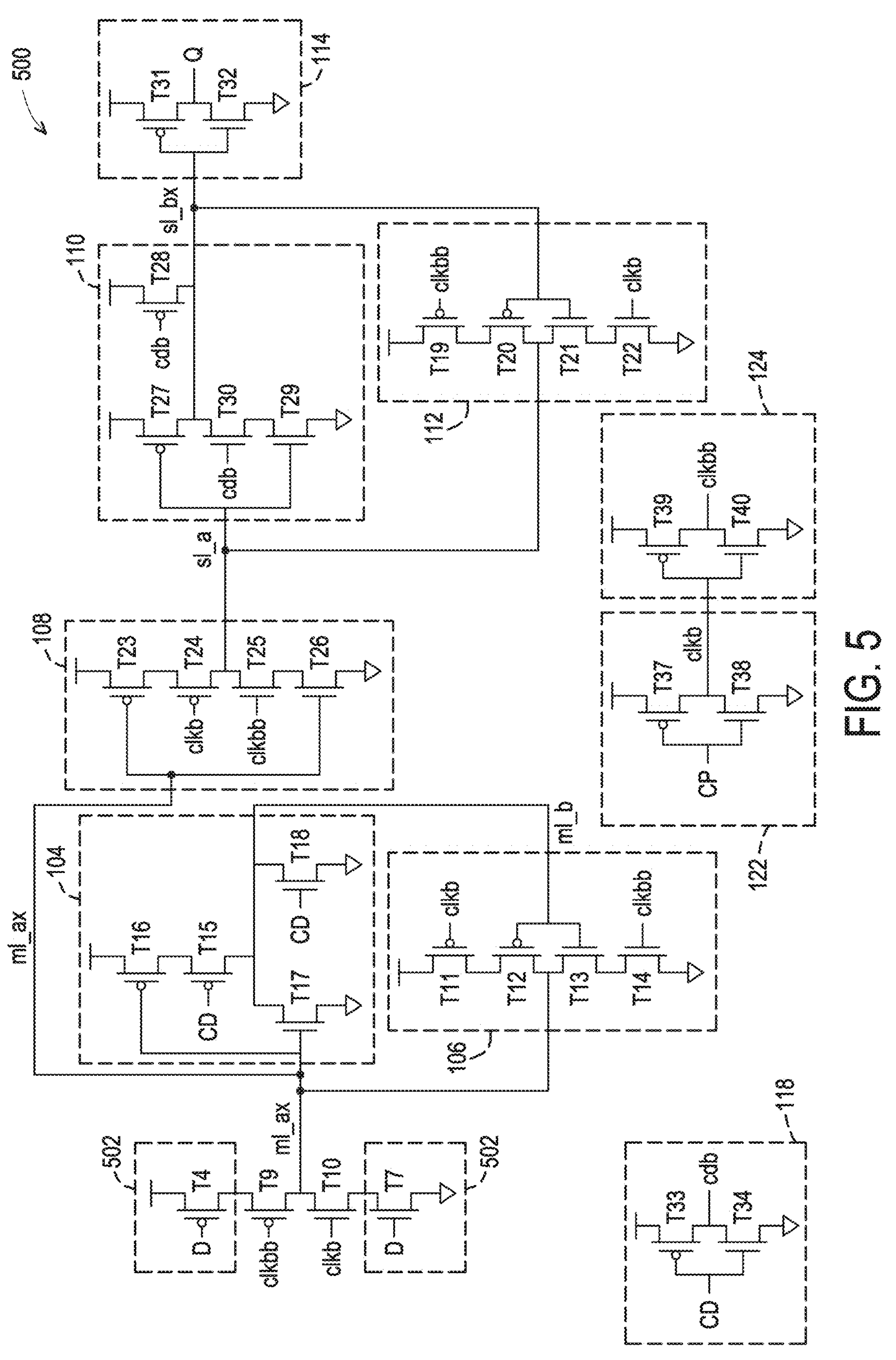
FIG. 5 is a circuit diagram of an integrated circuit, in accordance with some embodiments.
Figure 6:
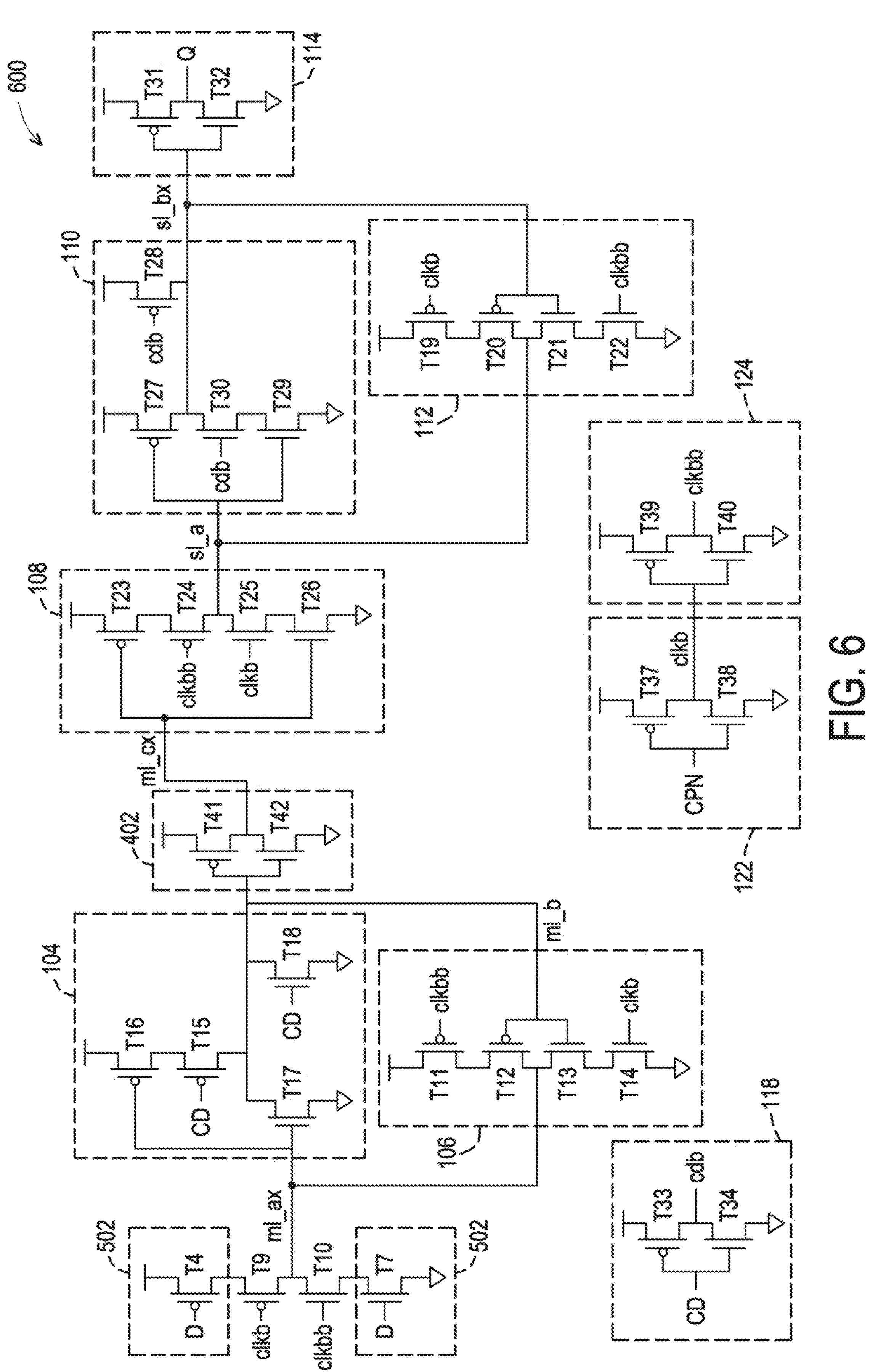
FIG. 6 is a circuit diagram of an integrated circuit, in accordance with some embodiments.
Figure 7:
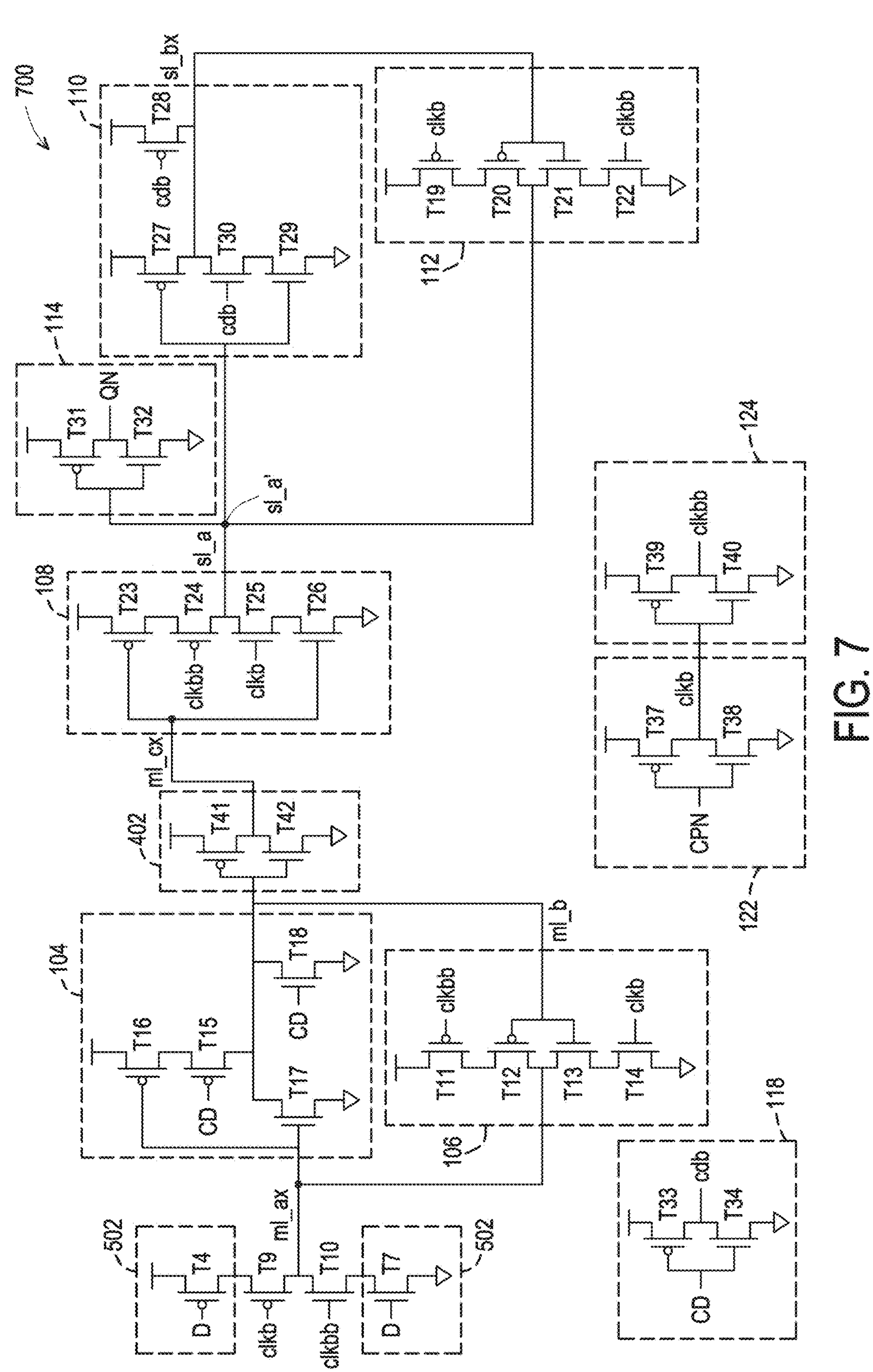
FIG. 7 is a circuit diagram of an integrated circuit, in accordance with some embodiments.
Figure 8:
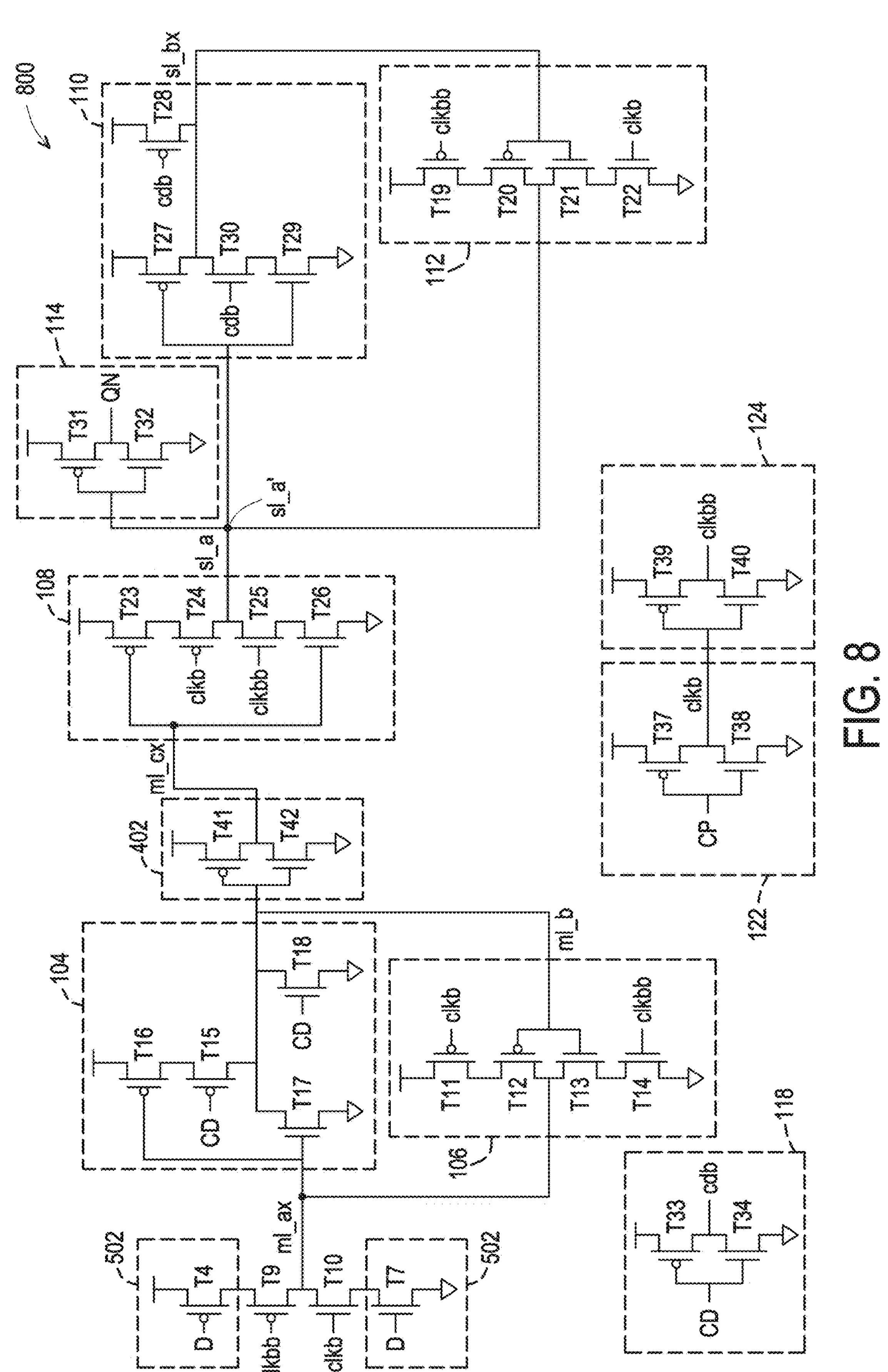
FIG. 8 is a circuit diagram of an integrated circuit, in accordance with some embodiments.
Figure 9:
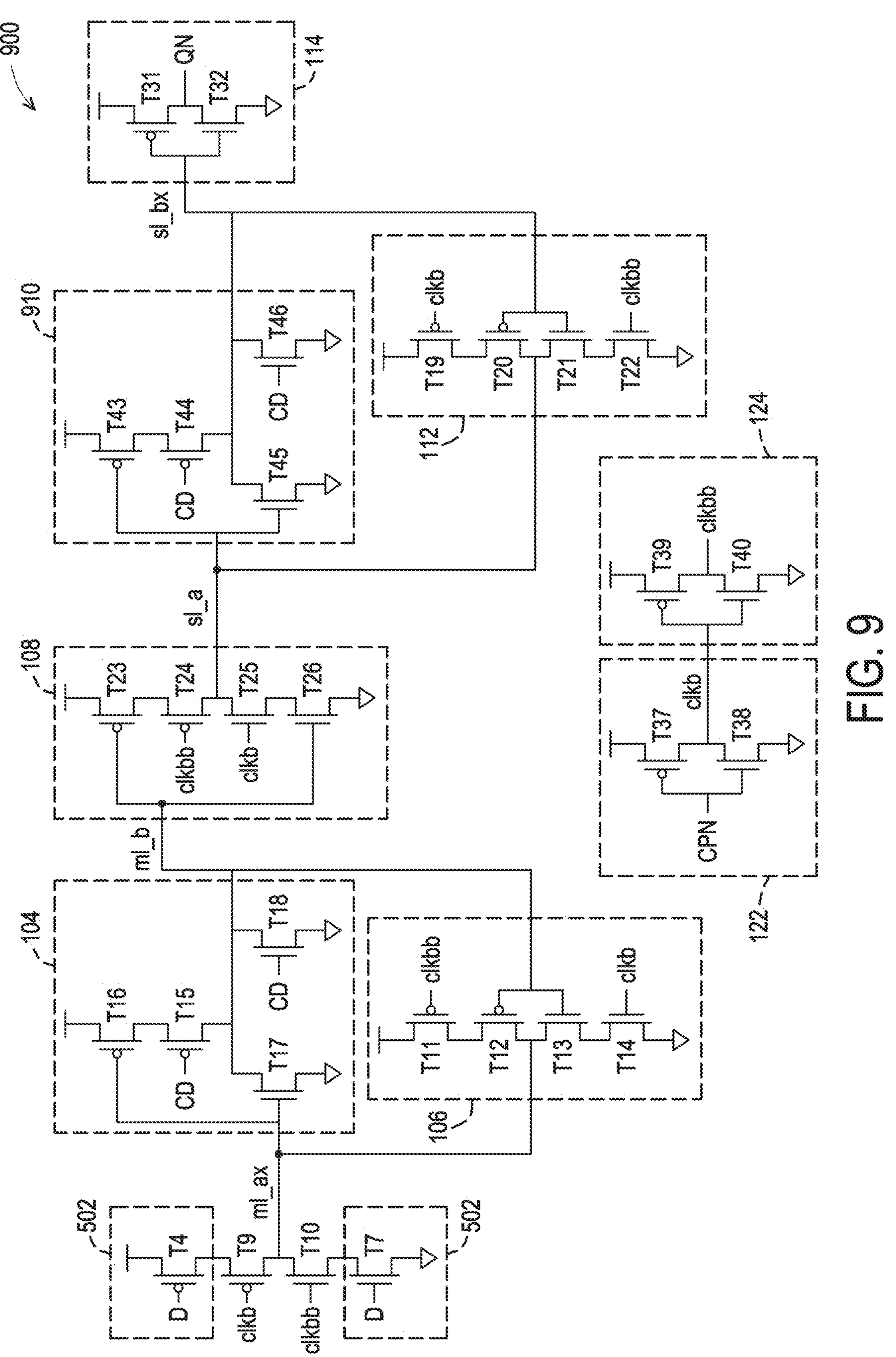
FIG. 9 is a circuit diagram of an integrated circuit, in accordance with some embodiments.
Figure 10:
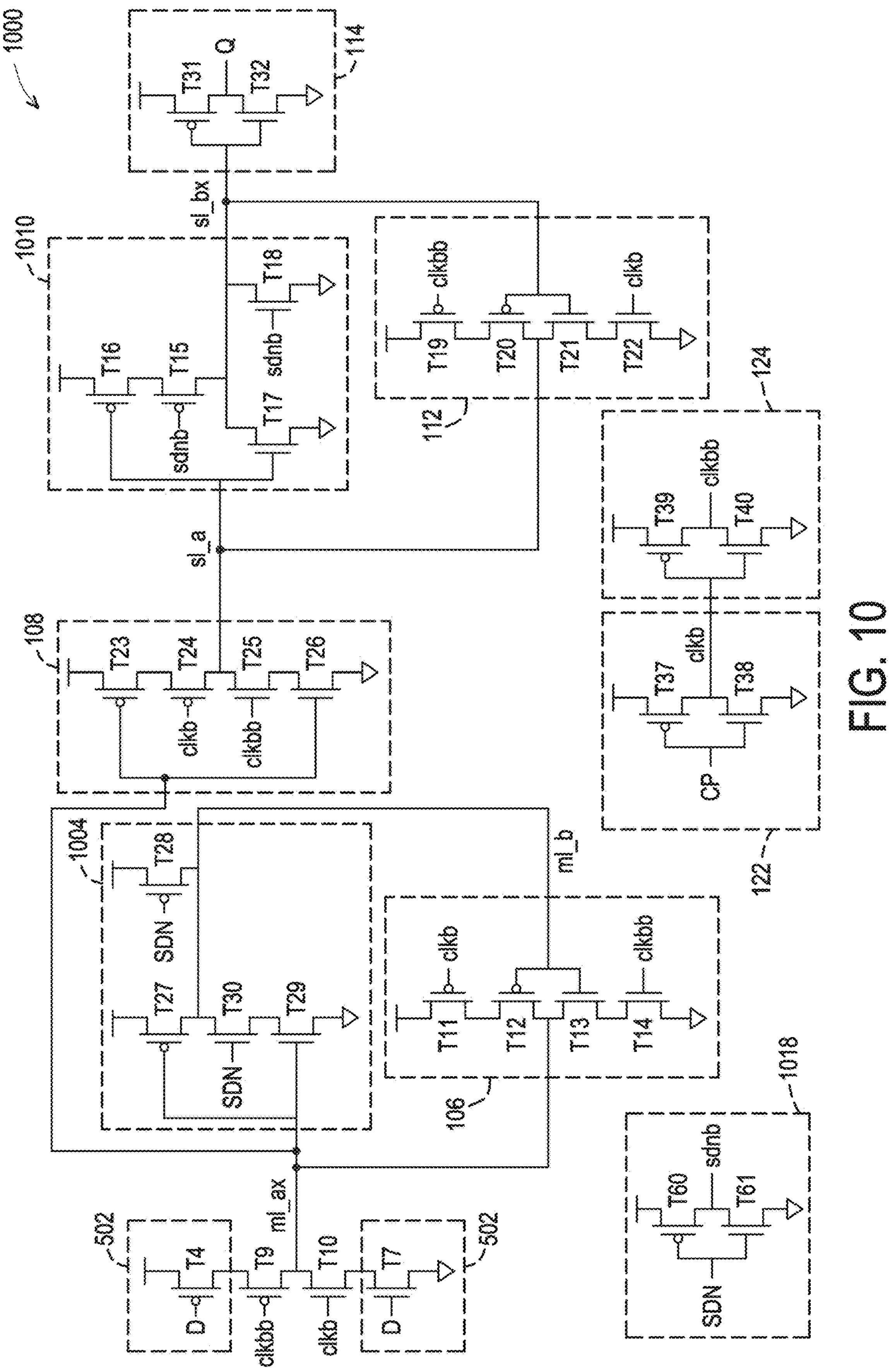
FIG. 10 is a circuit diagram of an integrated circuit, in accordance with some embodiments.
Figure 11:
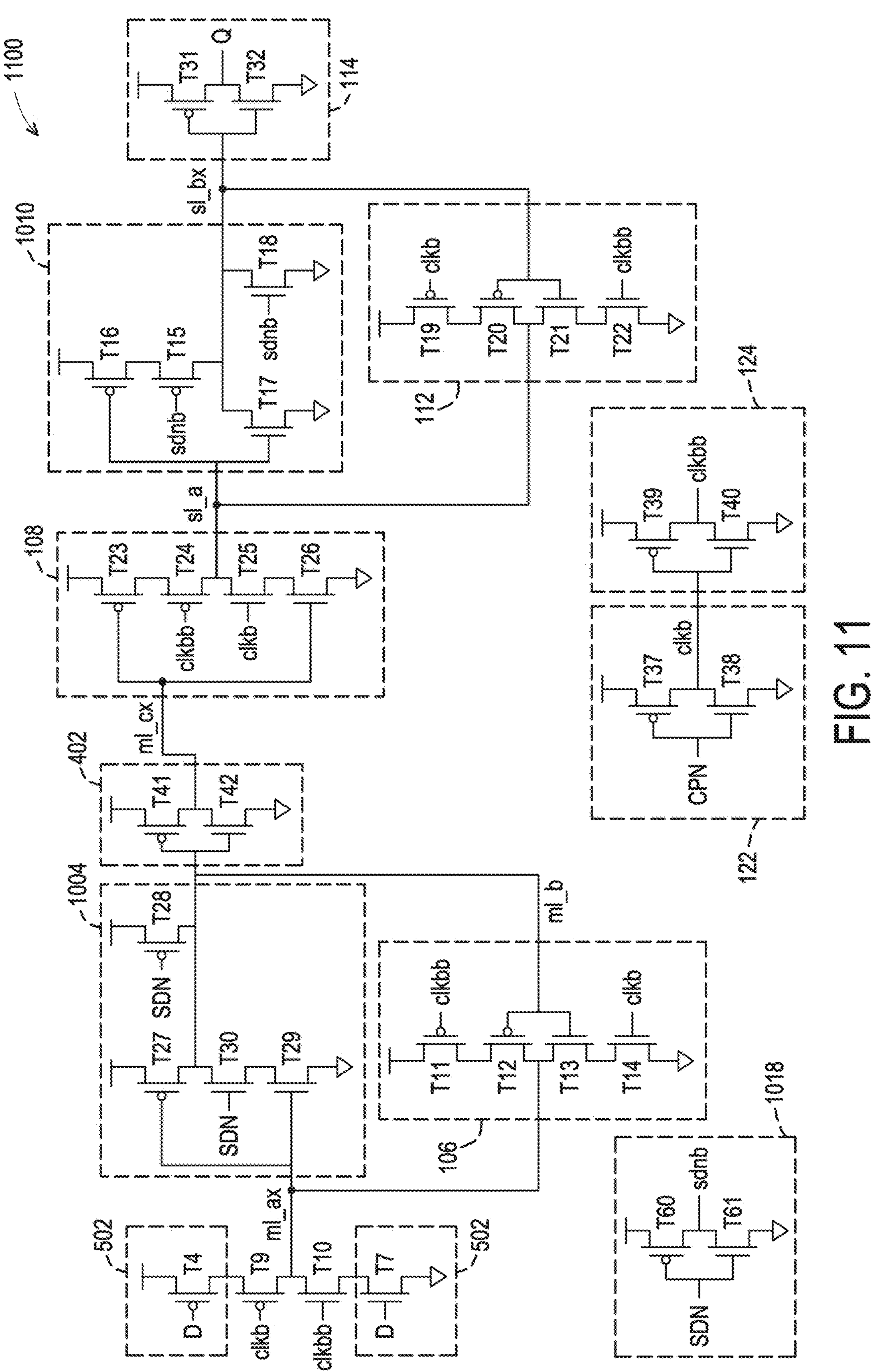
FIG. 11 is a circuit diagram of an integrated circuit, in accordance with some embodiments.
Figure 12:
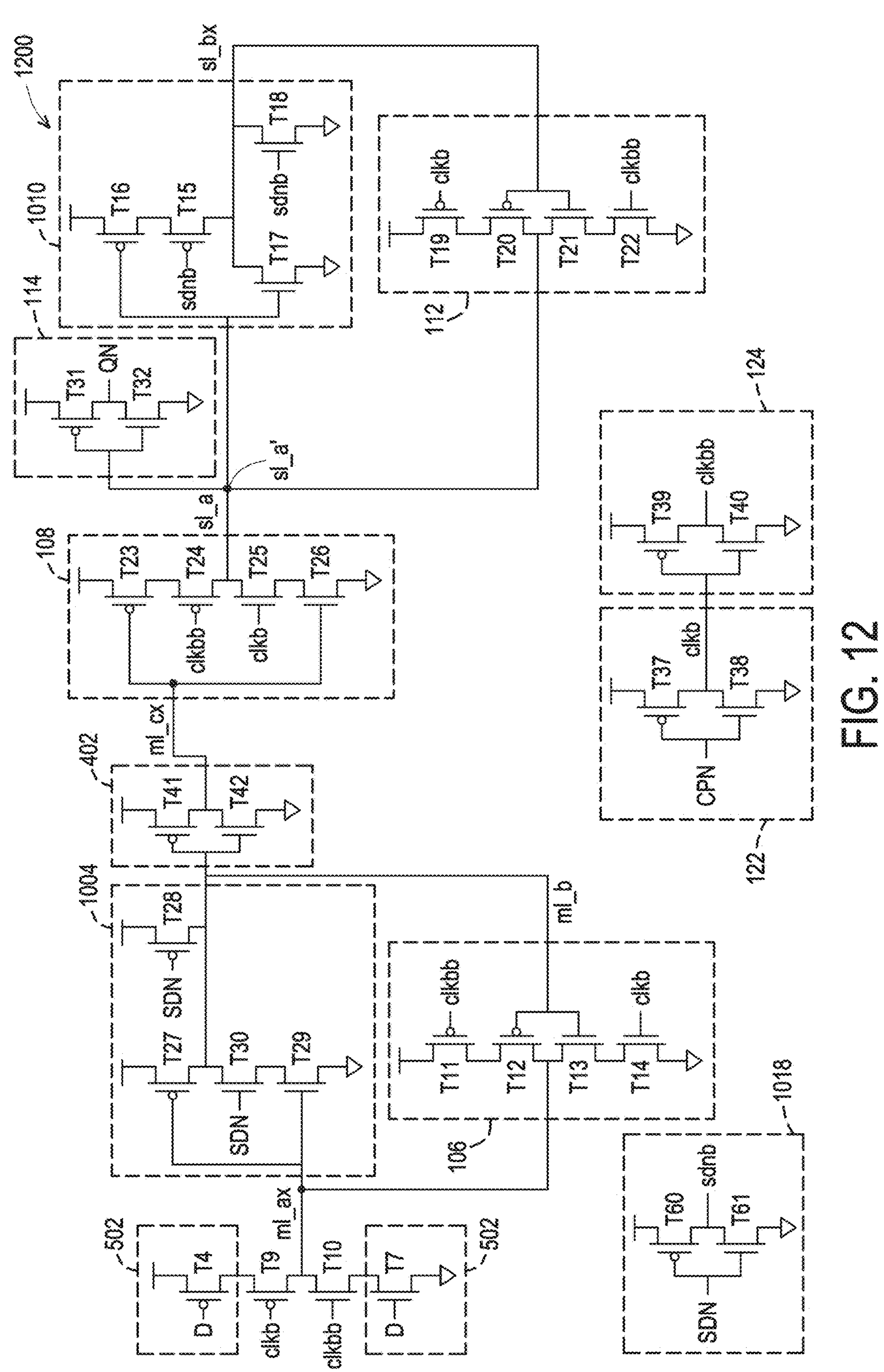
FIG. 12 is a circuit diagram of an integrated circuit, in accordance with some embodiments.
Figure 13:
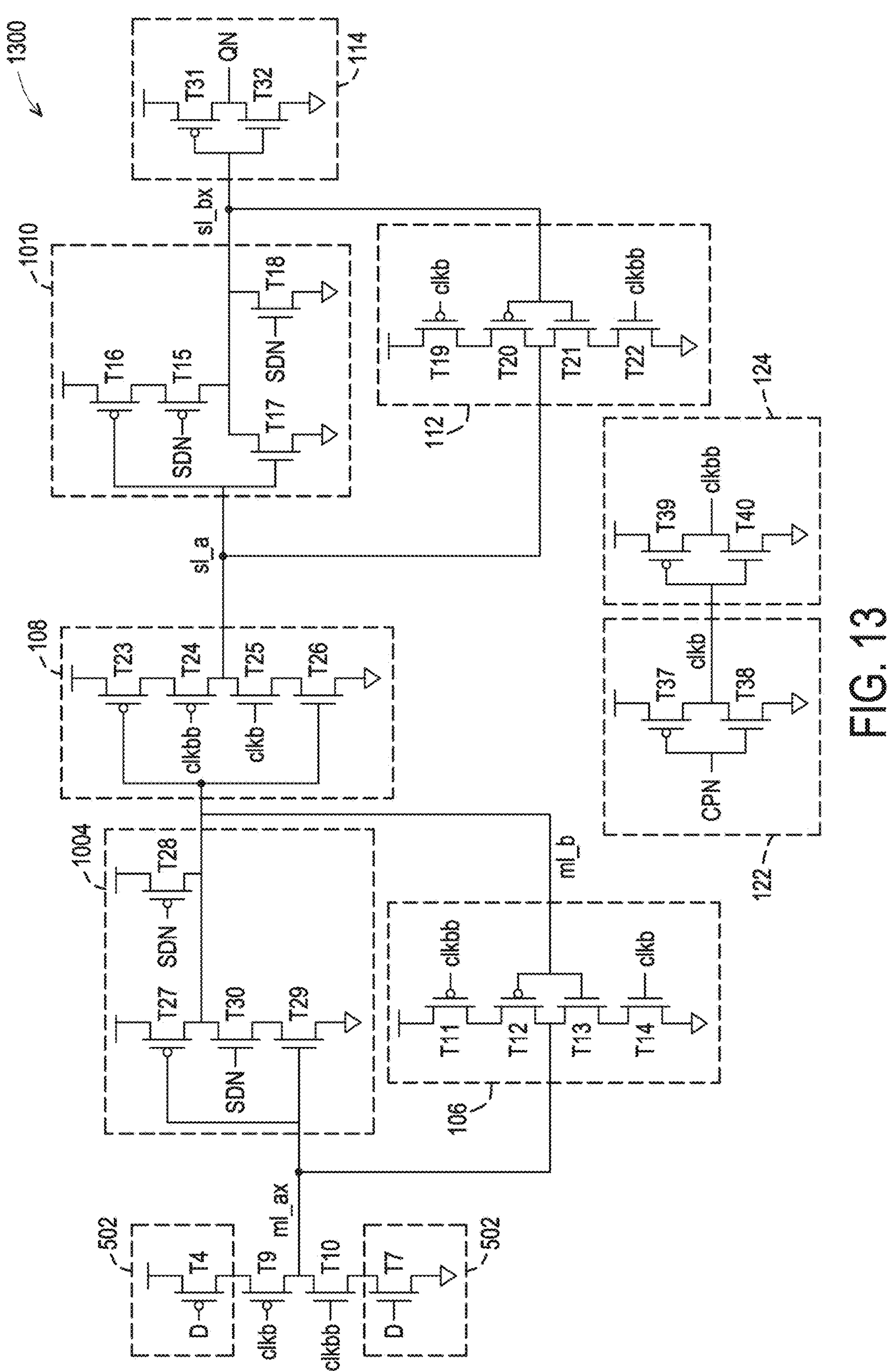
FIG. 13 is a circuit diagram of an integrated circuit, in accordance with some embodiments.
Figure 14:
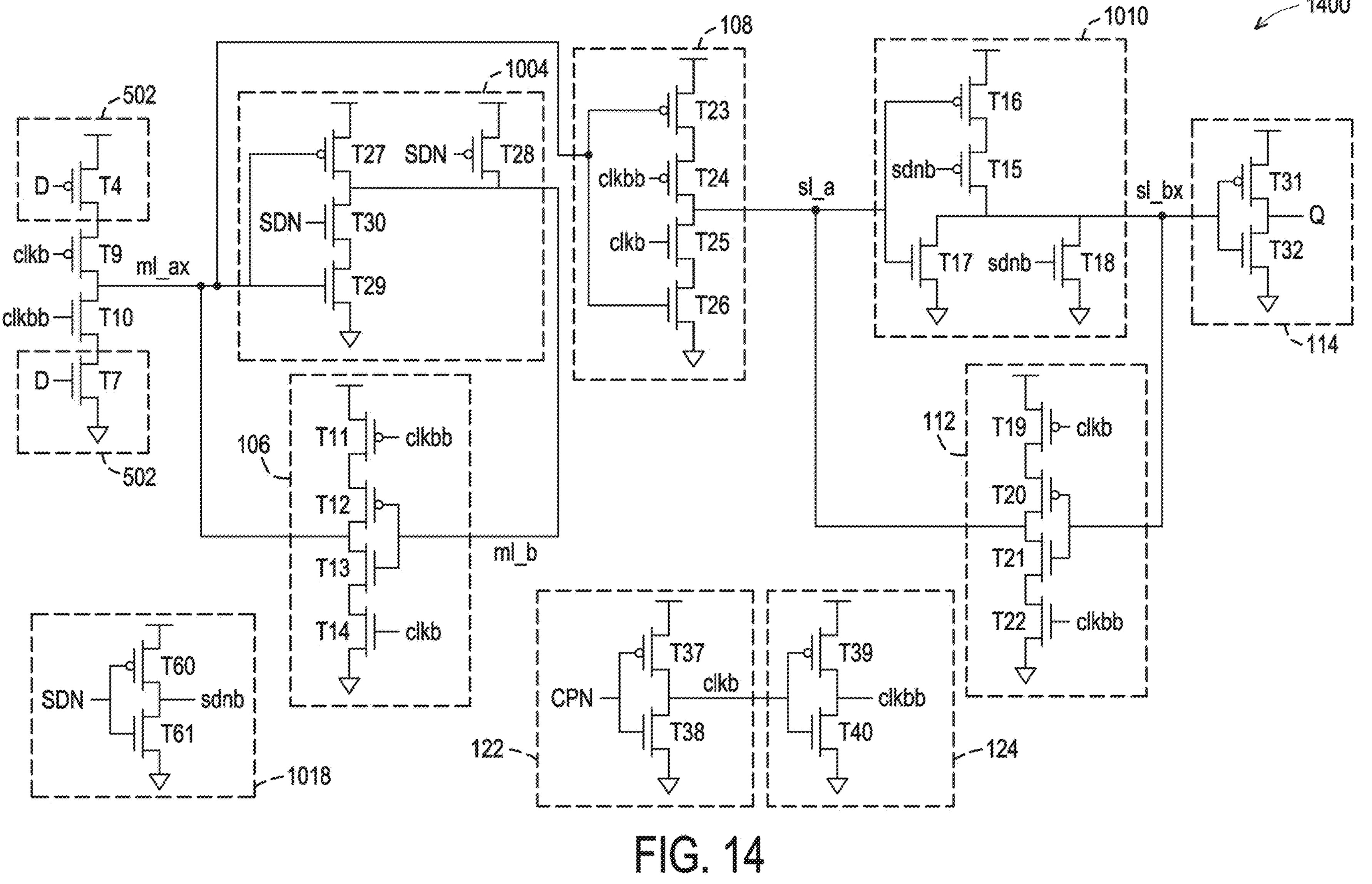
FIG. 14 is a circuit diagram of an integrated circuit, in accordance with some embodiments.
Figure 15:
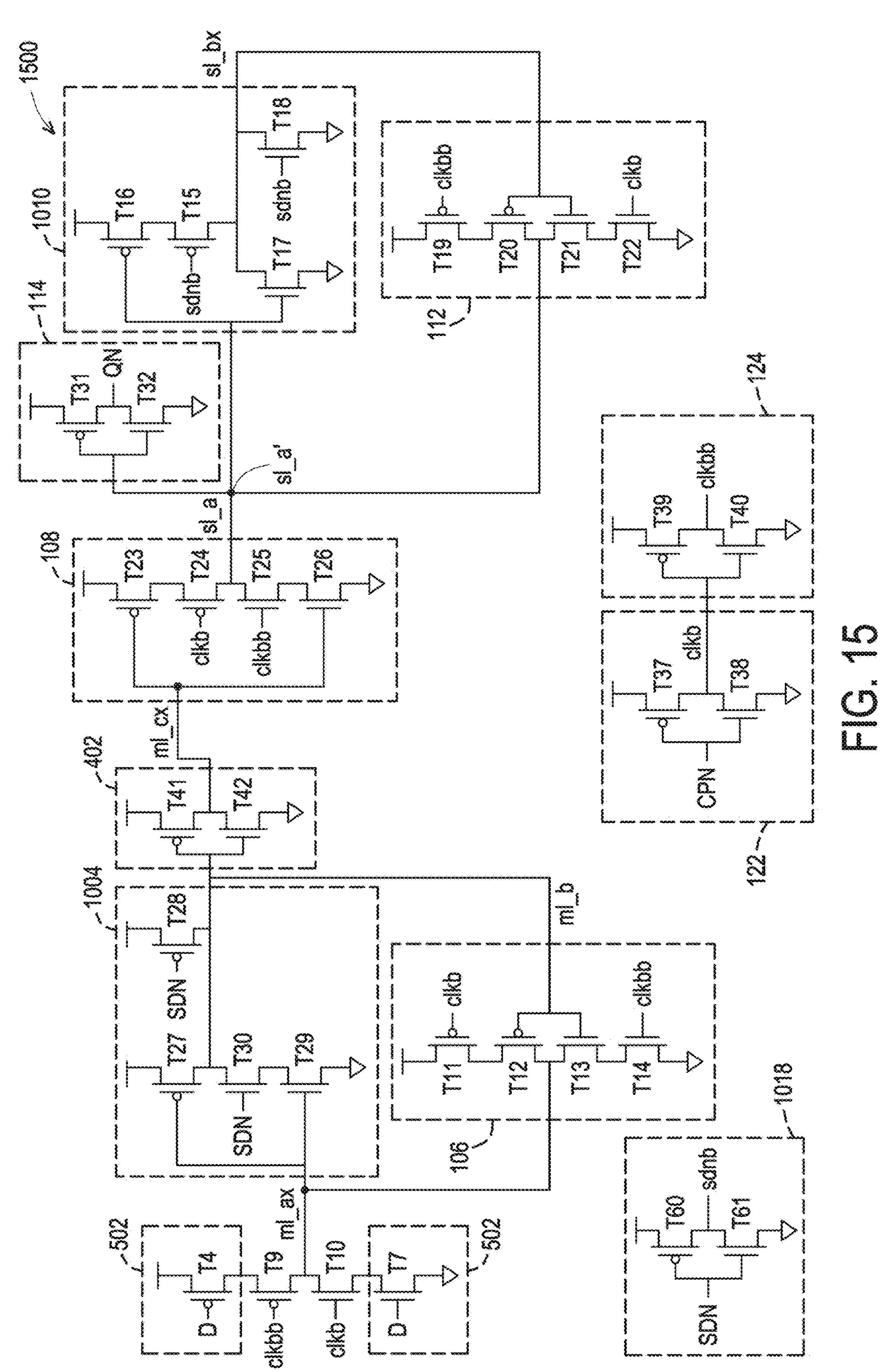
FIG. 15 is a circuit diagram of an integrated circuit, in accordance with some embodiments.
Figure 16:
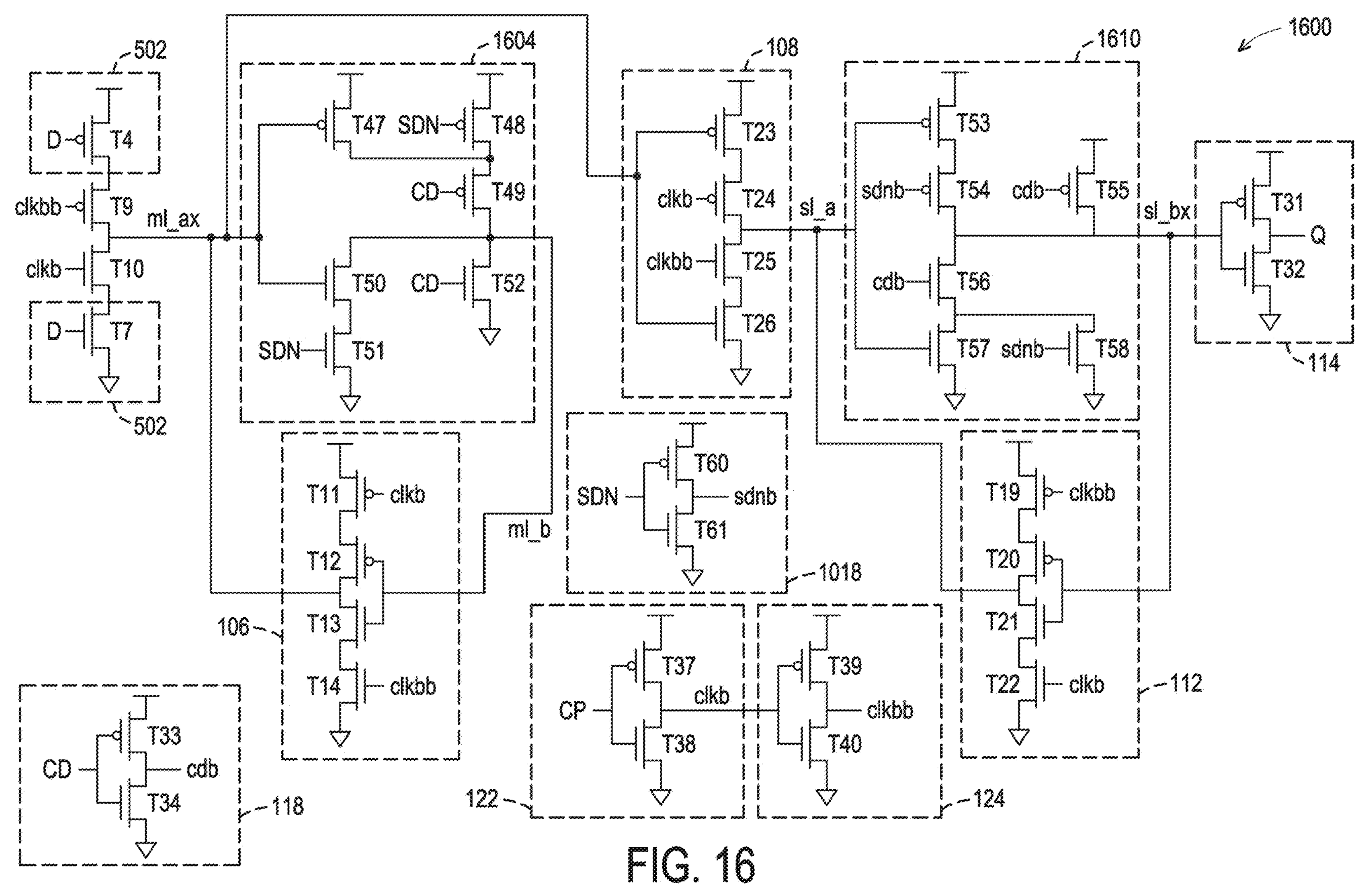
FIG. 16 is a circuit diagram of an integrated circuit, in accordance with some embodiments.
Figure 17:
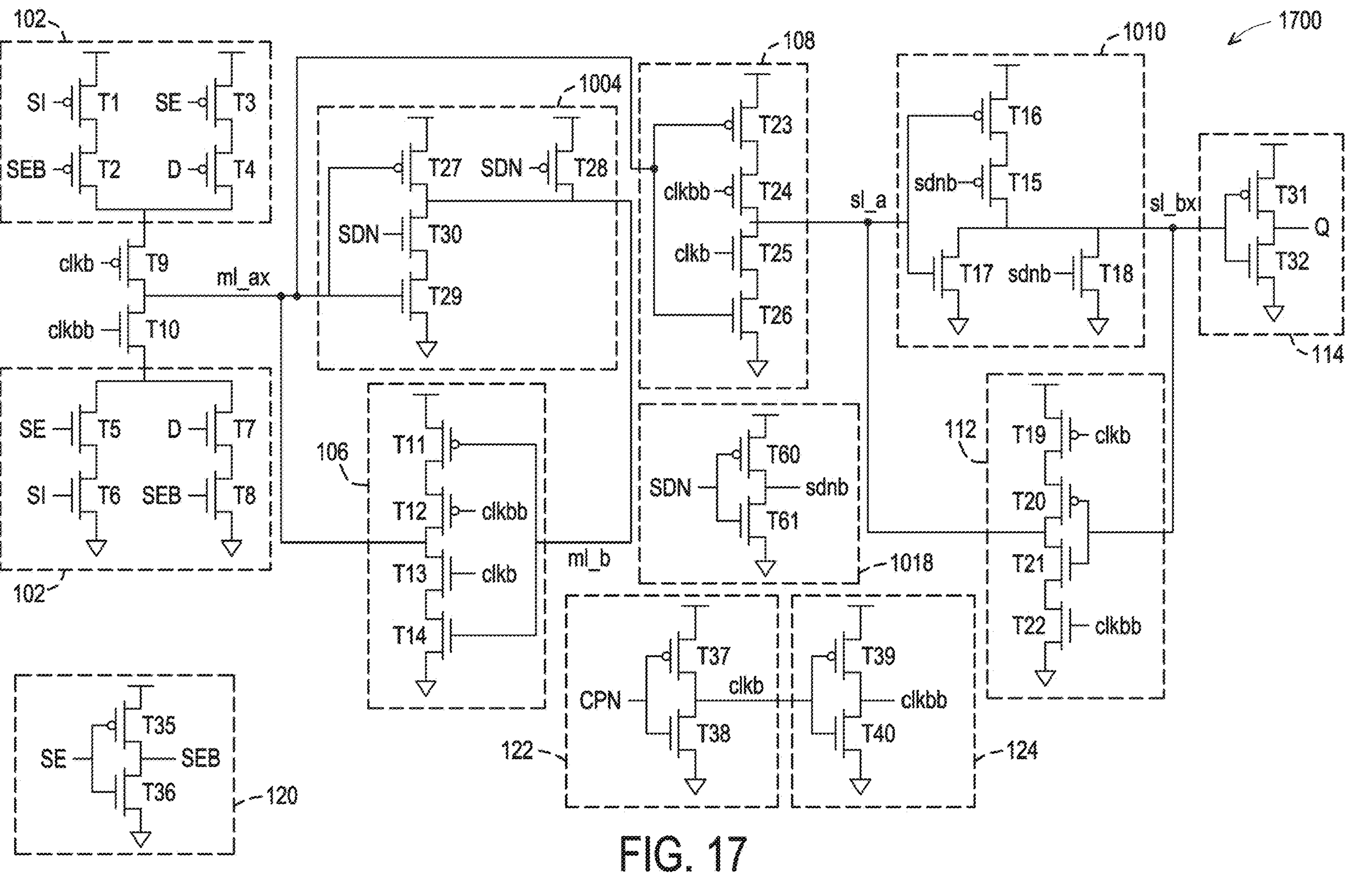
FIG. 17 is a circuit diagram of an integrated circuit, in accordance with some embodiments.
Figure 18:
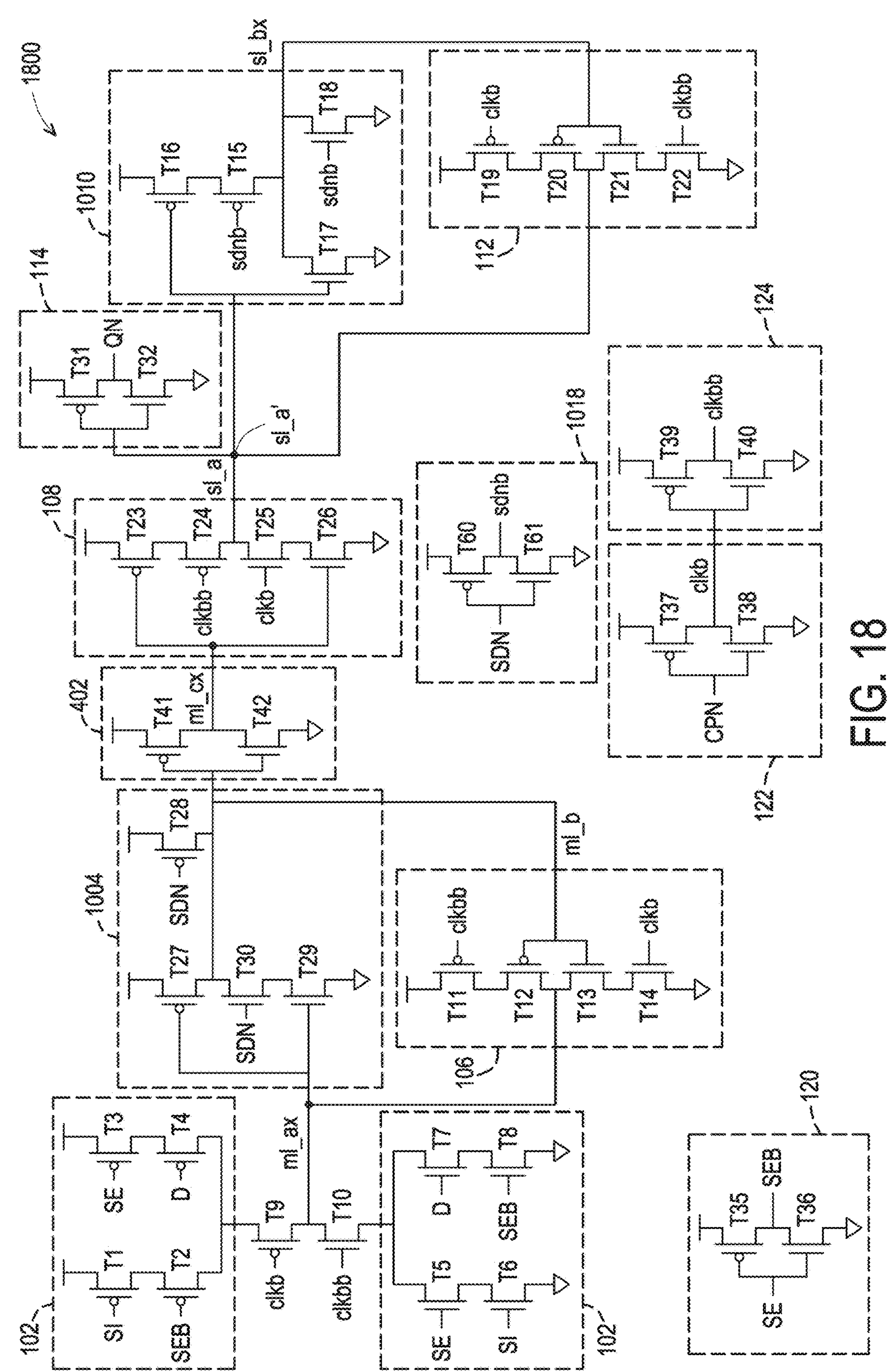
FIG. 18 is a circuit diagram of an integrated circuit, in accordance with some embodiments.
Figure 19:
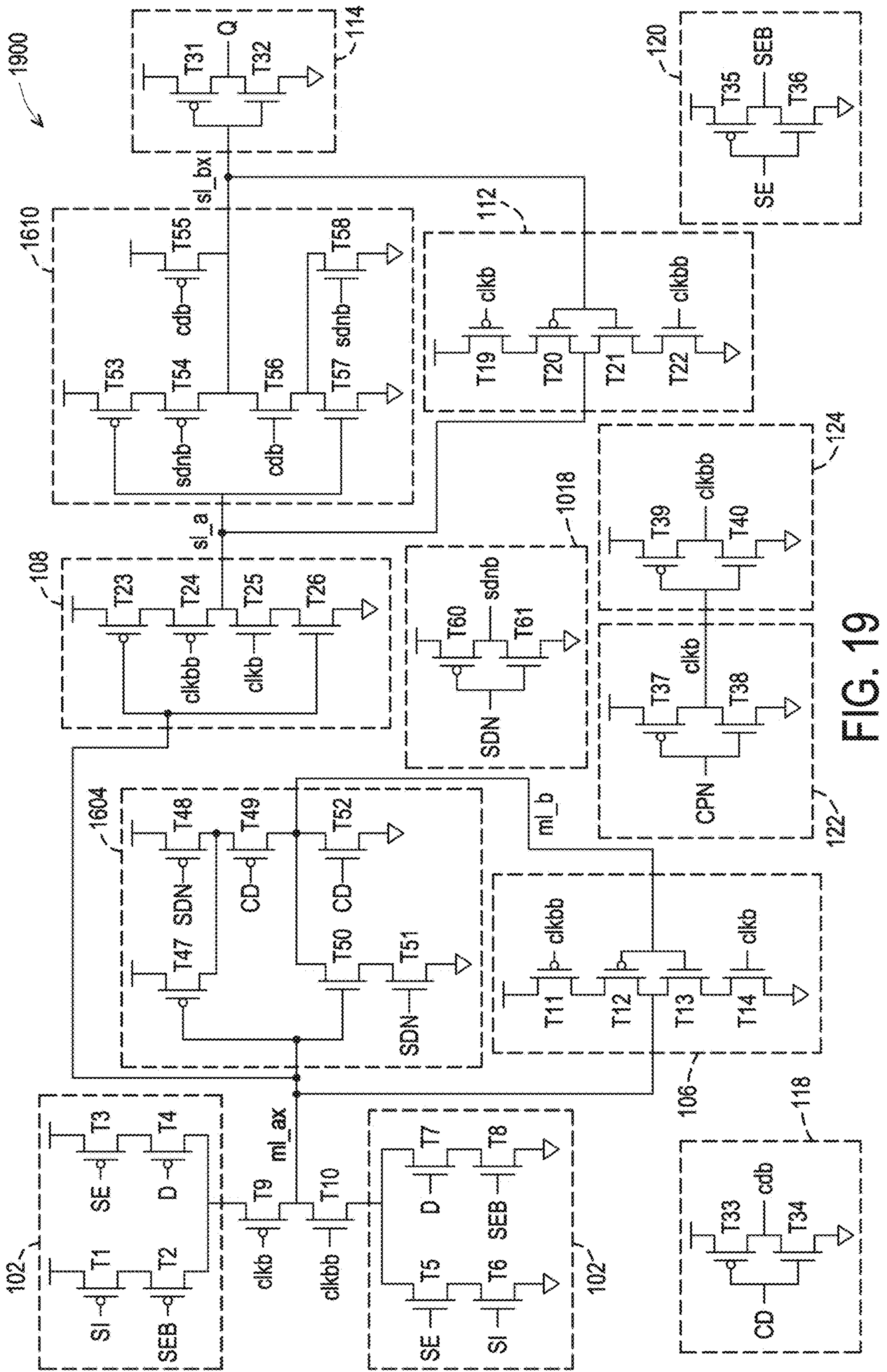
FIG. 19 is a circuit diagram of an integrated circuit, in accordance with some embodiments.
Figure 20:
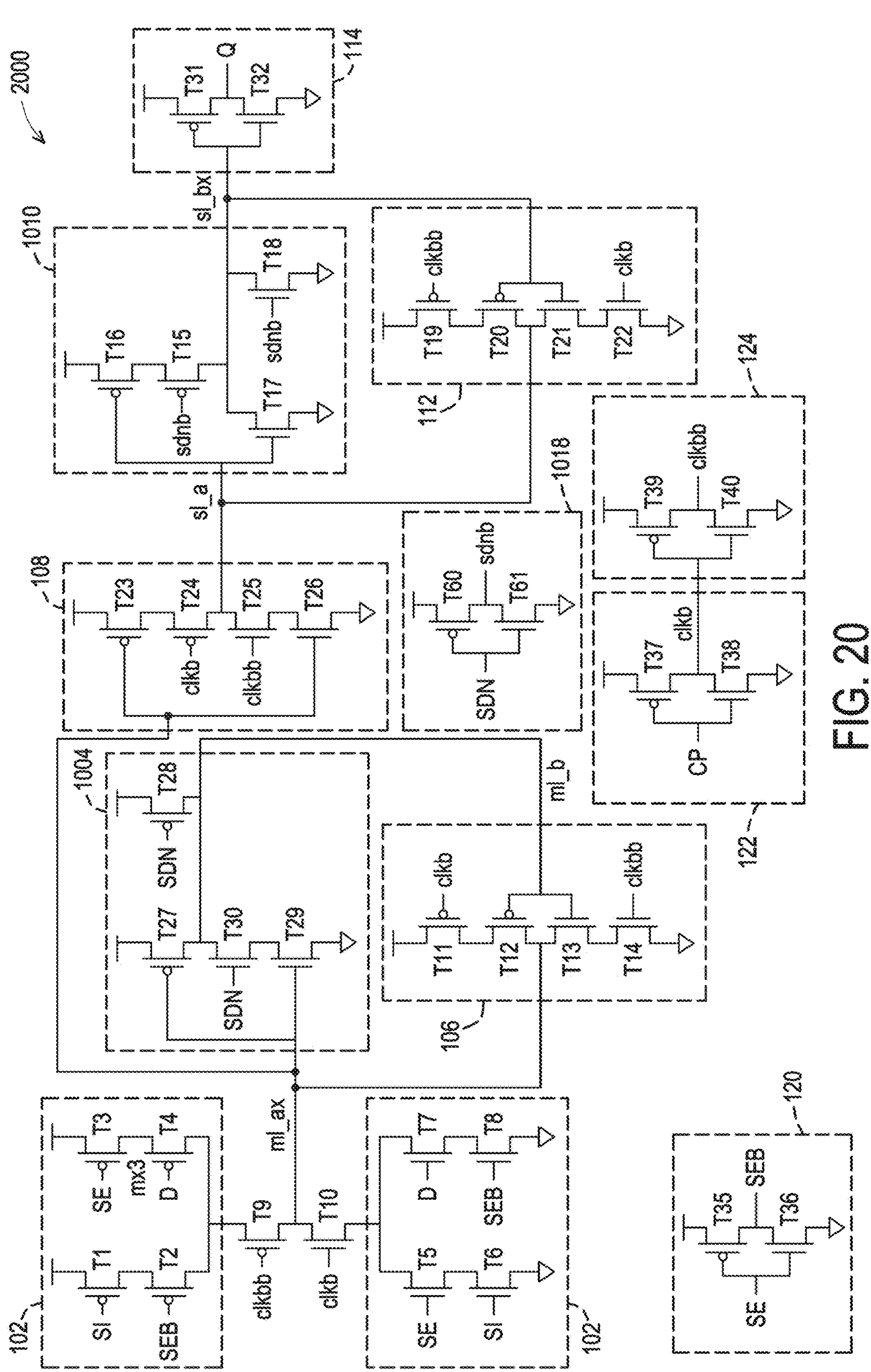
FIG. 20 is a circuit diagram of an integrated circuit, in accordance with some embodiments.
Figure 21A:
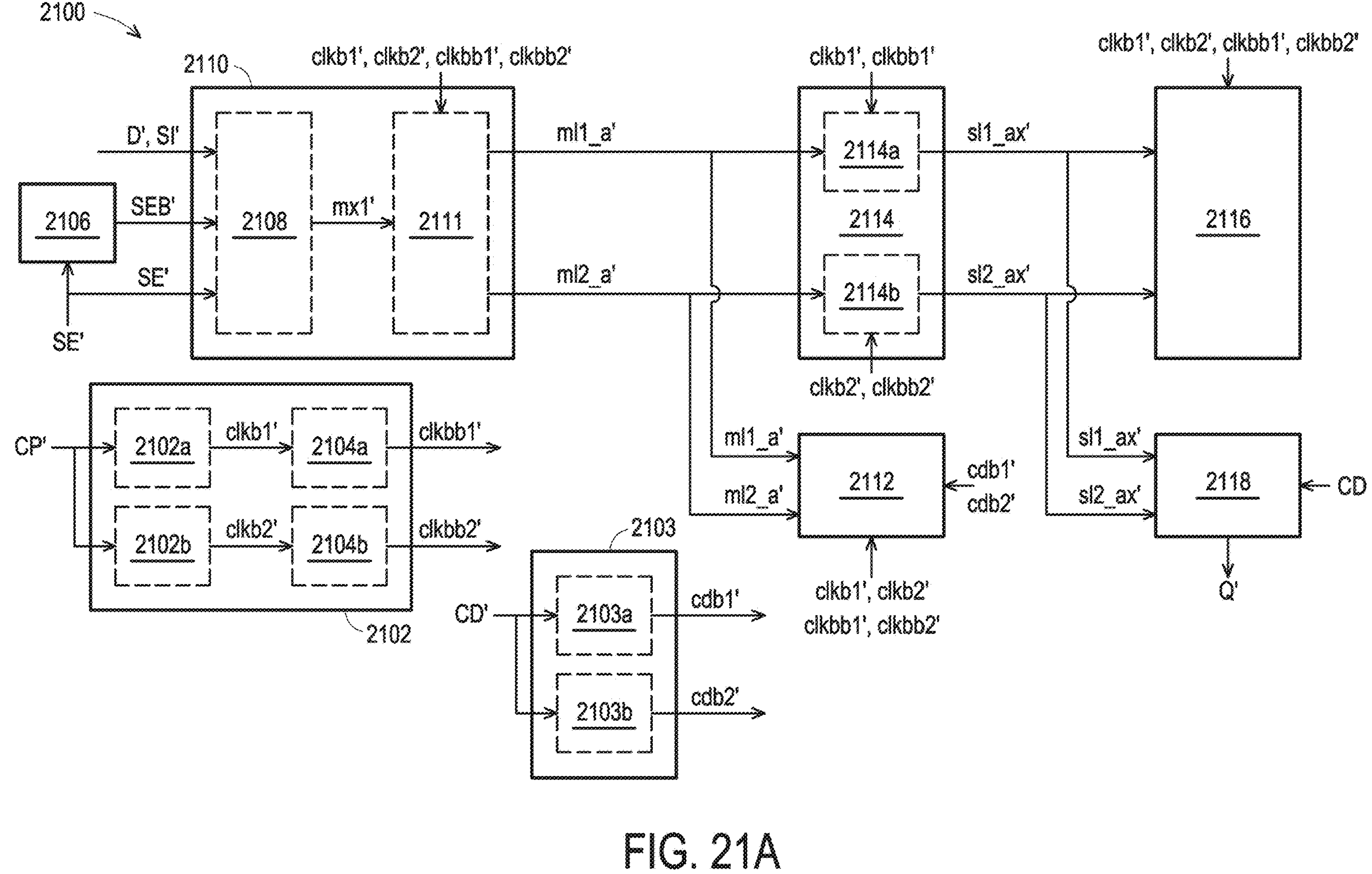
FIG. 21A is a block diagram of an integrated circuit, in accordance with some embodiments.
Figure 21B:
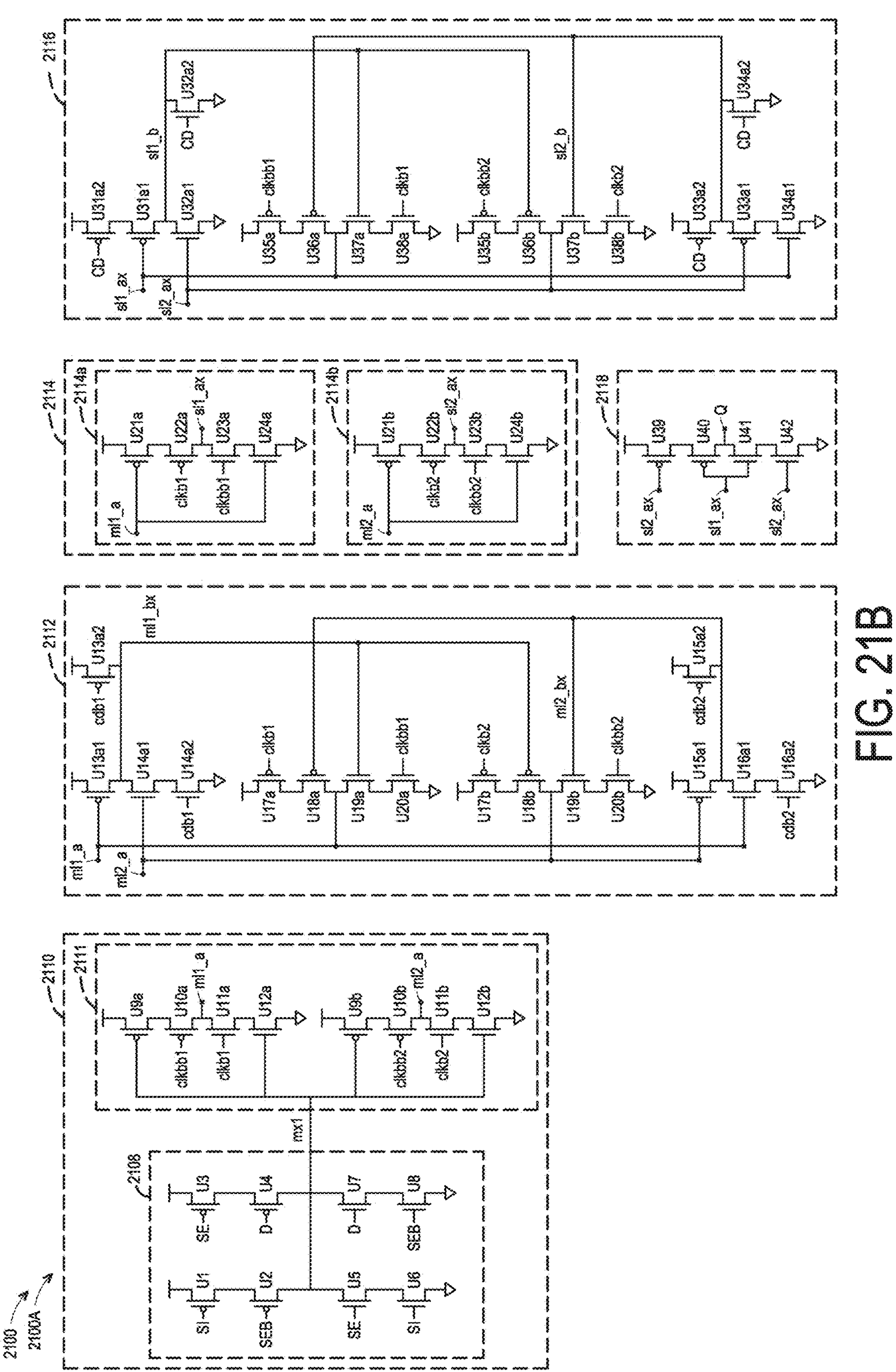
FIG. 21B is a circuit diagram of a portion of an integrated circuit, in accordance with some embodiments.
Figure 21C:
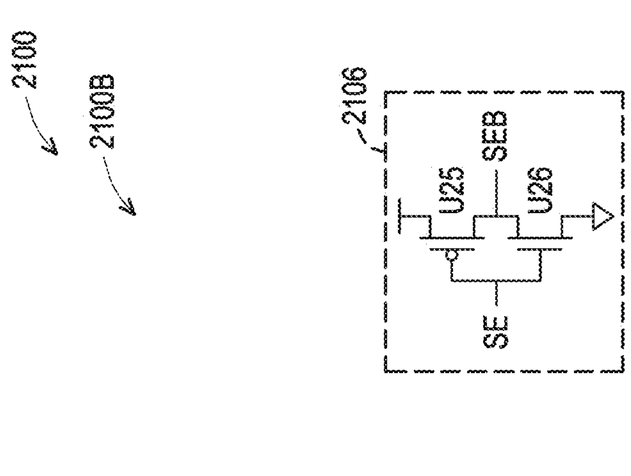
FIG. 21C is a circuit diagram of a portion of an integrated circuit, in accordance with some embodiments.
Figure 21C:
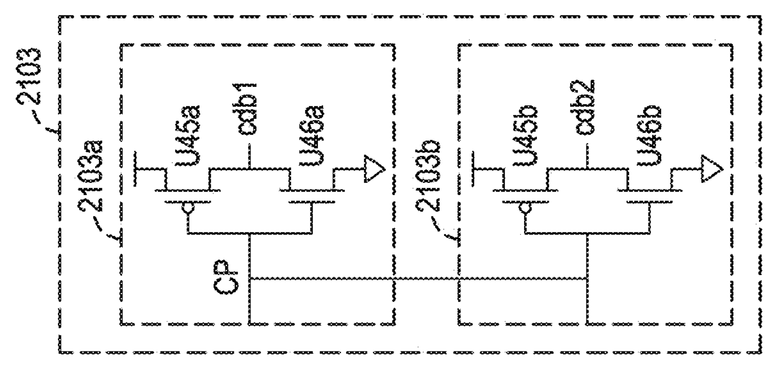
Figure 21C:
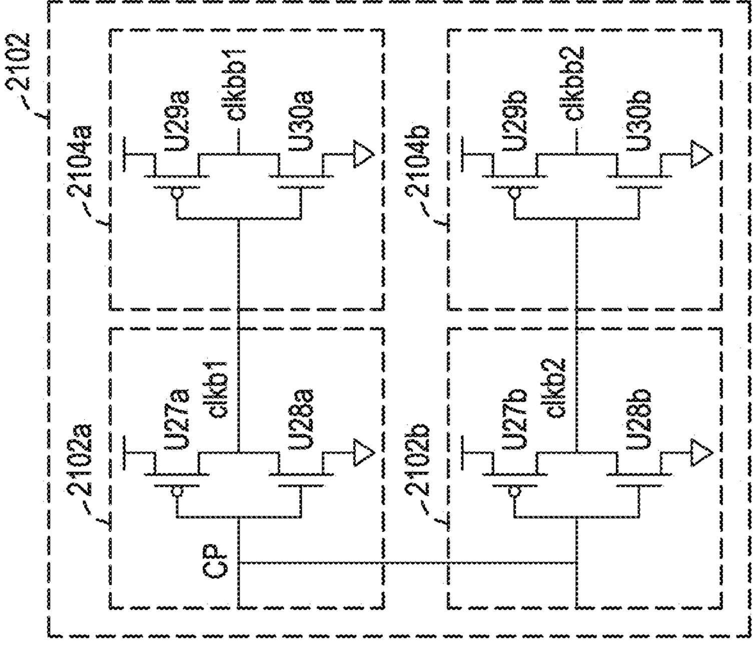
Figure 22A:
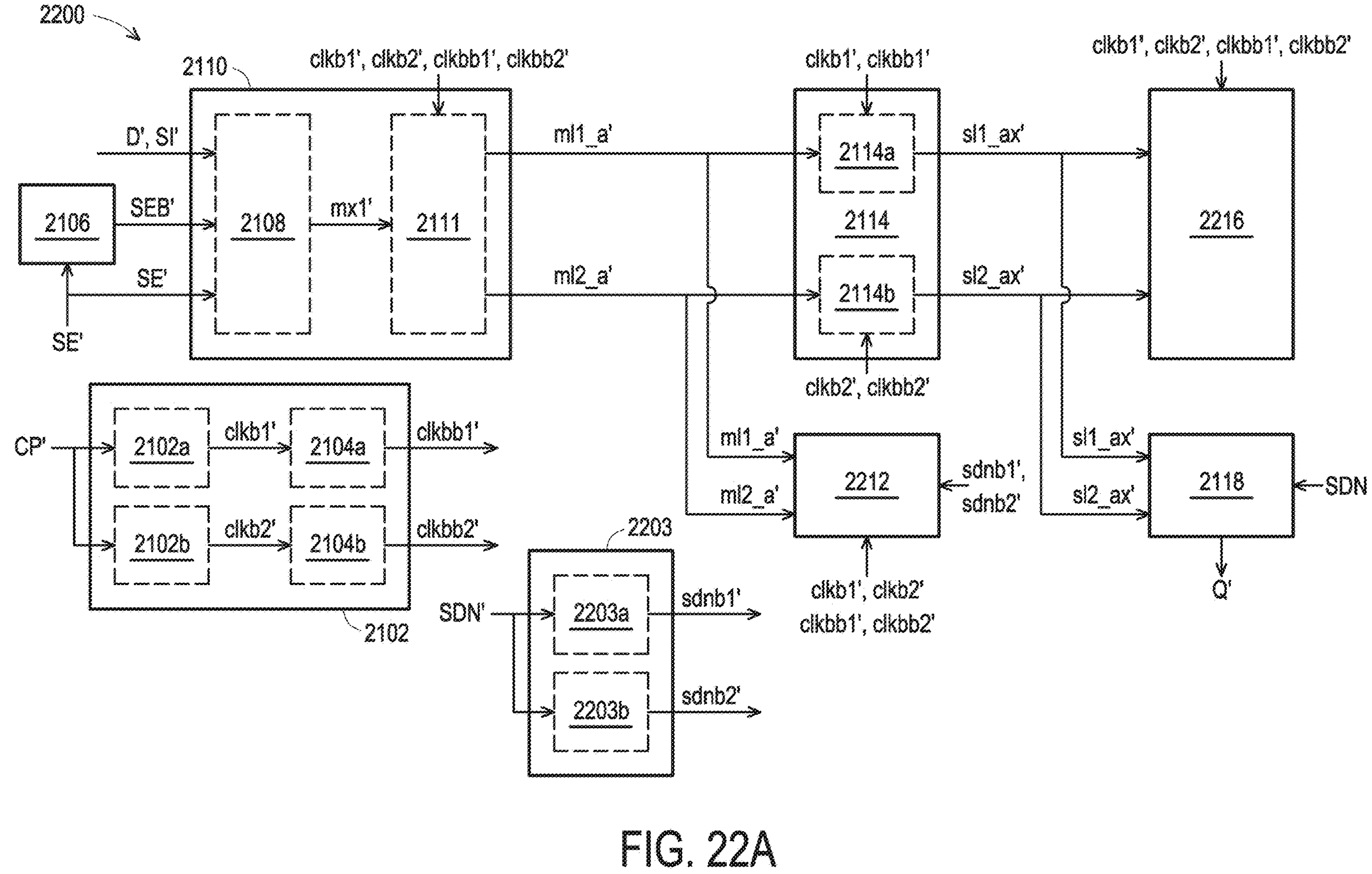
FIG. 22A is a block diagram of an integrated circuit, in accordance with some embodiments.
Figure 22B:
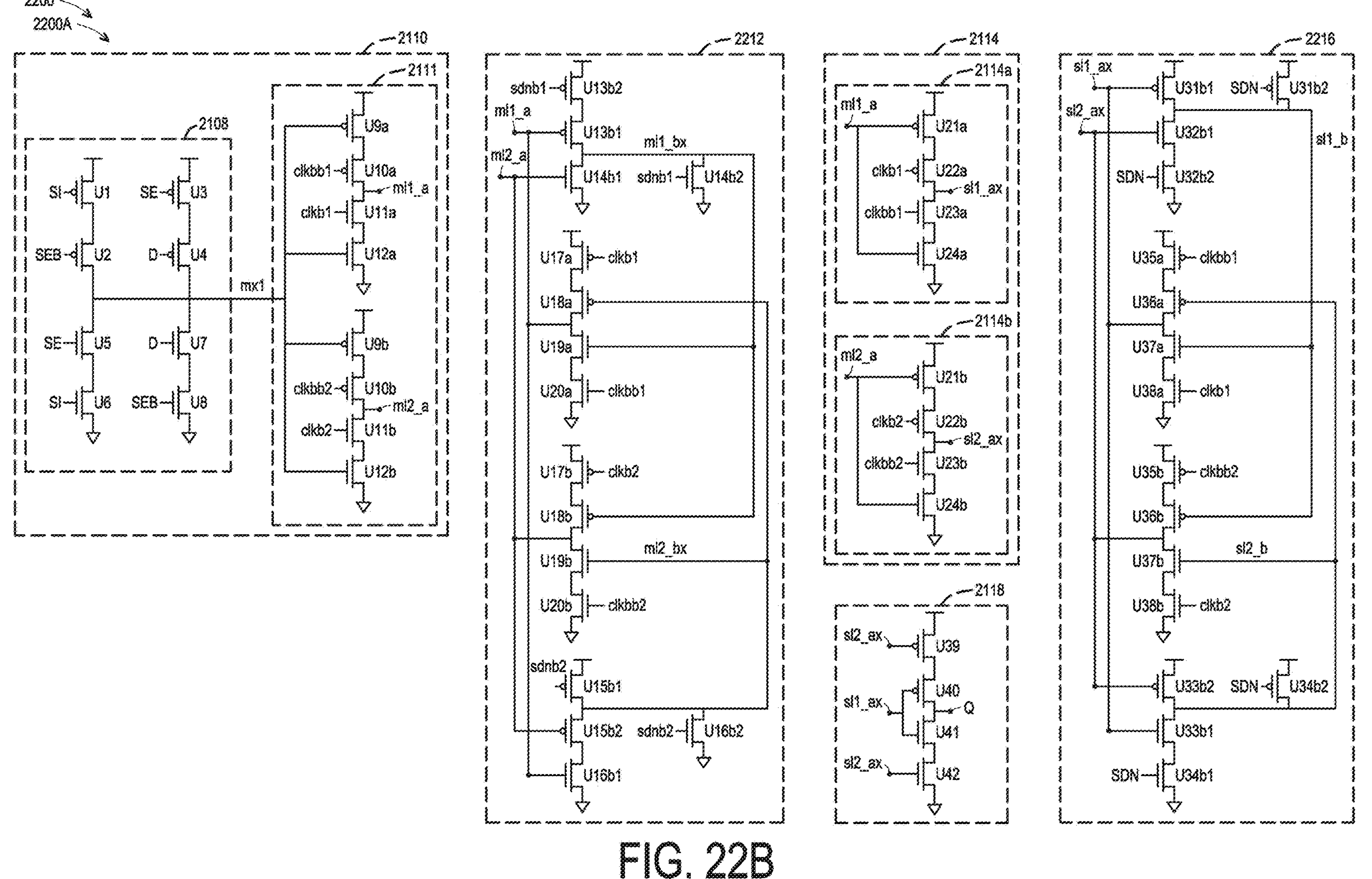
FIG. 22B is a circuit diagram of a portion of an integrated circuit, in accordance with some embodiments.
Figure 22C:
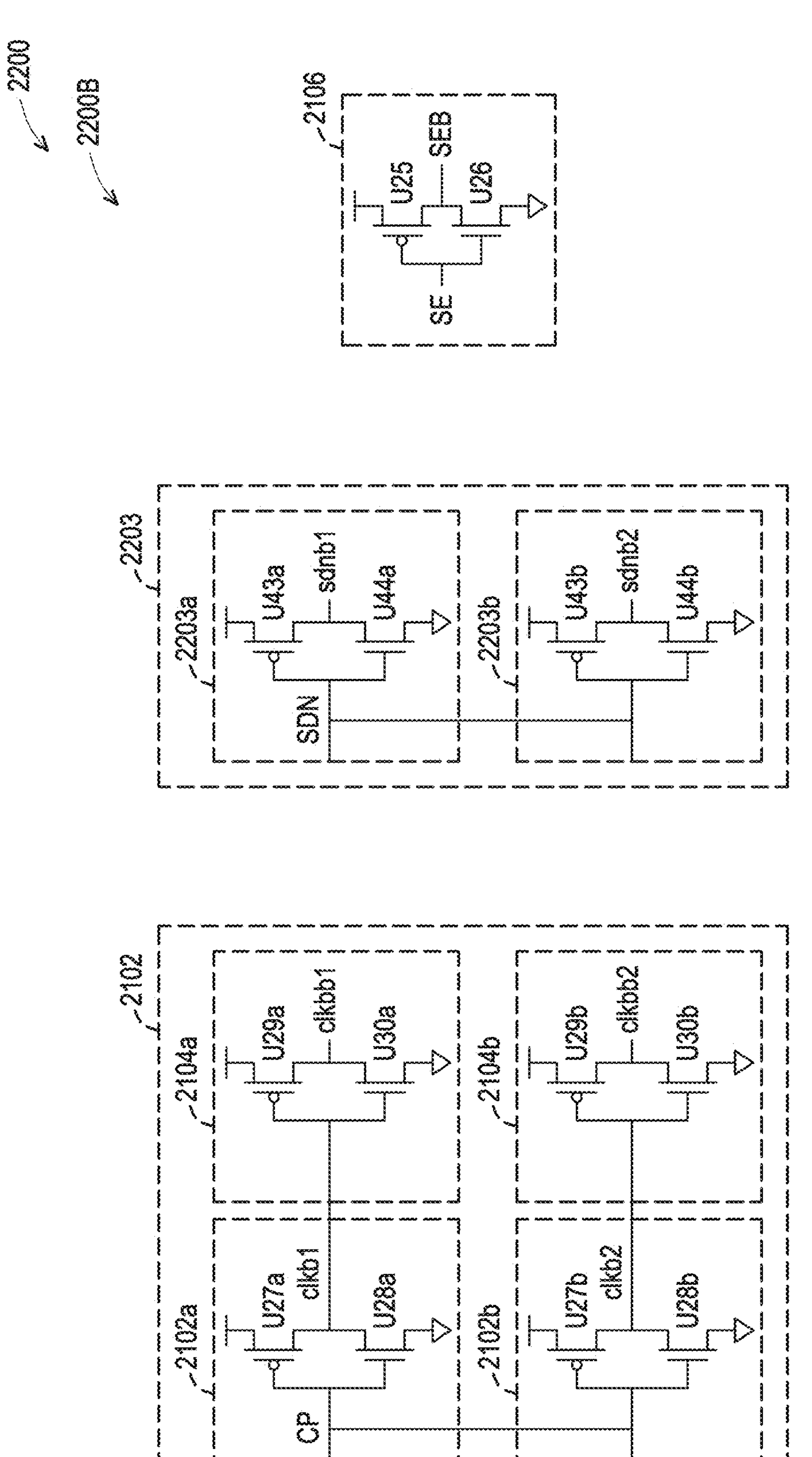
FIG. 22C is a circuit diagram of a portion of an integrated circuit, in accordance with some embodiments.

In some embodiments, integrated circuit 200 is a top view of at least one of integrated circuit 300 of FIG. 3, integrated circuit 400 of FIG. 4, integrated circuit 500 of FIG. 5, integrated circuit 600 of FIG. 6, integrated circuit 700 of FIG. 7, integrated circuit 800 of FIG. 8, integrated circuit 900 of FIG. 9, integrated circuit 1000 of FIG. 10, integrated circuit 1100 of FIG. 11, integrated circuit 1200 of FIG. 12, integrated circuit 1300 of FIG. 13, integrated circuit 1400 of FIG. 14, integrated circuit 1500 of FIG. 15, integrated circuit 1600 of FIG. 16, integrated circuit 1700 of FIG. 17, integrated circuit 1800 of FIG. 18, integrated circuit 1900 of FIG. 19, integrated circuit 2000 of FIG. 20, integrated circuit 2100 of FIGS. 21A-21C or integrated circuit 2200 of FIGS. 22A-22C, and similar detailed description is therefore omitted.

Integrated circuit 200 is manufactured by a corresponding layout design similar to integrated circuit 200. Integrated circuit 200 is an embodiment of integrated circuit 100, and similar detailed description is omitted. For brevity FIG. 2 is described as integrated circuit 200, but in some embodiments, FIG. 2 also corresponds to a layout design, structural elements of integrated circuit 200 also correspond to layout patterns, and structural relationships including alignment, lengths and widths, as well as configurations and layers of a corresponding layout design of integrated circuit 200 are similar to the structural relationships and configurations and layers of integrated circuit 200, and similar detailed description will not be described for brevity.

Integrated circuit 200 corresponds to a cell 201. Cell 201 includes a cell boundary 201*a* and a cell boundary 201*b* that extend in a first direction X. Cell 201 further includes a cell boundary 201*c* and a cell boundary 201*d* that extend in a second direction Y. In some embodiments, the second direction Y is different from the first direction X. Cell 201 is divided into row 1 and row 2. A line 201*e* separates row 1 and row 2 of cell 201 from each other. Line 201*e* extends in the first direction X.

Cell 201 corresponds to a standard cell of integrated circuit 100 or 300-2200. In some embodiments, cell 201 is a standard cell of a flip-flop. In some embodiments, integrated circuit 200 abuts other cells of integrated circuits (not shown) along cell boundaries 201*a* and 201*b*, and along cell boundaries 201*c* and 201*d* that extend in the second direction Y. In some embodiments, integrated circuit 200 is a double height standard cell.

Integrated circuit 200 includes one or more active regions 202*a* or 202*b* (collectively referred to as a "set of active regions 202") extending in the first direction X. Active regions 202*a* or 202*b* of the set of active regions 202 are separated from one another in the second direction Y.

Active region 202*a* includes one or more of active region portion 202*a*1, 202*a*2, . . . , 202*a*21.

Each active region portion 202*a*1, 202*a*2, . . . , 202*a*21 is divided by a corresponding adjacent active region by a corresponding gate of the set of gates 204.

Active region 202*b* includes one or more of active region portion 202*b*1, 202*b*2, . . . , 202*b*21.

Each active region portion 202*b*1, 202*b*2, . . . , 202*b*21 is divided by a corresponding adjacent active region by a corresponding gate of the set of gates 204.

Each active region portion 202*a*1, 202*a*2, . . . , 202*a*21 is shown in FIG. 2 with a corresponding node label (e.g., D, seb, se, si, mx1, ml1_*a*, ml2_*a*, ml1_*bx*, ml2_*bx*, sl1_*ax*, sl2_*ax*, sl1_*b*, sl2_*b*, CP, clkb1, clkbb1, clkb2, clkbb2, Q, VDD, VSS, etc.), and each node label is the same as the corresponding node shown in FIG. 1 or 3-22C. For example, a source of a transistor of active region 202*a* is coupled to supply voltage VDD, and is labeled in FIG. 2 with "VDD."

Each active region portion 202*b*1, 202*b*2, . . . , 202*b*21 is shown in FIG. 2 with a corresponding node label (e.g., D, seb, se, si, mx1, ml1_*a*, ml2_*a*, ml1_*bx*, ml2_*bx*, sl1_*ax*, sl2_*ax*, sl1_*b*, sl2_*b*, CP, clkb1, clkbb1, clkb2, clkbb2, Q, VDD, VSS, etc.), and each node label is the same as the corresponding node shown in FIG. 1 or 3-22C. For example, a source of a transistor of active region 202*b* is coupled to reference supply voltage VSS, and is labeled in FIG. 2 with "VSS."

The set of active regions 202 are manufactured by a corresponding set of active region patterns of integrated circuit 100 or 300-2200. In some embodiments, active regions 202*a*, 202*b* are manufactured by corresponding active region patterns of the set of active region patterns.

In some embodiments, the set of active regions 202 are located on a front-side of integrated circuit 100 or 300-2200. In some embodiments, the set of active regions 202 correspond to source and drain regions of one or more planar transistors, finFET transistors, nanosheet transistors, nanowire transistors or complementary FET (CFET). Other transistor types are within the scope of the present disclosure. In some embodiments, the set of active regions 202 is referred to as an oxide diffusion (OD) region which defines the source or drain diffusion regions of at least integrated circuit 100 or 300-2200.

As shown in FIG. 2, active region 202*a* corresponds to a supply voltage VDD), and therefore active region 202*a* corresponds to PMOS transistors. As shown in FIG. 2, active region 202*b* corresponds to a reference supply voltage VSS and therefore active region 202*b* corresponds to NMOS transistors.

In some embodiments, active region portion 202*a*9 is in a same column (e.g., column 1) as active region portion 202*b*9, and therefore active region portion 202*a*9 and active region portion 202*b*9 are not split across different portions of the set of active regions 202. In some embodiments, by not splitting active region portion 202*a*9 and active region portion 202*b*9 across different portions of the set of active regions 202, thereby reduces the sensitivity of integrated circuit 200 to a single-event upset (SEU) or a single-event error (SEE) that is caused by one or more ionizing particles (electrons, ions, photons, or the like) striking one or more sensitive nodes within integrated circuit 200, thus increasing reliability and accuracy of integrated circuit 200 compared to other approaches.

In some embodiments, at least node ML_AX of active region portion 202*a*16 is separated from node ML_B of active region portion 202*a*18 by at least a distance D1*a*.

In some embodiments, at least node ML_AX of active region portion 202*b*16 is separated from node ML_B of active region portion 202*b*19 by at least a distance D1*b*.

In some embodiments, at least node SL_BX of active region portion 202*a*5 is separated from node SL_A of active region portion 202*a*9 by at least a distance D2*a*.

In some embodiments, at least node SL_BX of active region portion 202*b*7 is separated from node SL_A of active region portion 202*b*9 by at least a distance D2*b*.

In some embodiments, at least one of the distance D1*a*, D1*b*, D2*a* or D2*b* is less than or equal to a first range. In some embodiments, the first range is 100 nanometers (nm) or less. Other ranges or values for the first range are within the scope of the present disclosure.

In some embodiments, if at least one of the distance D2*a* or D2*b* is less than the first range, then the distance D2*a* or D2*b* between a node SL_A of signal sl_a and a node SL_BX of signal sl_bx is reduced compared to other approaches, thus increasing a critical charge $Q_{CRIT}$ of at least the reversed tri-state gate circuit 112 by increasing the corresponding collected charge $Q_{COL}$, thereby increasing the reliability and accuracy of integrated circuit 200 compared to other approaches.

In some embodiments, if at least one of the distance D2*a* or D2*b* is greater than the first range, then the distance D2*a* or D2*b* between a node SL_A of signal sl_a and a node SL_BX of signal sl_bx is increased compared to other approaches, thus decreasing a critical charge $Q_{CRIT}$ of at least the reversed tri-state gate circuit 112 by decreasing the corresponding collected charge $Q_{COL}$, thereby decreasing the reliability and accuracy of integrated circuit 200 compared to other approaches.

In some embodiments, if at least one of the distance D1*a* or D1*b* is less than the first range, then the distance D1*a* or D1*b* between a node ML_B of signal ml_b and a node ML_AX of signal ml_ax is reduced compared to other approaches, thus increasing a critical charge $Q_{CRIT}$ of at least the reversed tri-state gate circuit 106 by increasing the corresponding collected charge $Q_{COL}$, thereby increasing the reliability and accuracy of integrated circuit 200 compared to other approaches.

In some embodiments, if at least one of the distance D1*a* or D1*b* is greater than the first range, then the distance D1*a* or D1*b* between a node ML_B of signal ml_b and a node ML_AX of signal ml_ax is increased compared to other approaches, thus decreasing a critical charge $Q_{CRIT}$ of at least the reversed tri-state gate circuit 106 by decreasing the corresponding collected charge $Q_{COL}$, thereby decreasing the reliability and accuracy of integrated circuit 200 compared to other approaches.

At least one of active region 202*a* or 202*b* has a width W1*a* in the second direction Y. In some embodiments, at least one of active region 202*a* or 202*b* has a width in the second direction Y that is different from a width of another of active region 202*a* or 202*b*.

In some embodiments, the width W1*a* of active regions 202*a* or 202*b* is related to the number of conducting devices (e.g., transistors), and the corresponding speed and driving strength of the conducting devices (e.g., transistors) in the corresponding active regions 202*a* or 202*b*.

In some embodiments, at least the width W1*a* of active regions 202*a* or 202*b* is directly related to the number of fins NF1*a*, NF1*b* in active region 202*a* or 202*b*. For example, in some embodiments, an increase in the width W1*a* of active regions 202*a* or 202*b* causes the number of fins NF1*a* and the number of conducting devices (e.g., transistors) in the set of active regions 202 to increase, and the corresponding speed and driving strength of the conducting devices (e.g., transistors) increases while the area and power consumed increases. For example, in some embodiments, a decrease in the width W1*a* of active regions 202*a* or 202*b* causes the number of fins NF1*a*, NF1*b* and the number of conducting devices (e.g., transistors) in the set of active regions 202 to decrease, and the corresponding speed and driving strength of the conducting devices (e.g., transistors) decreases while the area and power consumed decreases.

In some embodiments, active regions 202*a* or 202*b* have a number of nanosheets NS1*a*.

In some embodiments, the set of active regions 202 is located on a first layout level. In some embodiments, the first layout level corresponds to an active level or an OD level of one or more of integrated circuit 200 or integrated circuit 100 or 300-2200.

Other configurations, arrangements on other layout levels or quantities of regions or patterns in the set of active regions 202 are within the scope of the present disclosure.

Integrated circuit 200 further includes one or more gates 204*a*, 204*b*, . . . , 204*v* (collectively referred to as a "set of gates 204") extending in the second direction Y.

In some embodiments, each of the gates in the set of gates 204 is shown in FIG. 2 with corresponding labels that identify corresponding nodes of corresponding transistors of FIGS. 1 and 3-22, and further description is omitted for brevity. The set of gates 204 is manufactured by a corresponding set of gate patterns of integrated circuit 100 or integrated circuit 300-2200.

The set of gates 204 is above the set of active regions 202. The set of gates 204 is positioned on a second layout level different from the first layout level. In some embodiments, the second layout level is different from the first layout level. In some embodiments, the second layout level corresponds to the POLY level or the CPODE level of one or more of integrated circuit 100 or 300-2200. In some embodiments, the POLY level or the CPODE level is above the OD level.

Other configurations, arrangements on other layout levels or quantities of regions or patterns in the set of gates 204 are within the scope of the present disclosure.

Other configurations, arrangements on other layout levels or quantities of regions in integrated circuit 200 are within the scope of the present disclosure.

FIG. 3 is a circuit diagram of an integrated circuit 300, in accordance with some embodiments.

Integrated circuit 300 is a variation of integrated circuit 100 (FIG. 1), and similar detailed description is therefore omitted. For example, integrated circuit 300 illustrates an example of where integrated circuit 300 is triggered by a falling edge of at least a clock signal CPN.

Integrated circuit 300 includes circuit 102*a*, circuit 102*b*, NOR circuit 104, reversed tri-state gate circuit 106, stacked gate circuit 108, NAND circuit 110, reversed tri-state gate circuit 112, output circuit 114, inverter 118, inverter 120, inverter 122 and inverter 124.

In comparison with integrated circuit 100 of FIG. 1, a clock signal CPN in FIG. 3 replaces the clock signal CP of FIG. 1, and similar detailed description is therefore omitted.

In comparison with at least one of circuit 102*b* of FIG. 1, reversed tri-state gate circuit 106 of FIG. 1, stacked gate circuit 108 of FIG. 1 or reversed tri-state gate circuit 112 of FIG. 1, the clock signal clkb in at least one of circuit 102*b* of FIG. 3, reversed tri-state gate circuit 106 of FIG. 3, stacked gate circuit 108 of FIG. 3 or reversed tri-state gate circuit 112 of FIG. 3 replaces the clock signal clkbb in circuit 102*b* of FIG. 1, reversed tri-state gate circuit 106 of FIG. 1, stacked gate circuit 108 of FIG. 1 or reversed tri-state gate circuit 112 of FIG. 1, and similar detailed description is therefore omitted. Stated differently, in FIG. 3, at least one of the gate terminal of transistor T9, the gate terminal of transistor T14, the gate terminal of transistor T25, or the gate terminal of transistor T19 is configured to receive the clock signal clkb from inverter 122.

In comparison with at least one of circuit 102*b* of FIG. 1, reversed tri-state gate circuit 106 of FIG. 1, stacked gate circuit 108 of FIG. 1 or reversed tri-state gate circuit 112 of FIG. 1, the clock signal clkbb in at least one of circuit 102*b* of FIG. 3, reversed tri-state gate circuit 106 of FIG. 3, stacked gate circuit 108 of FIG. 3 or reversed tri-state gate circuit 112 of FIG. 3 replaces the clock signal clkb in circuit 102*b* of FIG. 1, reversed tri-state gate circuit 106 of FIG. 1, stacked gate circuit 108 of FIG. 1 or reversed tri-state gate circuit 112 of FIG. 1, and similar detailed description is therefore omitted. Stated differently, in FIG. 3, at least one of the gate terminal of transistor T10, the gate terminal of transistor T11, the gate terminal of transistor T24, or the gate terminal of transistor T22 is configured to receive the clock signal clkbb from inverter 124.

In some embodiments, integrated circuit 300 achieves one or more of the benefits discussed herein. Other configurations, arrangements or other circuits in integrated circuit 300 are within the scope of the present disclosure.

FIG. 4 is a circuit diagram of an integrated circuit 400, in accordance with some embodiments.

Integrated circuit 400 is a variation of integrated circuit 100 (FIG. 1), and similar detailed description is therefore omitted. For example, integrated circuit 400 illustrates an example of where the output circuit 114 of FIG. 4 is directly coupled to a node sl_a', and an inverter 402 is positioned between NOR circuit 104 and stacked gate circuit 108.

Integrated circuit 400 includes inverter 402, circuit 102*a*, circuit 102*b*, NOR circuit 104, reversed tri-state gate circuit 106, stacked gate circuit 108, NAND circuit 110, reversed tri-state gate circuit 112, output circuit 114, inverter 118, inverter 120, inverter 122 and inverter 124.

In comparison with integrated circuit 100 of FIG. 1, an output signal QN in FIG. 4 replaces the output signal Q of FIG. 1, and similar detailed description is therefore omitted.

In comparison with integrated circuit 100 of FIG. 1, the output circuit 114 of FIG. 4 is configured to receive signal sl_a instead of signal sl_bx, the output circuit 114 of FIG. 4 is configured to output signal QN instead of signal Q, and similar detailed description is therefore omitted.

In FIG. 4, transistors T31 and T32 are configured to receive signal sl_a, and to generate signal QN. The gate terminals of transistors T31 and T32 in FIG. 4 are configured to receive signal sl_a. The drain terminals of transistors T31 and T32 in FIG. 4 are configured to output the signal QN. In some embodiments, signal sl_a, and signal QN are inverted from each other.

In comparison with integrated circuit 100 of FIG. 1, integrated circuit 400 of FIG. 4 further includes inverter 402, and similar detailed description is therefore omitted.

In comparison with integrated circuit 100 of FIG. 1, the input of the stacked gate circuit 108 is coupled to the output of NOR circuit 104 by the inverter 402 of FIG. 4, and is referred to as a "Reversed Configuration", and similar detailed description is therefore omitted.

In at least FIG. 4, each of the drain terminal of transistor T9, the drain terminal of transistor T10, the drain terminal of transistor T12, the drain terminal of transistor T13, the gate terminal of transistor T16, and the gate terminal of transistor T17 are coupled together. In at least FIG. 4, signal ml_ax is the signal of at least the drain terminal of transistor T9, the drain terminal of transistor T10, the drain terminal of transistor T12, the drain terminal of transistor T13, the gate terminal of transistor T16 or the gate terminal of transistor T17.

In at least FIG. 4, the source terminal of transistor T16 is coupled to the voltage supply VDD, and the drain terminal of transistor T16 is coupled to the source terminal of transistor T15.

In at least FIG. 4, each of the drain terminal of transistor T15, the drain terminal of transistor T17, the drain terminal of transistor T18, the gate terminal of transistor T12, the gate terminal of transistor T13, a gate terminal of transistor T41, and a gate terminal of transistor T42 are coupled together. In at least FIG. 4, signal ml_b is the signal of at least the drain terminal of transistor T15, the drain terminal of transistor T17, the drain terminal of transistor T18, the gate terminal of transistor T12, the gate terminal of transistor T13, gate terminal of transistor T41, or the gate terminal of transistor T42.

Inverter 402 includes transistors T41-T42. In some embodiments, transistor T41 is a PMOS transistor. In some embodiments, transistor T42 is an NMOS transistor.

In some embodiments, signal ml_b, and signal ml_cx are inverted from each other.

A gate terminal of transistor T41 and a gate terminal of transistor T42 are configured to receive signal ml_b. The gate terminals of transistor T41 and transistor T42 are coupled together. A source terminal of transistor T41 is coupled to the voltage supply VDD. A drain terminal of transistor T41 and a drain terminal of transistor T42 are coupled together, and are configured to output signal ml_cx as an output terminal of inverter 402. A source terminal of transistor T42 is coupled to the reference voltage supply VSS.

Inverter 402 is between NOR circuit 104 and stacked gate circuit 108.

In comparison with integrated circuit 100 of FIG. 1, the stacked gate circuit 108 is configured to receive a signal ml_cx instead of signal ml_ax of FIG. 1, and similar detailed description is therefore omitted.

In at least FIG. 4, each of the drain terminal of transistor T41, the drain terminal of transistor T42, the gate terminal of transistor T23 and the gate terminal of transistor T26 are coupled together. In at least FIG. 4, signal ml_cx is the signal of at least the drain terminal of transistor T41, the drain terminal of transistor T42, the gate terminal of transistor T23 or the gate terminal of transistor T26. In at least FIG. 4, each of the gate terminal of transistor T23 and the gate terminal of transistor T26 is configured to receive signal ml_cx.

In some embodiments, integrated circuit 400 achieves one or more of the benefits discussed herein. Other configurations, arrangements or other circuits in integrated circuit 400 are within the scope of the present disclosure.

FIG. 5 is a circuit diagram of an integrated circuit 500, in accordance with some embodiments.

Integrated circuit 500 is a variation of integrated circuit 100 (FIG. 1), and similar detailed description is therefore omitted. For example, integrated circuit 500 illustrates an example where integrated circuit 500 is a non-scan flip-flop circuit, and is triggered by a rising edge of at least a clock signal CP, and similar detailed description is therefore omitted.

Integrated circuit 500 includes a circuit 502, circuit 102*b*, NOR circuit 104, reversed tri-state gate circuit 106, stacked gate circuit 108, NAND circuit 110, reversed tri-state gate circuit 112, output circuit 114, inverter 118, inverter 122 and inverter 124.

In comparison with integrated circuit 100 of FIG. 1, circuit 502 of integrated circuit 500 of FIG. 5 replaces circuit 102*a* of FIG. 1, and similar detailed description is therefore omitted.

In comparison with circuit 102*a* of FIG. 1, circuit 502 of integrated circuit 500 of FIG. 5 does not include transistors T1-T3, T5-T6 and T8 of FIG. 1, and similar detailed description is therefore omitted.

Circuit 502 includes transistors T4 and T7.

In circuit 502, a source terminal of transistor T4 is coupled to the voltage supply VDD.

In circuit 502, each of a source terminal of transistor T9 and a drain terminal of transistor T4 are coupled together. In circuit 502, each of a source terminal of transistor T10 and a drain terminal of transistor T7 are coupled together.

In circuit 502, a source terminal of transistor T7 is coupled to the reference voltage supply VSS.

In some embodiments, integrated circuit 500 achieves one or more of the benefits discussed herein.

Other configurations, arrangements or other circuits in integrated circuit 500 are within the scope of the present disclosure.

FIG. 6 is a circuit diagram of an integrated circuit 600, in accordance with some embodiments.

Integrated circuit 600 is a variation of integrated circuit 400 (FIG. 4) or 300 (FIG. 3), and similar detailed description is therefore omitted. For example, integrated circuit 600 is a non-scan flip-flop circuit, and is triggered by a falling edge of at least a clock signal CPN similar to integrated circuit 300 (FIG. 3), and similar detailed description is therefore omitted.

Integrated circuit 600 includes inverter 402, circuit 502, circuit 102*b*, NOR circuit 104, reversed tri-state gate circuit 106, stacked gate circuit 108, NAND circuit 110, reversed tri-state gate circuit 112, output circuit 114, inverter 118, inverter 122 and inverter 124.

In comparison with integrated circuit 400 of FIG. 4, integrated circuit 600 is a non-scan version of integrated circuit 400 of FIG. 4, and similar detailed description is therefore omitted. For example, in comparison with integrated circuit 400 of FIG. 4, circuit 502 in FIG. 6 replaces the circuit 102*a* of FIG. 4, and similar detailed description is therefore omitted.

In comparison with integrated circuit 400 of FIG. 4, output circuit 114 of integrated circuit 600 replaces the output circuit 114 of FIG. 4, and similar detailed description is therefore omitted. In some embodiments, the output circuit 114 of integrated circuit 600 corresponds to the output circuit 114 of integrated circuit 100 of FIG. 1 or FIG. 3, and similar detailed description is therefore omitted.

In comparison with integrated circuit 400 of FIG. 4, signal Q in FIG. 6 replaces the signal QN of FIG. 4, and similar detailed description is therefore omitted.

In comparison with integrated circuit 400 of FIG. 4, integrated circuit 600 is triggered by a falling edge of at least a clock signal CPN. For example, in FIG. 6, at least one of the gate terminal of transistor T9, the gate terminal of transistor T14, the gate terminal of transistor T25, or the gate terminal of transistor T19 is configured to receive the clock signal clkb from inverter 122. For example, in FIG. 6, at least one of the gate terminal of transistor T10, the gate terminal of transistor T11, the gate terminal of transistor T24, or the gate terminal of transistor T22 is configured to receive the clock signal clkbb from inverter 124.

In some embodiments, in at least FIG. 6, at least one of inverter 402, stacked gate circuit 108, NAND circuit 110 or reversed tri-state gate circuit 112 has a corresponding active region with the number of fins NF1*a* (shown in FIG. 2).

In some embodiments, in at least FIG. 6, at least one of NOR circuit 104, circuit 502, circuit 102*b*, reversed tri-state gate circuit 106, output circuit 114, inverter 118, inverter 122 or inverter 124 has a corresponding active region with the number of fins NF2*a* (shown in FIG. 2).

In some embodiments, integrated circuit 600 achieves one or more of the benefits discussed herein. Other configurations, arrangements or other circuits in integrated circuit 600 are within the scope of the present disclosure.

FIG. 7 is a circuit diagram of an integrated circuit 700, in accordance with some embodiments.

Integrated circuit 700 is a variation of integrated circuit 600 (FIG. 6), and similar detailed description is therefore omitted. For example, integrated circuit 700 illustrates an example of where the output circuit 114 is directly coupled to the node sl_a', and is described in integrated circuit 400 of FIG. 4, and similar detailed description is therefore omitted.

In some embodiments, integrated circuit 700 is a non-scan flip-flop circuit, and is triggered by a falling edge of at least a clock signal CPN.

Integrated circuit 700 includes inverter 402, circuit 502, circuit 102*b*, NOR circuit 104, reversed tri-state gate circuit 106, stacked gate circuit 108, NAND circuit 110, reversed tri-state gate circuit 112, output circuit 114, inverter 118, inverter 122 and inverter 124.

In comparison with integrated circuit 600 of FIG. 6, signal QN in FIG. 7 replaces the signal Q of FIG. 6, and similar detailed description is therefore omitted.

In comparison with integrated circuit 600 of FIG. 6, the output circuit 114 of integrated circuit 700 of FIG. 7 is similar to the output circuit of integrated circuit 400 of FIG. 4, and similar detailed description is therefore omitted.

In some embodiments, integrated circuit 700 achieves one or more of the benefits discussed herein. Other configurations, arrangements or other circuits in integrated circuit 700 are within the scope of the present disclosure.

FIG. 8 is a circuit diagram of an integrated circuit 800, in accordance with some embodiments.

Integrated circuit 800 is a variation of integrated circuit 700 (FIG. 7), and similar detailed description is therefore omitted. For example, integrated circuit 800 is a non-scan flip-flop circuit, and is triggered by a rising edge of at least a clock signal CP similar to integrated circuit 400 (FIG. 4), and similar detailed description is therefore omitted.

Integrated circuit 800 includes inverter 402, circuit 502, circuit 102*b*, NOR circuit 104, reversed tri-state gate circuit 106, stacked gate circuit 108, NAND circuit 110, reversed tri-state gate circuit 112, output circuit 114, inverter 118, inverter 122 and inverter 124.

In comparison with integrated circuit 700 of FIG. 7, integrated circuit 800 of FIG. 8 is triggered by a rising edge of at least a clock signal CP similar to integrated circuit 400 (FIG. 4), and similar detailed description is therefore omitted.

For example, in FIG. 8, at least one of the gate terminal of transistor T9, the gate terminal of transistor T14, the gate terminal of transistor T25, or the gate terminal of transistor T19 is configured to receive the clock signal clkbb from inverter 124. For example, in FIG. 8, at least one of the gate terminal of transistor T10, the gate terminal of transistor T11, the gate terminal of transistor T24, or the gate terminal of transistor T22 is configured to receive the clock signal clkb from inverter 122.

In some embodiments, integrated circuit 800 achieves one or more of the benefits discussed herein. Other configurations, arrangements or other circuits in integrated circuit 800 are within the scope of the present disclosure.

FIG. 9 is a circuit diagram of an integrated circuit 900, in accordance with some embodiments.

Integrated circuit 900 is a variation of integrated circuit 600 (FIG. 6), and similar detailed description is therefore omitted. For example, integrated circuit 900 is a non-scan flip-flop circuit, and is triggered by a falling edge of at least a clock signal CPN similar to integrated circuit 600 (FIG. 6), and similar detailed description is therefore omitted.

Integrated circuit 900 includes circuit 502, circuit 102*b*, NOR circuit 104, reversed tri-state gate circuit 106, stacked gate circuit 108, a NOR circuit 910, reversed tri-state gate circuit 112, output circuit 114, inverter 122 and inverter 124.

In comparison with integrated circuit 600 of FIG. 6, integrated circuit 900 of FIG. 9 does not include inverter 118 and inverter 402 of FIG. 6, and similar detailed description is therefore omitted.

In some embodiments, by not including inverter 402 in FIG. 9, the output terminal of NOR circuit 104 is directly coupled to the input terminal of the stacked gate circuit 108. In at least FIG. 9, each of the drain terminal of transistor T15, the drain terminal of transistor T17, the drain terminal of transistor T18, the gate terminal of transistor T12, the gate terminal of transistor T13, the gate terminal of transistor T23, and a gate terminal of transistor T26 are coupled together. In at least FIG. 9, signal ml_b is the signal of at least the drain terminal of transistor T15, the drain terminal of transistor T17, the drain terminal of transistor T18, the gate terminal of transistor T12, the gate terminal of transistor T13, gate terminal of transistor T23 or the gate terminal of transistor T26.

In comparison with integrated circuit 600 of FIG. 6, NOR circuit 910 of integrated circuit 900 replaces the NAND circuit 610 of FIG. 6, and similar detailed description is therefore omitted.

In some embodiments, by not including inverter 118, the NOR circuit 910 of integrated circuit 900 replaces the NAND circuit 610 of FIG. 6, and the first set of input terminals of NOR circuit 910 is configured to receive signal CD instead of signal cdb as received by the first set of input terminals of NAND circuit 110 as shown in FIG. 6, and similar detailed description is therefore omitted.

NOR circuit 910 includes transistors T43-T46. In some embodiments, each of transistors T43 and T44 is a PMOS transistor. In some embodiments, each of transistors T45 and T46 is an NMOS transistor.

Each of a gate terminal of transistor T44 and a gate terminal of transistor T46 is configured to receive signal CD. In some embodiments, each of a gate terminal of transistor T44 and a gate terminal of transistor T46 are coupled together.

Each of the gate terminal of transistor T43 and the gate terminal of transistor T45 is configured to receive signal sl_a.

Each of the drain terminal of transistor T24, the drain terminal of transistor T25, the drain terminal of transistor T20, the drain terminal of transistor T21, a gate terminal of transistor T43 and a gate terminal of transistor T45 are coupled together. Signal sl_a is the signal of at least the drain terminal of transistor T24, the drain terminal of transistor T25, the drain terminal of transistor T20, the drain terminal of transistor T21, the gate terminal of transistor T43 or the gate terminal of transistor T45.

A source terminal of transistor T43 is coupled to the voltage supply VDD. A drain terminal of transistor T43 is coupled to a source terminal of transistor T44.

Each of a drain terminal of transistor T44, a drain terminal of transistor T45, a drain terminal of transistor T46, the gate terminal of transistor T20, the gate terminal of transistor T21, the gate terminal of transistor T31 and the gate terminal of transistor T32 are coupled together. In at least FIG. 9, signal sl_bx is the signal of at least the drain terminal of transistor T44, the drain terminal of transistor T45, the drain terminal of transistor T46, the gate terminal of transistor T20, the gate terminal of transistor T21, the gate terminal of transistor T31 or the gate terminal of transistor T32.

A source terminal of transistor T45 is coupled to the reference voltage supply VSS. A source terminal of transistor T46 is coupled to the reference voltage supply VSS.

In comparison with integrated circuit 600 of FIG. 6, signal QN in FIG. 9 replaces the signal Q of FIG. 6, and similar detailed description is therefore omitted.

In some embodiments, in at least FIG. 9, at least one of stacked gate circuit 108, NOR circuit 910 or reversed tri-state gate circuit 112 has a corresponding active region with the number of fins NF1*a* (shown in FIG. 2).

In some embodiments, in at least FIG. 9, at least one of NOR circuit 104, circuit 502, circuit 102*b*, reversed tri-state gate circuit 106, output circuit 114, inverter 122 or inverter 124 has a corresponding active region with the number of fins NF2*a* (shown in FIG. 2).

In some embodiments, integrated circuit 900 achieves one or more of the benefits discussed herein. Other configurations, arrangements or other circuits in integrated circuit 900 are within the scope of the present disclosure.

FIG. 10 is a circuit diagram of an integrated circuit 1000, in accordance with some embodiments.

In some embodiments, integrated circuit 1000 is a non-scan flip-flop circuit. In some embodiments, at least one of integrated circuit 1000, 1100 (FIG. 11), 1200 (FIG. 12), 1300 (FIG. 13), 1400 (FIG. 14), 1500 (FIG. 15), 1700 (FIG. 17), 1800 (FIG. 18) or 2000 (FIG. 20) is a D-flip-flop circuit with an asynchronous set. In some embodiments, the integrated circuit 1000 is triggered by a rising edge of at least a clock signal CP.

Integrated circuit 1000 is a variation of integrated circuit 500 (FIG. 5), and similar detailed description is therefore omitted. For example, integrated circuit 1000 is a non-scan flip-flop circuit, and is triggered by a rising edge of at least a clock signal CP, and similar detailed description is therefore omitted.

Integrated circuit 1000 includes circuit 502, circuit 102*b*, a NAND circuit 1004, reversed tri-state gate circuit 106, stacked gate circuit 108, a NOR circuit 1010, reversed tri-state gate circuit 112, output circuit 114, an inverter 1018, inverter 122 and inverter 124.

In comparison with integrated circuit 500 of FIG. 5, NOR circuit 1010 of integrated circuit 1000 replaces the NAND circuit 110 of FIG. 5, and NAND circuit 1004 of integrated circuit 1000 replaces the NOR circuit 104 of FIG. 5, Inverter 1018 of integrated circuit 1000 replaces the inverter 118 of FIG. 5, and similar detailed description is therefore omitted.

NOR circuit 1010 includes transistors T15-T18.

In at least NOR circuit 1010 of FIG. 10, each of the gate terminal of transistor T15 and the gate terminal of transistor T18 is configured to receive a signal sdnb. In some embodiments, each of the gate terminal of transistor T15, the gate terminal of transistor T18 and the output terminal of inverter 1018 are coupled together.

In at least NOR circuit 1010 of FIG. 10, the source terminal of transistor T16 is coupled to the voltage supply VDD. In at least NOR circuit 1010 of FIG. 10, the drain terminal of transistor T16 is coupled to a source terminal of transistor T15.

In at least NOR circuit 1010 of FIG. 10, each of the drain terminal of transistor T15, the drain terminal of transistor T17, the drain terminal of transistor T18, the gate terminal of transistor T20, the gate terminal of transistor T21, the gate terminal of transistor T31 and the gate terminal of transistor T32 are coupled together. In at least NOR circuit 1010 of FIG. 10, signal sl_bx is the signal of at least the drain terminal of transistor T15, the drain terminal of transistor T17, the drain terminal of transistor T18, the gate terminal of transistor T20, the gate terminal of transistor T21, the gate terminal of transistor T31 or the gate terminal of transistor T32.

In at least NOR circuit 1010 of FIG. 10, each of the gate terminal of transistor T16 and the gate terminal of transistor T17 is configured to receive signal sl_a.

In at least NOR circuit 1010 of FIG. 10, each of the drain terminal of transistor T24, the drain terminal of transistor T25, the drain terminal of transistor T20, the drain terminal of transistor T21, the gate terminal of transistor T16 and the gate terminal of transistor T17 are coupled together. In at least NOR circuit 1010 of FIG. 10, signal sl_a is the signal of at least the drain terminal of transistor T24, the drain terminal of transistor T25, the drain terminal of transistor T20, the drain terminal of transistor T21, the gate terminal of transistor T16 or the gate terminal of transistor T17.

A source terminal of transistor T17 is coupled to the reference voltage supply VSS. A source terminal of transistor T18 is coupled to the reference voltage supply VSS.

NAND circuit 1004 includes transistors T27-T30.

In at least NAND circuit 1004 of FIG. 10, a source terminal of transistor T27 is coupled to the voltage supply VDD. In at least NAND circuit 1004 of FIG. 10, a source terminal of transistor T28 is coupled to the voltage supply VDD.

In at least NAND circuit 1004 of FIG. 10, each of the gate terminal of transistor T28 and the gate terminal of transistor T30 is configured to receive signal SDN. In some embodiments, each of the gate terminal of transistor T28 and the gate terminal of transistor T30 are coupled together.

In at least NAND circuit 1004 of FIG. 10, each of the gate terminal of transistor T27 and the gate terminal of transistor T29 is configured to receive signal ml_ax.

In at least NAND circuit 1004 of FIG. 10, each of the drain terminal of transistor T9, the drain terminal of transistor T10, the drain terminal of transistor T12, the drain terminal of transistor T13, the gate terminal of transistor T27, the gate terminal of transistor T29, the gate terminal of transistor T23 and the gate terminal of transistor T26 are coupled together. In at least NAND circuit 1004 of FIG. 10, signal ml_ax is the signal of at least the drain terminal of transistor T9, the drain terminal of transistor T10, the drain terminal of transistor T12, the drain terminal of transistor T13, the gate terminal of transistor T27, the gate terminal of transistor T29, the gate terminal of transistor T23 or the gate terminal of transistor T26.

In at least NAND circuit 1004 of FIG. 10, each of the drain terminal of transistor T27, the drain terminal of transistor T28, the drain terminal of transistor T30, the gate terminal of transistor T12 and the gate terminal of transistor T13 are coupled together. In at least NAND circuit 1004 of FIG. 10, signal ml_b is the signal of at least the drain terminal of transistor T27, the drain terminal of transistor T28, the drain terminal of transistor T30, the gate terminal of transistor T12 and the gate terminal of transistor T13.

In at least NAND circuit 1004 of FIG. 10, the source terminal of transistor T30 is coupled to the drain terminal of transistor T29. In at least NAND circuit 1004 of FIG. 10, the source terminal of transistor T29 is coupled to the reference voltage supply VSS.

Inverter 1018 includes transistors T60-T61. In some embodiments, transistor T60 is a PMOS transistor. In some embodiments, transistor T61 is an NMOS transistor.

A gate terminal of transistor T60 and a gate terminal of transistor T61 are configured to receive signal SDN. In some embodiments, signal SDN is a set signal. The gate terminals of transistor T60 and transistor T61 are coupled together. A source terminal of transistor T60 is coupled to the voltage supply VDD. A drain terminal of transistor T60 and a drain terminal of transistor T61 are coupled together, and are configured to output signal sdnb as the output terminal of inverter 1018. A source terminal of transistor T61 is coupled to the reference voltage supply VSS.

In some embodiments, inverter 1018 is a local set buffer. In some embodiments, by including a local set buffer (e.g., inverter 1018) in integrated circuit 1000, a number of transistors and a corresponding level of the reversed tri-state gate circuit 112 is reduced thereby reducing a distance (e.g., distance D2*a* in FIG. 2) between a node of signal sl_a and a node of signal sl_bx compared to other approaches.

In some embodiments, by including a local set buffer (e.g., inverter 1018) in integrated circuit 1000, an inverted set signal (e.g., signal sdnb) is used by the slave latch (e.g., NOR circuit 1010 and reversed tri-state gate circuit 112) thereby increasing the signal stability of at least signal sl_bx and the output signal Q of integrated circuit 1000 compared to other approaches.

In some embodiments, in at least FIG. 10, at least one of NAND circuit 1004, stacked gate circuit 108, NOR circuit 1010 or reversed tri-state gate circuit 112 has a corresponding active region with the number of fins NF1*a* (shown in FIG. 2).

In some embodiments, in at least FIG. 10, at least one of circuit 502, circuit 102*b*, reversed tri-state gate circuit 106, output circuit 114, inverter 1018, inverter 122 or inverter 124 has a corresponding active region with the number of fins NF2*a* (shown in FIG. 2).

In some embodiments, integrated circuit 1000 achieves one or more of the benefits discussed herein. Other configurations, arrangements or other circuits in integrated circuit 1000 are within the scope of the present disclosure.

FIG. 11 is a circuit diagram of an integrated circuit 1100, in accordance with some embodiments.

Integrated circuit 1100 is a variation of integrated circuit 1000 (FIG. 10) or 600 (FIG. 6), and similar detailed description is therefore omitted. For example, integrated circuit 1100 is a non-scan flip-flop circuit, and is triggered by a falling edge of at least a clock signal CPN similar to integrated circuit 300 (FIG. 3), and similar detailed description is therefore omitted.

Integrated circuit 1100 includes circuit 502, inverter 402, circuit 102*b*, NAND circuit 1004, reversed tri-state gate circuit 106, stacked gate circuit 108, NOR circuit 1010, reversed tri-state gate circuit 112, output circuit 114, inverter 1018, inverter 122 and inverter 124.

In comparison with integrated circuit 1000 of FIG. 10, integrated circuit 1100 of FIG. 11 is triggered by a rising edge of at least a clock signal CP similar to integrated circuit 400 (FIG. 4), and similar detailed description is therefore omitted. For example, in at least FIG. 11, at least one of the gate terminal of transistor T9, the gate terminal of transistor T14, the gate terminal of transistor T25, or the gate terminal of transistor T19 is configured to receive the clock signal clkb from inverter 122. For example, in FIG. 11, at least one of the gate terminal of transistor T10, the gate terminal of transistor T11, the gate terminal of transistor T24, or the gate terminal of transistor T22 is configured to receive the clock signal clkbb from inverter 124.

In comparison with integrated circuit 1000 of FIG. 10, integrated circuit 1100 of FIG. 11 further includes inverter 402 (described in at least FIG. 4), and similar detailed description is therefore omitted. Inverter 402 is between NAND circuit 1004 and stacked gate circuit 108.

In at least FIG. 11, each of the drain terminal of transistor T9, the drain terminal of transistor T10, the drain terminal of transistor T12, the drain terminal of transistor T13, the gate terminal of transistor T27, and the gate terminal of transistor T29 are coupled together. In at least FIG. 11, signal ml_ax is the signal of at least the drain terminal of transistor T9, the drain terminal of transistor T10, the drain terminal of transistor T12, the drain terminal of transistor T13, the gate terminal of transistor T27 or the gate terminal of transistor T29.

In at least FIG. 11, each of the drain terminal of transistor T27, the drain terminal of transistor T28, the drain terminal of transistor T30, the gate terminal of transistor T12, the gate terminal of transistor T13, the gate terminal of transistor T41, and the gate terminal of transistor T42 are coupled together. In at least FIG. 11, signal ml_b is the signal of at least the drain terminal of transistor T27, the drain terminal of transistor T28, the drain terminal of transistor T30, the gate terminal of transistor T12, the gate terminal of transistor T13, gate terminal of transistor T41, or the gate terminal of transistor T42.

In some embodiments, in at least FIG. 11, at least one of inverter 402, stacked gate circuit 108, NOR circuit 1010 or reversed tri-state gate circuit 112 has a corresponding active region with the number of fins NF1*a* (shown in FIG. 2).

In some embodiments, in at least FIG. 11, at least one of NAND circuit 1004, circuit 502, circuit 102*b*, reversed tri-state gate circuit 106, output circuit 114, inverter 1018, inverter 122 or inverter 124 has a corresponding active region with the number of fins NF2*a* (shown in FIG. 2).

In some embodiments, integrated circuit 1100 achieves one or more of the benefits discussed herein. Other configurations, arrangements or other circuits in integrated circuit 1100 are within the scope of the present disclosure.

FIG. 12 is a circuit diagram of an integrated circuit 1200, in accordance with some embodiments.

Integrated circuit 1200 is a variation of integrated circuit 1100 (FIG. 11), and similar detailed description is therefore omitted. For example, integrated circuit 1200 illustrates an example of where the output circuit 114 is directly coupled to the node sl_a', and is described in integrated circuit 400 of FIG. 4, and similar detailed description is therefore omitted.

In some embodiments, integrated circuit 1200 is a non-scan flip-flop circuit, and is triggered by a falling edge of at least a clock signal CPN.

Integrated circuit 1200 includes circuit 502, inverter 402, circuit 102*b*, NAND circuit 1004, reversed tri-state gate circuit 106, stacked gate circuit 108, NOR circuit 1010, reversed tri-state gate circuit 112, output circuit 114, inverter 1018, inverter 122 and inverter 124.

In comparison with integrated circuit 1100 of FIG. 11, signal QN in FIG. 12 replaces the signal Q of FIG. 11, and similar detailed description is therefore omitted.

In comparison with integrated circuit 1100 of FIG. 11, the input of the output circuit 114 of integrated circuit 1200 of FIG. 12 is directly coupled to the node sl_a', which is similar to the output circuit 114 of integrated circuit 400 of FIG. 4, and similar detailed description is therefore omitted.

In some embodiments, integrated circuit 1200 achieves one or more of the benefits discussed herein. Other configurations, arrangements or other circuits in integrated circuit 1200 are within the scope of the present disclosure.

FIG. 13 is a circuit diagram of an integrated circuit 1300, in accordance with some embodiments.

Integrated circuit 1300 is a variation of integrated circuit 1100 (FIG. 11), and similar detailed description is therefore omitted. For example, integrated circuit 1300 is a non-scan flip-flop circuit, and is triggered by a falling edge of at least a clock signal CPN similar to integrated circuit 1100 (FIG. 11), and similar detailed description is therefore omitted.

Integrated circuit 1300 includes circuit 502, circuit 102*b*, NAND circuit 1004, reversed tri-state gate circuit 106, stacked gate circuit 108, NOR circuit 1010, reversed tri-state gate circuit 112, output circuit 114, inverter 122 and inverter 124.

In comparison with integrated circuit 1100 of FIG. 11, integrated circuit 1300 of FIG. 13 does not include inverter 1018 and inverter 402 of FIG. 11, and similar detailed description is therefore omitted.

In some embodiments, by not including inverter 402 in FIG. 13, the output terminal of NAND circuit 1004 is directly coupled to the input terminal of the stacked gate circuit 108. In at least FIG. 13, each of the drain terminal of transistor T27, the drain terminal of transistor T28, the drain terminal of transistor T30, the gate terminal of transistor T12, the gate terminal of transistor T13, the gate terminal of transistor T23, and the gate terminal of transistor T26 are coupled together. In at least FIG. 13, signal ml_b is the signal of at least the drain terminal of transistor T27, the drain terminal of transistor T28, the drain terminal of transistor T30, the gate terminal of transistor T12, the gate terminal of transistor T13, gate terminal of transistor T23 or the gate terminal of transistor T26.

In some embodiments, by not including inverter 1018 in FIG. 13, the first set of input terminals of NOR circuit 1010 is configured to receive signal SDN instead of signal sdnb as received by the first set of input terminals of NAND circuit 1018 as shown in FIG. 11, and similar detailed description is therefore omitted.

In comparison with integrated circuit 1100 of FIG. 11, each of the gate terminal of transistor T15 and the gate terminal of transistor T18 of integrated circuit 1300 is configured to receive signal SDN.

In comparison with integrated circuit 1100 of FIG. 11, signal QN in FIG. 13 replaces the signal Q of FIG. 11, and similar detailed description is therefore omitted.

In some embodiments, in at least FIG. 13, at least one of stacked gate circuit 108, NOR circuit 1010 or reversed tri-state gate circuit 112 has a corresponding active region with the number of fins NF1*a* (shown in FIG. 2).

In some embodiments, in at least FIG. 13, at least one of NAND circuit 1004, circuit 502, circuit 102*b*, reversed tri-state gate circuit 106, output circuit 114, inverter 122 or inverter 124 has a corresponding active region with the number of fins NF2*a* (shown in FIG. 2).

In some embodiments, integrated circuit 1300 achieves one or more of the benefits discussed herein. Other configurations, arrangements or other circuits in integrated circuit 1300 are within the scope of the present disclosure.

FIG. 14 is a circuit diagram of an integrated circuit 1400, in accordance with some embodiments.

Integrated circuit 1400 is a variation of integrated circuit 1000 (FIG. 10), and similar detailed description is therefore omitted. For example, integrated circuit 1400 is a non-scan flip-flop circuit, and is triggered by a falling edge of at least a clock signal CPN similar to integrated circuit 1100 (FIG. 11), and similar detailed description is therefore omitted.

Integrated circuit 1400 includes circuit 502, circuit 102*b*, NAND circuit 1004, reversed tri-state gate circuit 106, stacked gate circuit 108, NOR circuit 1010, reversed tri-state gate circuit 112, output circuit 114, inverter 1018, inverter 122 and inverter 124.

In comparison with integrated circuit 1000 of FIG. 10, integrated circuit 1400 of FIG. 14 is triggered by a falling edge of at least a clock signal CPN similar to integrated circuit 1100 (FIG. 11), and similar detailed description is therefore omitted.

For example, in FIG. 14, at least one of the gate terminal of transistor T9, the gate terminal of transistor T14, the gate terminal of transistor T25, or the gate terminal of transistor T19 is configured to receive the clock signal clkb from inverter 122. For example, in FIG. 14, at least one of the gate terminal of transistor T10, the gate terminal of transistor T11, the gate terminal of transistor T24, or the gate terminal of transistor T22 is configured to receive the clock signal clkbb from inverter 124.

In some embodiments, in at least FIG. 14, at least one of stacked gate circuit 108, NOR circuit 1010 or reversed tri-state gate circuit 112 has a corresponding active region with the number of fins NF1*a* (shown in FIG. 2).

In some embodiments, in at least FIG. 14, at least one of NAND circuit 1004, circuit 502, circuit 102*b*, reversed tri-state gate circuit 106, output circuit 114, inverter 1018, inverter 122 or inverter 124 has a corresponding active region with the number of fins NF2*a* (shown in FIG. 2).

In some embodiments, integrated circuit 1400 achieves one or more of the benefits discussed herein. Other configurations, arrangements or other circuits in integrated circuit 1400 are within the scope of the present disclosure.

FIG. 15 is a circuit diagram of an integrated circuit 1500, in accordance with some embodiments.

Integrated circuit 1500 is a variation of integrated circuit 1200 (FIG. 12), and similar detailed description is therefore omitted. For example, integrated circuit 1500 is a non-scan flip-flop circuit, and is triggered by a rising edge of at least a clock signal CPN similar to integrated circuit 1000 (FIG. 10), and similar detailed description is therefore omitted.

Integrated circuit 1500 includes circuit 502, circuit 102*b*, NAND circuit 1004, reversed tri-state gate circuit 106, stacked gate circuit 108, NOR circuit 1010, reversed tri-state gate circuit 112, output circuit 114, inverter 1018, inverter 122 and inverter 124.

In comparison with integrated circuit 1200 of FIG. 12, integrated circuit 1500 of FIG. 15 is triggered by a rising edge of at least a clock signal CPN similar to integrated circuit 1000 (FIG. 10), and similar detailed description is therefore omitted. For example, in FIG. 15, at least one of the gate terminal of transistor T9, the gate terminal of transistor T14, the gate terminal of transistor T25, or the gate terminal of transistor T19 is configured to receive the clock signal clkbb from inverter 124. For example, in FIG. 15, at least one of the gate terminal of transistor T10, the gate terminal of transistor T11, the gate terminal of transistor T24, or the gate terminal of transistor T22 is configured to receive the clock signal clkb from inverter 122.

In some embodiments, in at least FIG. 15, at least one of inverter 402, stacked gate circuit 108, NOR circuit 1010 or reversed tri-state gate circuit 112 has a corresponding active region with the number of fins NF1*a* (shown in FIG. 2).

In some embodiments, in at least FIG. 15, at least one of NAND circuit 1004, circuit 502, circuit 102*b*, reversed tri-state gate circuit 106, output circuit 114, inverter 1018, inverter 122 or inverter 124 has a corresponding active region with the number of fins NF2*a* (shown in FIG. 2).

In some embodiments, integrated circuit 1500 achieves one or more of the benefits discussed herein. Other configurations, arrangements or other circuits in integrated circuit 1500 are within the scope of the present disclosure.

FIG. 16 is a circuit diagram of an integrated circuit 1600, in accordance with some embodiments.

In some embodiments, integrated circuit 1600 is a non-scan flip-flop circuit. In some embodiments, at least one of integrated circuit 1600 or 1900 (FIG. 19) is a D-flip-flop circuit with an asynchronous set and an asynchronous reset. In some embodiments, the integrated circuit 1600 is triggered by a rising edge of at least a clock signal CP.

Integrated circuit 1600 is a variation of integrated circuit 1000 (FIG. 10), and similar detailed description is therefore omitted. For example, integrated circuit 1600 is a non-scan D-type flip-flop circuit with an asynchronous set/reset, and is triggered by a rising edge of at least a clock signal CP, and similar detailed description is therefore omitted.

Integrated circuit 1600 includes circuit 502, circuit 102*b*, a circuit 1604, reversed tri-state gate circuit 106, stacked gate circuit 108, a circuit 1610, reversed tri-state gate circuit 112, output circuit 114, inverter 1018, inverter 118, inverter 122 and inverter 124.

In comparison with integrated circuit 1000 of FIG. 10, integrated circuit 1600 further includes inverter 118 of FIG. 1, and similar detailed description is therefore omitted.

In comparison with integrated circuit 1000 of FIG. 10, circuit 1604 of integrated circuit 1600 replaces the NAND circuit 1004 of FIG. 10, circuit 1610 of integrated circuit 1600 replaces the NOR circuit 110 of FIG. 10, and similar detailed description is therefore omitted.

Circuit 1604 includes transistors T47-T52. In some embodiments, each of transistors T47, T48 and T49 is a PMOS transistor. In some embodiments, each of transistors T50, T51 and T52 is an NMOS transistor.

A source terminal of transistor T47 is coupled to the voltage supply VDD. A source terminal of transistor T48 is coupled to the voltage supply VDD.

Each of the gate terminal of transistor T48 and the gate terminal of transistor T51 is configured to receive signal SDN. In some embodiments, each of the gate terminal of transistor T48 and the gate terminal of transistor T51 are coupled together.

Each of the gate terminal of transistor T47 and the gate terminal of transistor T50 is configured to receive signal ml_ax.

Each of a gate terminal of transistor T49 and a gate terminal of transistor T52 is configured to receive signal CD. In some embodiments, each of the gate terminal of transistor T49 and the gate terminal of transistor T52 are coupled together.

Each of the drain terminal of transistor T9, the drain terminal of transistor T10, the drain terminal of transistor T12, the drain terminal of transistor T13, a gate terminal of transistor T47, a gate terminal of transistor T50, the gate terminal of transistor T23 and the gate terminal of transistor T26 are coupled together. Signal ml_ax is the signal of at least the drain terminal of transistor T9, the drain terminal of transistor T10, the drain terminal of transistor T12, the drain terminal of transistor T13, the gate terminal of transistor T47, the gate terminal of transistor T50, the gate terminal of transistor T23 or the gate terminal of transistor T26.

Each of a drain terminal of transistor T47, a drain terminal of transistor T48, and a source terminal of transistor T49 are coupled together.

Each of a drain terminal of transistor T49, a drain terminal of transistor T50, a drain terminal of transistor T52, the gate terminal of transistor T12 and the gate terminal of transistor T13 are coupled together. In at least FIG. 16, signal ml_b is the signal of at least the drain terminal of transistor T49, the drain terminal of transistor T50, the drain terminal of transistor T52, the gate terminal of transistor T12 and the gate terminal of transistor T13.

A source terminal of transistor T50 is coupled to a drain terminal of transistor T51. A source terminal of transistor T51 is coupled to the reference voltage supply VSS. A source terminal of transistor T52 is coupled to the reference voltage supply VSS.

Circuit 1610 includes transistors T53-T58. In some embodiments, each of transistors T53, T54 and T55 is a PMOS transistor. In some embodiments, each of transistors T56, T57 and T58 is an NMOS transistor.

Each of a gate terminal of transistor T54 and a gate terminal of transistor T58 is configured to receive signal sdnb. In some embodiments, each of the gate terminal of transistor T54, the gate terminal of transistor T58 and the output terminal of inverter 1018 are coupled together.

A source terminal of transistor T55 is coupled to the voltage supply VDD. A source terminal of transistor T53 is coupled to the voltage supply VDD. A drain terminal of transistor T53 is coupled to a source terminal of transistor T54.

Each of a drain terminal of transistor T54, a drain terminal of transistor T55, a drain terminal of transistor T56, the gate terminal of transistor T20, the gate terminal of transistor T21, the gate terminal of transistor T31 and the gate terminal of transistor T32 are coupled together. In at least circuit 1610 of FIG. 16, signal sl_bx is the signal of at least the drain terminal of transistor T54, the drain terminal of transistor T55, the drain terminal of transistor T56, the gate terminal of transistor T20, the gate terminal of transistor T21, the gate terminal of transistor T31 or the gate terminal of transistor T32.

Each of a gate terminal of transistor T53 and a gate terminal of transistor T57 is configured to receive signal sl_a.

Each of a gate terminal of transistor T55 and a gate terminal of transistor T56 is configured to receive signal cdb. In some embodiments, each of the gate terminal of transistor T55, the gate terminal of transistor T56 and the output terminal of inverter 118 are coupled together.

Each of the drain terminal of transistor T24, the drain terminal of transistor T25, the drain terminal of transistor T20, the drain terminal of transistor T21, the gate terminal of transistor T53 and the gate terminal of transistor T57 are coupled together. In at least circuit 1610 of FIG. 16, signal sl_a is the signal of at least the drain terminal of transistor T24, the drain terminal of transistor T25, the drain terminal of transistor T20, the drain terminal of transistor T21, the gate terminal of transistor T53 or the gate terminal of transistor T57.

Each of a source terminal of transistor T56, a drain terminal of transistor T57 and a drain terminal of transistor T58 are coupled together.

A source terminal of transistor T57 is coupled to the reference voltage supply VSS. A source terminal of transistor T58 is coupled to the reference voltage supply VSS.

In some embodiments, in at least FIG. 16, at least one of stacked gate circuit 108, circuit 1610 or reversed tri-state gate circuit 112 has a corresponding active region with the number of fins NF1*a* (shown in FIG. 2).

In some embodiments, in at least FIG. 16, at least one of circuit 1604, circuit 502, circuit 102*b*, reversed tri-state gate circuit 106, output circuit 114, inverter 1018, inverter 118, inverter 122 or inverter 124 has a corresponding active region with the number of fins NF2*a* (shown in FIG. 2).

In some embodiments, integrated circuit 1600 achieves one or more of the benefits discussed herein. Other configurations, arrangements or other circuits in integrated circuit 1600 are within the scope of the present disclosure.

FIG. 17 is a circuit diagram of an integrated circuit 1700, in accordance with some embodiments.

In some embodiments, integrated circuit 1700 is a scan flip-flop circuit.

Integrated circuit 1700 is a variation of integrated circuit 1400 (FIG. 14), and similar detailed description is therefore omitted. For example, integrated circuit 1700 is a scan flip-flop circuit, and is triggered by a falling edge of at least a clock signal CPN similar to integrated circuit 1100 (FIG. 11), and similar detailed description is therefore omitted.

Integrated circuit 1700 includes circuit 102*a*, circuit 102*b*, NAND circuit 1004, reversed tri-state gate circuit 106, stacked gate circuit 108, NOR circuit 1010, reversed tri-state gate circuit 112, output circuit 114, inverter 1018, inverter 120, inverter 122 and inverter 124.

In comparison with integrated circuit 1400 of FIG. 14, circuit 102*a* of integrated circuit 1700 of FIG. 17 replaces circuit 502 of FIG. 14, and similar detailed description is therefore omitted.

In comparison with integrated circuit 1400 of FIG. 14, integrated circuit 1700 of FIG. 17 further includes inverter 120, and similar detailed description is therefore omitted.

At least one of circuit 102*a* or inverter 120 is described in FIG. 1, and similar detailed description is therefore omitted for brevity.

In some embodiments, in at least FIG. 17, at least one of stacked gate circuit 108, NOR circuit 1010 or reversed tri-state gate circuit 112 has a corresponding active region with the number of fins NF1*a* (shown in FIG. 2).

In some embodiments, in at least FIG. 17, at least one of NAND circuit 1004, circuit 102*a*, circuit 102*b*, reversed tri-state gate circuit 106, output circuit 114, inverter 1018, inverter 120, inverter 122 or inverter 124 has a corresponding active region with the number of fins NF2*a* (shown in FIG. 2).

In some embodiments, integrated circuit 1700 achieves one or more of the benefits discussed herein. Other configurations, arrangements or other circuits in integrated circuit 1700 are within the scope of the present disclosure.

FIG. 18 is a circuit diagram of an integrated circuit 1800, in accordance with some embodiments.

In some embodiments, integrated circuit 1800 is a scan flip-flop circuit.

Integrated circuit 1800 is a variation of integrated circuit 1200 (FIG. 12), and similar detailed description is therefore omitted. For example, integrated circuit 1800 is a scan flip-flop circuit, and is triggered by a falling edge of at least a clock signal CPN similar to integrated circuit 1100 (FIG. 11), and similar detailed description is therefore omitted.

Integrated circuit 1800 includes inverter 402, circuit 102*a*, circuit 102*b*, NAND circuit 1004, reversed tri-state gate circuit 106, stacked gate circuit 108, NOR circuit 1010, reversed tri-state gate circuit 112, output circuit 114, inverter 1018, inverter 120, inverter 122 and inverter 124.

In comparison with integrated circuit 1200 of FIG. 12, circuit 102*a* of integrated circuit 1800 of FIG. 18 replaces circuit 502 of FIG. 12, and similar detailed description is therefore omitted.

In comparison with integrated circuit 1200 of FIG. 12, integrated circuit 1800 of FIG. 18 further includes inverter 120, and similar detailed description is therefore omitted.

At least one of circuit 102*a* or inverter 120 is described in FIG. 1, and similar detailed description is therefore omitted for brevity.

In some embodiments, in at least FIG. 18, at least one of NAND circuit 1004, inverter 402, stacked gate circuit 108, NOR circuit 1010 or reversed tri-state gate circuit 112 has a corresponding active region with the number of fins NF1*a* (shown in FIG. 2).

In some embodiments, in at least FIG. 18, at least one of circuit 102*a*, circuit 102*b*, reversed tri-state gate circuit 106, output circuit 114, inverter 1018, inverter 120, inverter 122 or inverter 124 has a corresponding active region with the number of fins NF2*a* (shown in FIG. 2).

In some embodiments, integrated circuit 1800 achieves one or more of the benefits discussed herein. Other configurations, arrangements or other circuits in integrated circuit 1800 are within the scope of the present disclosure.

FIG. 19 is a circuit diagram of an integrated circuit 1900, in accordance with some embodiments.

In some embodiments, integrated circuit 1900 is a scan flip-flop circuit.

Integrated circuit 1900 is a variation of integrated circuit 1600 (FIG. 16), and similar detailed description is therefore omitted. Integrated circuit 1900 is a scan D-type flip-flop circuit with an asynchronous set/reset, and is triggered by a falling edge of at least a clock signal CPN, and similar detailed description is therefore omitted.

Integrated circuit 1900 includes circuit 102*a*, circuit 102*b*, circuit 1604, reversed tri-state gate circuit 106, stacked gate circuit 108, circuit 1610, reversed tri-state gate circuit 112, output circuit 114, inverter 1018, inverter 118, inverter 120, inverter 122 and inverter 124.

In comparison with integrated circuit 1600 of FIG. 16, circuit 102*a* of integrated circuit 1900 of FIG. 19 replaces circuit 502 of FIG. 16, and similar detailed description is therefore omitted.

In comparison with integrated circuit 1600 of FIG. 16, integrated circuit 1900 of FIG. 19 further includes inverter 120, and similar detailed description is therefore omitted.

At least one of circuit 102*a* or inverter 120 is described in FIG. 1, and similar detailed description is therefore omitted for brevity.

In comparison with integrated circuit 1600 of FIG. 16, integrated circuit 1900 of FIG. 19 is triggered by a falling edge of at least the clock signal CPN similar to integrated circuit 1100 (FIG. 11), and similar detailed description is therefore omitted. For example, in FIG. 19, at least one of the gate terminal of transistor T9, the gate terminal of transistor T14, the gate terminal of transistor T25, or the gate terminal of transistor T19 is configured to receive the clock signal clkb from inverter 122. For example, in FIG. 19, at least one of the gate terminal of transistor T10, the gate terminal of transistor T11, the gate terminal of transistor T24, or the gate terminal of transistor T22 is configured to receive the clock signal clkbb from inverter 124.

In some embodiments, in at least FIG. 19, at least one of circuit 1604, stacked gate circuit 108, circuit 1610 or reversed tri-state gate circuit 112 has a corresponding active region with the number of fins NF1*a* (shown in FIG. 2).

In some embodiments, in at least FIG. 19, at least one of circuit 102*a*, circuit 102*b*, reversed tri-state gate circuit 106, output circuit 114, inverter 1018, inverter 118, inverter 120, inverter 122 or inverter 124 has a corresponding active region with the number of fins NF2*a* (shown in FIG. 2).

In some embodiments, integrated circuit 1900 achieves one or more of the benefits discussed herein. Other configurations, arrangements or other circuits in integrated circuit 1900 are within the scope of the present disclosure.

FIG. 20 is a circuit diagram of an integrated circuit 2000, in accordance with some embodiments.

In some embodiments, integrated circuit 2000 is a scan flip-flop circuit.

Integrated circuit 2000 is a variation of integrated circuit 1000 (FIG. 10), and similar detailed description is therefore omitted. For example, integrated circuit 2000 is a scan flip-flop circuit, and is triggered by a rising edge of at least a clock signal CP similar to integrated circuit 1000 (FIG. 10), and similar detailed description is therefore omitted.

Integrated circuit 2000 includes circuit 102*a*, circuit 102*b*, NAND circuit 1004, reversed tri-state gate circuit 106, stacked gate circuit 108, NOR circuit 1010, reversed tri-state gate circuit 112, output circuit 114, inverter 1018, inverter 120, inverter 122 and inverter 124.

In comparison with integrated circuit 1000 of FIG. 10, circuit 102*a* of integrated circuit 2000 of FIG. 20 replaces circuit 502 of FIG. 10, and similar detailed description is therefore omitted.

In comparison with integrated circuit 1000 of FIG. 10, integrated circuit 2000 of FIG. 20 further includes inverter 120, and similar detailed description is therefore omitted.

At least one of circuit 102*a* or inverter 120 is described in FIG. 1, and similar detailed description is therefore omitted for brevity.

In some embodiments, in at least FIG. 20, at least one of NAND circuit 1004, stacked gate circuit 108, NOR circuit 1010 or reversed tri-state gate circuit 112 has a corresponding active region with the number of fins NF1*a* (shown in FIG. 2).

In some embodiments, in at least FIG. 20, at least one of circuit 102*a*, circuit 102*b*, reversed tri-state gate circuit 106, output circuit 114, inverter 1018, inverter 120, inverter 122 or inverter 124 has a corresponding active region with the number of fins NF2*a* (shown in FIG. 2).

In some embodiments, integrated circuit 2000 achieves one or more of the benefits discussed herein.

Other configurations, arrangements or other circuits in integrated circuit 2000 are within the scope of the present disclosure.

FIGS. 21A-21C are a diagram of an integrated circuit 2100, in accordance with some embodiments. In some embodiments, integrated circuit 2100 is a flip-flop circuit. In some embodiments, integrated circuit 2100 is a multi-bit flip-flop (MBFF) circuit.

In some embodiments, integrated circuit 2100 is a scan flip-flop circuit. In some embodiments, at least one of integrated circuit 2100 is a D-flip-flop circuit with an asynchronous reset. In some embodiments, the integrated circuit 2100 is triggered by a rising edge of at least a clock signal CP.

FIG. 21A is a block diagram of an integrated circuit 2100, in accordance with some embodiments. FIG. 21B is a circuit diagram of a portion 2100A of integrated circuit 2100, in accordance with some embodiments. FIG. 21C is a circuit diagram of a portion 2100B of integrated circuit 2100, in accordance with some embodiments.

Portion 2100A is an embodiment of a scan circuit 2110, a latch circuit 2112, a stacked gate circuit 2114, a latch circuit 2116 and an output circuit 2118 of integrated circuit 2100 of FIG. 21A, and similar detailed description is omitted.

Portion 2100B is an embodiment of a clock buffer 2102, a buffer 2103, and an inverter 2106 of integrated circuit 2100 of FIG. 21A, and similar detailed description is omitted.

Integrated circuit 2100 is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 2100 includes a clock buffer 2102, a buffer 2103, an inverter 2106, a scan circuit 2110, a latch circuit 2112, a stacked gate circuit 2114, a latch circuit 2116 and an output circuit 2118.

In some embodiments, integrated circuit 2100 is a dual interlocked cell (DICE) where integrated circuit 2100 is configured to provide reliability over other approaches by having a left path (e.g., first portions of at least one of scan circuit 2111, clock buffer 2102, buffer 2103, latch circuit 2112 or latch circuit 2116) and a right path (e.g., first portions of at least one of scan circuit 2111, clock buffer 2102, latch circuit 2112 or latch circuit 2116) that are interlocked with each other, and by separating sensitive nodes from each other by corresponding distances (not shown).

In some embodiments, the first portions of at least one of scan circuit 2111, clock buffer 2102, latch circuit 2112 or latch circuit 2116 include portions where a signal includes clock signal clkb1, clkbb1, signal cdb1 or signal CD. In some embodiments, the second portions of at least one of scan circuit 2111, clock buffer 2102, latch circuit 2112 or latch circuit 2116 include portions where a signal includes clock signal clkb2, clkbb2, signal cdb2 or signal CD.

In some embodiments, nodes of the same name are coupled together, but are not shown for ease of illustration.

An input terminal of clock buffer 2102 is configured to receive clock signal CP on a node CP'. In the present disclosure, signals of a corresponding node are denoted with a common symbol as the corresponding node, except the nodes further include an apostrophe (e.g., ') symbol. For example, the clock signal CP corresponds to the signal of node CP'.

An output terminal of clock buffer 2102 is configured to output a clock signal clkb1, a clock signal clkbb1, a clock signal clkb2 and a clock signal clkbb2. In some embodiments, clock signal clkb1 is inverted from clock signal CP, and vice versa. In some embodiments, clock signal clkbb1 is inverted from clock signal clkb1, and vice versa. In some embodiments, clock signal clkb2 is inverted from clock signal CP, and vice versa. In some embodiments, clock signal clkbb2 is inverted from clock signal clkb2, and vice versa. In some embodiments, signal CD is inverted from signal cdb1, and vice versa. In some embodiments, signal CD is inverted from signal cdb2, and vice versa.

Clock buffer 2102 includes an inverter 2102*a* coupled to an inverter 2104*a*. Clock buffer 2102 further includes an inverter 2102*b* coupled to an inverter 2104*b*.

An input terminal of inverter 2102*a* is configured to receive clock signal CP on node CP'. In some embodiments, the node CP' corresponds to at least the input terminal of inverter 2102*a*.

An output terminal of inverter 2102*a* is configured to output a clock signal clkb1 to at least an input terminal of inverter 2104*a*.

The input terminal of inverter 2104*a* is coupled to at least the output terminal of inverter 2102*a*, and is configured to receive clock signal clkb1. In some embodiments, the node clkb1' corresponds to at least one of the output terminal of inverter 2102*a*, the input terminal of inverter 2104*a*, a first clock input terminal of scan circuit 2106, a first clock input terminal of latch circuit 2112, a first clock input terminal of stacked gate circuit 2114, or a first clock input terminal of latch circuit 2116.

An output terminal of inverter 2104*a* is configured to output the clock signal clkbb1. In some embodiments, the node clkbb1' corresponds to at least one of the output terminal of inverter 2104*a*, a second clock input terminal of scan circuit 2106, a second clock input terminal of latch circuit 2112, a second clock input terminal of stacked gate circuit 2114, or a second clock input terminal of latch circuit 2116.

An input terminal of inverter 2102*b* is configured to receive clock signal CP on node CP'. In some embodiments, the node CP' corresponds to at least the input terminal of inverter 2102*b*.

An output terminal of inverter 2102*b* is configured to output a clock signal clkb2 to at least an input terminal of inverter 2104*b*.

The input terminal of inverter 2104*b* is coupled to at least the output terminal of inverter 2102*b*, and is configured to receive clock signal clkb2. In some embodiments, the node clkb2' corresponds to at least one of the output terminal of inverter 2102*b*, the input terminal of inverter 2104*b*, a third clock input terminal of scan circuit 2106, a third clock input terminal of latch circuit 2112, a third clock input terminal of stacked gate circuit 2114, or a third clock input terminal of latch circuit 2116.

An output terminal of inverter 2104*b* is configured to output the clock signal clkbb2. In some embodiments, the node clkbb2' corresponds to at least one of the output terminal of inverter 2104*b*, a fourth clock input terminal of scan circuit 2106, a fourth clock input terminal of latch circuit 2112, a fourth clock input terminal of stacked gate circuit 2114, or a fourth clock input terminal of latch circuit 2116.

Buffer 2103 includes an inverter 2103*a* and an inverter 2103*b*.

An input terminal of buffer 2103 is configured to receive the signal CD.

An input terminal of inverter 2103*a* is configured to receive signal CD on node CD'. In some embodiments, the node CD' corresponds to at least the input terminal of inverter 2103*a*.

An output terminal of inverter 2103*a* is configured to output a signal cdb1 to at least a first buffer input terminal of latch circuit 2112. In some embodiments, the node cdb1' corresponds to at least one of the output terminal of inverter 2103*a* or the first buffer input terminal of latch circuit 2112.

An input terminal of inverter 2103*b* is configured to receive signal CD on node CD'. In some embodiments, the node CD' corresponds to at least the input terminal of inverter 2103*b*.

An output terminal of inverter 2103*b* is configured to output a signal cdb2 to at least a second buffer input terminal of latch circuit 2112. In some embodiments, the node cdb2' corresponds to at least one of the output terminal of inverter 2103*b* or the second buffer input terminal of latch circuit 2112.

An input terminal of inverter 2106 is configured to receive the scan enable signal SE. In some embodiments, the input terminal of inverter 2106 is coupled to a third input terminal (described below) of multiplexer 2108. An output terminal of inverter 2106 is configured to output the inverted scan enable signal SEB. In some embodiments, the output terminal of inverter 2106 is coupled to a fourth input terminal of multiplexer 2108.

In some embodiments, the node SEB' corresponds to at least one of the output terminal of inverter 2106 and a fourth input terminal of multiplexer 2108.

In some embodiments, the node SE' corresponds to at least one of the input terminal of inverter 2106 and a third input terminal of multiplexer 2108.

Scan circuit 2110 includes multiplexer 2108 coupled to a stacked gate circuit 2111. Multiplexer 2108 includes a first input terminal (e.g., node D) configured to receive the data signal D, a second input terminal (e.g., node SI') configured to receive the scan in signal SI, a third input terminal (e.g., node SE') configured to receive a scan enable signal SE, and a fourth input terminal (e.g., node SEB') configured to receive an inverted scan enable signal SEB. Multiplexer 2108 includes transistors U1-U8 (described below).

In some embodiments, a node D corresponds to at least a first input terminal of multiplexer 2108 and a node SI' corresponds to at least a second input terminal of multiplexer 2108.

In some embodiments, the scan enable signal SE is a selection signal of multiplexer 2108, and the inverted scan enable signal SEB is an inverted selection signal of multiplexer 2108. An output terminal of multiplexer 2108 is coupled to an input terminal of stacked gate circuit 2111. Multiplexer 2108 is configured to output a signal mx1 to stacked gate circuit 2111 on corresponding node mx1'. In some embodiments, multiplexer 2108 is coupled to inverter 2106, and is configured to receive inverted scan enable signal SEB.

Stacked gate circuit 2111 is coupled to clock buffer 2102, multiplexer 2108, latch circuit 2112, and stacked gate circuit 2114.

A first input terminal of stacked gate circuit 2111 is coupled to and configured to receive signal mx1 from multiplexer 2108 on node mx1'.

A first output terminal of stacked gate circuit 2111 is coupled to a first input terminal of latch circuit 2112 and a first input terminal of stacked gate circuit 2114 by node ml1_*a*'. The first output terminal of stacked gate circuit 2111 is configured to output a signal ml1_*a* to the first input terminal of latch circuit 2112 and the first input terminal of stacked gate circuit 2114 by node ml1_*a'*.

A second output terminal of stacked gate circuit 2111 is coupled to a second input terminal of latch circuit 2112 and a second input terminal of stacked gate circuit 2114 by node ml2_*a*'. The second output terminal of stacked gate circuit 2111 is configured to output a signal ml2_*a* to the second input terminal of latch circuit 2112 and the second input terminal of stacked gate circuit 2114 by node ml2_*a'*.

In some embodiments, the node ml1_*a*' corresponds to at least one of the first output terminal of stacked gate circuit 2111, the first input terminal of latch circuit 2112 or the first input terminal of stacked gate circuit 2114.

In some embodiments, the node ml2_*a*' corresponds to at least one of the second output terminal of stacked gate circuit 2111, the second input terminal of latch circuit 2112 or the second input terminal of stacked gate circuit 2114.

Latch circuit 2112 is coupled to clock buffer 2102, buffer 2103 and stacked gate circuit 2111.

A first input terminal of latch circuit 2112 is coupled to and configured to receive signal ml1_*a* from stacked gate circuit 2111 on node ml1_*a'*.

A second input terminal of latch circuit 2112 is coupled to and configured to receive signal ml2_*a* from stacked gate circuit 2111 on node ml2_*a'*.

A first buffer input terminal of latch circuit 2112 is coupled to and configured to receive signal cdb1 from buffer 2103 on node cdb1'.

A second buffer input terminal of latch circuit 2112 is coupled to and configured to receive signal cdb2 from buffer 2103 on node cdb2'.

Stacked gate circuit 2114 is coupled to clock buffer 2102, stacked gate circuit 2111, latch circuit 2116, and output circuit 2118. In some embodiments, stacked gate circuit 2114 is further coupled to latch circuit 2112.

Stacked gate circuit 2114 includes stacked gate circuits 2114*a* and 2114*b*.

A first input terminal of stacked gate circuit 2114 is coupled to and configured to receive signal ml1_*a* from stacked gate circuit 2111 on node ml1_*a'*.

A second input terminal of stacked gate circuit 2114 is coupled to and configured to receive signal ml2_*a* from stacked gate circuit 2111 on node ml2_*a'*.

A first output terminal of stacked gate circuit 2114 is coupled to a first input terminal of latch circuit 2116 and a first input terminal of output circuit 2118 by node sl1_*ax*'. The first output terminal of stacked gate circuit 2114 is configured to output a signal sl1_*ax* to the first input terminal of latch circuit 2116 and the first input terminal of output circuit 2118 by node sl1_*ax'*.

A second output terminal of stacked gate circuit 2114 is coupled to a second input terminal of latch circuit 2116 and a second input terminal of output circuit 2118 by node sl2_*ax*'. The second output terminal of stacked gate circuit 2114 is configured to output a signal sl2_*ax* to the second input terminal of latch circuit 2116 and the second input terminal of output circuit 2118 by node sl2_*ax'*.

In some embodiments, the node sl1_*ax*' corresponds to at least one of the first output terminal of stacked gate circuit 2114, the first input terminal of latch circuit 2116 or the first input terminal of output circuit 2118.

In some embodiments, the node sl2_*ax*' corresponds to at least one of the second output terminal of stacked gate circuit 2114, the second input terminal of latch circuit 2116 and the second input terminal of output circuit 2118.

Latch circuit 2116 is coupled to clock buffer 2102 and stacked gate circuit 2114.

A first input terminal of latch circuit 2116 is coupled to and configured to receive signal sl1_*ax* from stacked gate circuit 2111 on node sl1_*ax'*.

A second input terminal of latch circuit 2116 is coupled to and configured to receive signal sl2_*ax* from stacked gate circuit 2111 on node sl2_*ax'*.

A third buffer input terminal of latch circuit 2116 is coupled to and configured to receive signal CD on node CD.

Output circuit 2118 is coupled to clock buffer 2102 and stacked gate circuit 2114.

A first input terminal of output circuit 2118 is coupled to and configured to receive signal sl1_*ax* from stacked gate circuit 2111 on node sl1_*ax'*.

A second input terminal of output circuit 2118 is coupled to and configured to receive signal sl2_*ax* from stacked gate circuit 2111 on node sl2_*ax'*.

An output terminal of output circuit 2118 is configured to output the output signal Q on node Q'.

Multiplexer 2108 includes transistors U1-U8. In some embodiments, each of transistors U1, U2, U3 and U4 is a PMOS transistor. In some embodiments, each of transistors U5, U6, U7 and U8 is an NMOS transistor.

A gate terminal of transistor U1 is configured to receive scan in signal SI. A gate terminal of transistor U6 is configured to receive scan in signal SI. In some embodiments, the gate terminal of transistor U1 is coupled to the gate terminal of transistor U6.

A gate terminal of transistor U2 is configured to receive inverted scan enable signal SEB. A source terminal of transistor U1 is coupled to the voltage supply VDD. A drain terminal of transistor U1 is coupled to a source terminal of transistor U2.

A gate terminal of transistor U3 is configured to receive scan enable signal SE. A source terminal of transistor U3 is coupled to the voltage supply VDD. A drain terminal of transistor U3 is coupled to a source terminal of transistor U4.

A gate terminal of transistor U4 is configured to receive data signal D. A gate terminal of transistor U7 is configured to receive data signal D. In some embodiments, the gate terminal of transistor U4 is coupled to the gate terminal of transistor U7.

A source terminal of transistor U6 is coupled to the reference voltage supply VSS. A drain terminal of transistor U6 is coupled to a source terminal of transistor U5. A gate terminal of transistor U5 is configured to receive scan enable signal SE. In some embodiments, the gate terminal of transistor U5 is coupled to the gate terminal of transistor U3.

A source terminal of transistor U8 is coupled to the reference voltage supply VSS. A drain terminal of transistor U8 is coupled to a source terminal of transistor U7. A gate terminal of transistor U8 is configured to receive inverted scan enable signal SEB. In some embodiments, the gate terminal of transistor U8 is coupled to the gate terminal of transistor U2.

Each of a gate terminal of transistor U9*a*, a gate terminal of transistor U12*a*, a gate terminal of transistor U9*b*, a gate terminal of transistor U12*b*, the drain terminal of transistor U2, the drain terminal of transistor U4, the drain terminal of transistor U5 and the drain terminal of transistor U7 are coupled together at node mx1'. Signal mx1 is the signal of at least one of the drain terminal of transistor U2, the drain terminal of transistor U4, the drain terminal of transistor U5 or the drain terminal of transistor U7.

Stacked gate circuit 2111 includes transistors U9*a*, U10*a*, Ulla, U12*a*, U9*b*, U10*b*, U11*b* and U12*b*. In some embodiments, each of transistors U9*a*, U10*a*, U9*b* and U10*b* is a PMOS transistor. In some embodiments, each of transistors U11*a*, U12*a*, U11*b* and U12*b* is an NMOS transistor.

Transistors U9*a*, U10*a*, U11*a* and U12*a* are configured as a stacked gate circuit configured to output signal ml1_*a*.

Transistors U9*b*, U10*b*, U11*b* and U12*b* are configured as a stacked gate circuit configured to output signal ml2_*a*.

Each of the gate terminal of transistor U9*a*, the gate terminal of transistor U12*a*, the gate terminal of transistor U9*b* and the gate terminal of transistor U12*b* is configured to receive signal mx1 at node mx1'.

A gate terminal of transistor U10*a* is configured to receive clock signal clkbb1 at node clkbb1'. The gate terminal of transistor U10*a* is coupled to a drain terminal of transistor U29*a* and a drain terminal of transistor U30*a* at node clkbb1'.

A gate terminal of transistor U11*a* is configured to receive clock signal clkb1 at node clkb1'. The gate terminal of transistor U11*a* is coupled to a drain terminal of transistor U27*a* and a drain terminal of transistor U28*a* at node clkb1'.

A source terminal of transistor U9*a* is coupled to the voltage supply VDD. A drain terminal of transistor U9*a* is coupled to a source terminal of transistor U10*a*.

Each of a drain terminal of transistor U10*a*, a drain terminal of transistor U11*a*, a gate terminal of transistor U13*a*1, a gate terminal of transistor U16*a*1, a drain terminal of transistor U18*a*, a drain terminal of transistor U19*a*, a gate terminal of transistor U21*a* and a gate terminal of transistor U24*a* are coupled together at node ml1_*a'*.

Signal ml1_*a* is the signal of at least the drain terminal of transistor U10*a*, the drain terminal of transistor U11*a*, the gate terminal of transistor U13*a*1, the gate terminal of transistor U16*a*1, the drain terminal of transistor U18*a*, the drain terminal of transistor U19*a*, the gate terminal of transistor U21*a* and the gate terminal of transistor U24*a*.

A source terminal of transistor U11*a* is coupled to a drain terminal of transistor U12*a*. A source terminal of transistor U12*a* is coupled to the reference voltage supply VSS.

A gate terminal of transistor U10*b* is configured to receive clock signal clkbb2 at node clkbb2'. The gate terminal of transistor U10*b* is coupled to a drain terminal of transistor U29*b* and a drain terminal of transistor U30*b* at node clkbb2'.

A gate terminal of transistor U11*b* is configured to receive clock signal clkb2 at node clkb2'. The gate terminal of transistor U11*b* is coupled to a drain terminal of transistor U27*b* and a drain terminal of transistor U28*b* at node clkb2'.

A source terminal of transistor U9*b* is coupled to the voltage supply VDD. A drain terminal of transistor U9*b* is coupled to a source terminal of transistor U10*b*.

Each of a drain terminal of transistor U10*b*, a drain terminal of transistor U11*b*, a gate terminal of transistor U14*a*1, a gate terminal of transistor U15*a*1, a drain terminal of transistor U18*b*, a drain terminal of transistor U19*b*, a gate terminal of transistor U21*b* and a gate terminal of transistor U24*b* are coupled together at node ml2_*a'*.

Signal ml2_*a* is the signal of at least the drain terminal of transistor U10*b*, the drain terminal of transistor U11*b*, the gate terminal of transistor U14*a*1, the gate terminal of transistor U15*a*1, the drain terminal of transistor U18*b*, the drain terminal of transistor U19*b*, the gate terminal of transistor U21*b* and the gate terminal of transistor U24*b*.

A source terminal of transistor U11*b* is coupled to a drain terminal of transistor U12*b*. A source terminal of transistor U12*b* is coupled to the reference voltage supply VSS.

Latch circuit 2112 includes transistors U13*a*1, U13*a*2, U14*a*1, U14*a*2, U15*a*1, U15*a*2, U16*a*1, U16*a*2, U17*a*, U18*a*, U19*a*, U20*a*, U17*b*, U18*b*, U19*b* and U20*b*. In some embodiments, each of transistors U13*a*1, U13*a*2, U15*a*1, U15*a*2, U17*a*, U18*a*, U17*b* and U18*b* is a PMOS transistor. In some embodiments, each of transistors U14*a*1, U14*a*2, U16*a*1, U16*a*2, U19*a*, U20*a*, U19*b* and U20*b* is an NMOS transistor.

Transistors U17*a*, U18*a*, U19*a* and U20*a* are configured as a stacked gate circuit configured to output signal ml1_*a*. Transistors U17*b*, U18*b*, U19*b* and U20*b* are configured as a stacked gate circuit configured to output signal ml2_*a*.

Each of the gate terminal of transistor U13*a*1 and the gate terminal of transistor U16*a*1 is configured to receive signal ml1_*a* at node ml1_*a*'. Each of the gate terminal of transistor U14*a*1 and the gate terminal of transistor U15*a*1 is configured to receive signal ml2_*a* at node ml2_*a'*.

Each of a gate terminal of transistor U13*a*2, a gate terminal of transistor U14*a*2, a drain terminal of transistor U45*a* and a drain terminal of transistor U46*a* are coupled together at node cdb1'. Each of the gate terminal of transistor U13*a*2 and the gate terminal of transistor U14*a*2 is configured to receive signal cdb1 at node cdb1'.

A source terminal of transistor U13*a*1 is coupled to the voltage supply VDD. A source terminal of transistor U13*a*2 is coupled to the voltage supply VDD.

A source terminal of transistor U14*a*1 is coupled to a drain terminal of transistor U14*a*2. A source terminal of transistor U14*a*2 is coupled to the reference voltage supply VSS.

A drain terminal of transistor U13*a*1, a drain terminal of transistor U13*a*2 and a drain terminal of transistor U14*a*1 are configured to output a signal ml1_*bx*' at node ml1_*bx*. Each of the drain terminal of transistor U13*a*1, the drain terminal of transistor U13*a*2, the drain terminal of transistor U14*a*1, a gate terminal of transistor U19*a*, a gate terminal of transistor U18*b* are coupled together at node ml1_*bx*.

The gate terminal of transistor U19a and the gate terminal of transistor U18b are configured to receive signal ml1_bx' at node ml1_bx.

Each of a gate terminal of transistor U15a2, a gate terminal of transistor U16a2, a drain terminal of transistor U45b and a drain terminal of transistor U46b are coupled together at node cdb2'. Each of the gate terminal of transistor U15a2 and the gate terminal of transistor U16a2 is configured to receive signal cdb2 at node cdb2'.

A source terminal of transistor U15a1 is coupled to the voltage supply VDD. A source terminal of transistor U15a2 is coupled to the voltage supply VDD.

A source terminal of transistor U16a1 is coupled to a drain terminal of transistor U16a2. A source terminal of transistor U16a2 is coupled to the reference voltage supply VSS.

Each of a drain terminal of transistor U15a1, a drain terminal of transistor U15a2 and a drain terminal of transistor U16a1 are configured to output a signal ml2_bx' at node ml2_bx. Each of the drain terminal of transistor U15a1, the drain terminal of transistor U15a2, the drain terminal of transistor U16a1, a gate terminal of transistor U19b, and a gate terminal of transistor U18a are coupled together at node ml2_bx.

The gate terminal of transistor U19b and the gate terminal of transistor U18a are configured to receive signal ml2_bx' at node ml2_bx.

A gate terminal of transistor U17a is configured to receive clock signal clkb1 at node clkb1'. The gate terminal of transistor U17a is coupled to a drain terminal of transistor U27a and a drain terminal of transistor U28a at node clkb1'.

A gate terminal of transistor U20a is configured to receive clock signal clkbb1 at node clkbb1'. The gate terminal of transistor U20a is coupled to a drain terminal of transistor U29a and a drain terminal of transistor U30a at node clkbb1'.

A source terminal of transistor U17a is coupled to the voltage supply VDD.

A drain terminal of transistor U17a is coupled to a source terminal of transistor U18a.

A source terminal of transistor U19a is coupled to a drain terminal of transistor U20a.

A source terminal of transistor U20a is coupled to the reference voltage supply VSS.

A gate terminal of transistor U17b is configured to receive clock signal clkb2 at node clkb2'. The gate terminal of transistor U17b is coupled to a drain terminal of transistor U27b and a drain terminal of transistor U28b at node clkb2'.

A gate terminal of transistor U20b is configured to receive clock signal clkbb2 at node clkbb2'. The gate terminal of transistor U20b is coupled to a drain terminal of transistor U29b and a drain terminal of transistor U30b at node clkbb2'.

A source terminal of transistor U17b is coupled to the voltage supply VDD.

A drain terminal of transistor U17b is coupled to a source terminal of transistor U18b.

A source terminal of transistor U19b is coupled to a drain terminal of transistor U20b. A source terminal of transistor U20b is coupled to the reference voltage supply VSS.

Stacked gate circuit 2114 includes stacked gate circuit 2114a and stacked gate circuit 2114b.

Stacked gate circuit 2114 includes transistors U21a, U22a, U23a, U24a, U21b, U22b, U23b and U24b. In some embodiments, each of transistors U21a, U22a, U21b and U22b is a PMOS transistor. In some embodiments, each of transistors U23a, U24a, U23b and U24b is an NMOS transistor.

Transistors U21a, U22a, U23a and U24a are configured as a stacked gate circuit 2114a configured to output signal sl1_ax. Transistors U21b, U22b, U23b and U24b are configured as a stacked gate circuit 2114b configured to output signal sl2_ax.

Each of the gate terminal of transistor U21a and the gate terminal of transistor U24a is configured to receive signal ml1_a at node ml1_a'. Each of the gate terminal of transistor U21b and the gate terminal of transistor U24b is configured to receive signal ml2_a at node ml2_a'.

A gate terminal of transistor U22a is configured to receive clock signal clkb1 at node clkb1'. The gate terminal of transistor U22a is coupled to a drain terminal of transistor U27a and a drain terminal of transistor U28a at node clkb1'.

A gate terminal of transistor U23a is configured to receive clock signal clkbb1 at node clkbb1'. The gate terminal of transistor U23a is coupled to a drain terminal of transistor U29a and a drain terminal of transistor U30a at node clkbb1'.

A source terminal of transistor U21a is coupled to the voltage supply VDD. A drain terminal of transistor U21a is coupled to a source terminal of transistor U22a.

Each of a drain terminal of transistor U22a, a drain terminal of transistor U23a, a gate terminal of transistor U31a1, a gate terminal of transistor U34a1, a drain terminal of transistor U36a, a drain terminal of transistor U37a, a gate terminal of transistor U40 and a gate terminal of transistor U41 are coupled together at node sl1_ax'.

Signal sl1_ax is the signal of at least the drain terminal of transistor U22a, the drain terminal of transistor U23a, the gate terminal of transistor U31a1, the gate terminal of transistor U34a1, the drain terminal of transistor U36a, the drain terminal of transistor U37a, the gate terminal of transistor U40 and the gate terminal of transistor U41.

A source terminal of transistor U23a is coupled to a drain terminal of transistor U24a. A source terminal of transistor U24a is coupled to the reference voltage supply VSS.

A gate terminal of transistor U22b is configured to receive clock signal clkb2 at node clkb2'. The gate terminal of transistor U22b is coupled to a drain terminal of transistor U27b and a drain terminal of transistor U28b at node clkb2'.

A gate terminal of transistor U23b is configured to receive clock signal clkbb2 at node clkbb2'. The gate terminal of transistor U23b is coupled to a drain terminal of transistor U29b and a drain terminal of transistor U30b at node clkbb2'.

A source terminal of transistor U21b is coupled to the voltage supply VDD. A drain terminal of transistor U21b is coupled to a source terminal of transistor U22b.

Each of a drain terminal of transistor U22b, a drain terminal of transistor U23b, a gate terminal of transistor U32a1, a gate terminal of transistor U33a1, a drain terminal of transistor U36b, a drain terminal of transistor U37b, a gate terminal of transistor U39 and a gate terminal of transistor U42 are coupled together at node sl2_ax'.

Signal sl2_ax is the signal of at least the drain terminal of transistor U22b, the drain terminal of transistor U23b, the gate terminal of transistor U32a1, the gate terminal of transistor U33a1, the drain terminal of transistor U36b, the drain terminal of transistor U37b, the gate terminal of transistor U39 and the gate terminal of transistor U42.

A source terminal of transistor U23b is coupled to a drain terminal of transistor U24b. A source terminal of transistor U24b is coupled to the reference voltage supply VSS.

Latch circuit 2116 includes transistors U31a1, U31a2, U32a1, U32a2, U33a1, U33a2, U34a1, U34a2, U35a, U36a, U37a, U38a, U35b, U36b, U37b and U38b. In some embodiments, each of transistors U31a1, U31a2, U33a1, U33a2, U35a, U36a, U35b and U36b is a PMOS transistor. In some embodiments, each of transistors U32a1, U32a2, U34a1, U34a2, U37a, U38a, U37b and U38b is an NMOS transistor.

Transistors U35a, U36a, U37a and U38a are configured as a stacked gate circuit configured to output signal sl1_ax. Transistors U35b, U36b, U37b and U38b are configured as a stacked gate circuit configured to output signal sl2_ax.

Each of the gate terminal of transistor U31a1 and the gate terminal of transistor U34a1 is configured to receive signal sl1_ax at node sl1_ax'. Each of the gate terminal of transistor U32a1 and the gate terminal of transistor U33a1 is configured to receive signal sl2_ax at node sl2_ax'.

Each of a gate terminal of transistor U31a2 and a gate terminal of transistor U32a2 are coupled together at node CD'. Each of the gate terminal of transistor U31a2 and the gate terminal of transistor U32a2 are configured to receive signal CD at node CD'.

A source terminal of transistor U31a2 is coupled to the voltage supply VDD.

A drain terminal of transistor U31a2 is coupled to a source terminal of transistor U31a1.

A source terminal of transistor U32a1 is coupled to the reference voltage supply VSS.

A source terminal of transistor U32a2 is coupled to the reference voltage supply VSS.

Each of a drain terminal of transistor U31a1, a drain terminal of transistor U32a1 and a drain terminal of transistor U32a2 are configured to output a signal sl1_b' at node sl1_b. Each of the drain terminal of transistor U31a1, the drain terminal of transistor U32a1, the drain terminal of transistor U32a2, a gate terminal of transistor U37a, a gate terminal of transistor U36b are coupled together at node sl1_b.

The gate terminal of transistor U37a and the gate terminal of transistor U36b are configured to receive signal sl1_b' at node sl1_b.

Each of a gate terminal of transistor U33a2 and a gate terminal of transistor U34a2 are coupled together at node CD'. Each of the gate terminal of transistor U33a2 and the gate terminal of transistor U34a2 are configured to receive signal CD at node CD'.

A source terminal of transistor U33a2 is coupled to the voltage supply VDD.

A source terminal of transistor U34a1 is coupled to the reference voltage supply VSS. A source terminal of transistor U34a2 is coupled to the reference voltage supply VSS.

A drain terminal of transistor U33a1 is coupled to a drain terminal of transistor U34a1.

Each of a drain terminal of transistor U33a2, a source terminal of transistor U33a1, and a source terminal of transistor U34a2 are configured to output a signal sl2_b at node sl2_b'.

Each of the drain terminal of transistor U33a2, the source terminal of transistor U33a1, the source terminal of transistor U34a2, a gate terminal of transistor U37b, a gate terminal of transistor U36a are coupled together at node sl2_b.

The gate terminal of transistor U37b and the gate terminal of transistor U36a are configured to receive signal sl2_b at node sl2_b'.

A gate terminal of transistor U35a is configured to receive clock signal clkbb1 at node clkbb1'. The gate terminal of transistor U35a is coupled to a drain terminal of transistor U29a and a drain terminal of transistor U30a at node clkbb1'.

A gate terminal of transistor U38a is configured to receive clock signal clkb1 at node clkb1'. The gate terminal of transistor U38a is coupled to a drain terminal of transistor U27a and a drain terminal of transistor U28a at node clkb1'.

A source terminal of transistor U35a is coupled to the voltage supply VDD.

A drain terminal of transistor U35a is coupled to a source terminal of transistor U36a.

A source terminal of transistor U37a is coupled to a drain terminal of transistor U38a. A source terminal of transistor U38a is coupled to the reference voltage supply VSS.

A gate terminal of transistor U35b is configured to receive clock signal clkbb2 at node clkbb2'. The gate terminal of transistor U35b is coupled to a drain terminal of transistor U29b and a drain terminal of transistor U30b at node clkbb2'.

A gate terminal of transistor U38b is configured to receive clock signal clkb2 at node clkb2'. The gate terminal of transistor U38b is coupled to a drain terminal of transistor U27b and a drain terminal of transistor U28b at node clkb2'.

A source terminal of transistor U35b is coupled to the voltage supply VDD.

A drain terminal of transistor U35b is coupled to a source terminal of transistor U36b.

A source terminal of transistor U37b is coupled to a drain terminal of transistor U38b. A source terminal of transistor U38b is coupled to the reference voltage supply VSS.

Output circuit 2118 includes transistors U39, U40, U41 and U42. In some embodiments, each of transistors U39 and U40 is a PMOS transistor. In some embodiments, each of transistors U41 and U42 is an NMOS transistor.

Each of the gate terminal of transistor U39 and the gate terminal of transistor U42 is configured to receive signal sl2_ax at node sl2_ax'. The gate terminal of transistor U39 and the gate terminal of transistor U42 are coupled together at node sl2_ax'.

Each of the gate terminal of transistor U40 and the gate terminal of transistor U41 is configured to receive signal sl1_ax at node sl1_ax'. The gate terminal of transistor U40 and the gate terminal of transistor U41 are coupled together at node sl1_ax'.

A source terminal of transistor U39 is coupled to the voltage supply VDD. A drain terminal of transistor U39 is coupled to a source terminal of transistor U40.

Each of a drain terminal of transistor U40 and a drain terminal of transistor U41 are coupled together at output node Q', and are configured to output the output signal Q.

Output signal Q is the signal of at least the drain terminal of transistor U40 and the drain terminal of transistor U41. Output signal Q is the signal of at least the output node Q'.

A source terminal of transistor U41 is coupled to a drain terminal of transistor U42. A source terminal of transistor U42 is coupled to the reference voltage supply VSS.

Clock buffer 2102 includes transistors U27a, U27b, U28a, U28b, U29a, U29b, U30a and U30b. In some embodiments, each of transistors U27a, U27b, U29a and U29b is a PMOS transistor. In some embodiments, each of transistors U28a, U28b, U30a and U30b is an NMOS transistor.

Transistors U27a and U28a are configured as an inverter 2102a configured to output signal clkb1. Transistors U29a and U30a are configured as an inverter 2104a configured to output signal clkbb1.

Transistors U27b and U28b are configured as an inverter 2102b configured to output signal clkb2. Transistors U29b and U30b are configured as an inverter 2104b configured to output signal clkbb2.

A gate terminal of transistor U27*a* and a gate terminal of transistor U28*a* are configured to receive clock signal CP at node CP'. Each of the gate terminals of transistor U27*a*, transistor U28*a*, transistor U27*b* and transistor U28*b* are coupled together. A source terminal of transistor U27*a* is coupled to the voltage supply VDD. A drain terminal of transistor U27*a* and a drain terminal of transistor U28*a* are coupled together, and are configured to output clock signal clkb1. A source terminal of transistor U28*a* is coupled to the reference voltage supply VSS.

Each of the drain terminal of transistor U27*a*, the drain terminal of transistor U28*a*, a gate terminal of transistor U29*a* and a gate terminal of transistor U30*a* are coupled together at node clkb1'. The gate terminal of transistor U29*a* and the gate terminal of transistor U30*a* are configured to receive clock signal clkb1. A source terminal of transistor U29*a* is coupled to the voltage supply VDD. A drain terminal of transistor U29*a* and a drain terminal of transistor U30*a* are coupled together at node clkbb1', and are configured to output clock signal clkbb1. A source terminal of transistor U30*a* is coupled to the reference voltage supply VSS.

A gate terminal of transistor U27*b* and a gate terminal of transistor U28*b* are configured to receive clock signal CP at node CP'. A source terminal of transistor U27*b* is coupled to the voltage supply VDD. A drain terminal of transistor U27*b* and a drain terminal of transistor U28*b* are coupled together, and are configured to output clock signal clkb2. A source terminal of transistor U28*b* is coupled to the reference voltage supply VSS.

Each of the drain terminal of transistor U27*b*, the drain terminal of transistor U28*b*, a gate terminal of transistor U29*b* and a gate terminal of transistor U30*b* are coupled together at node clkb2'.

The gate terminal of transistor U29*b* and the gate terminal of transistor U30*b* are configured to receive clock signal clkb2. A source terminal of transistor U29*b* is coupled to the voltage supply VDD. A drain terminal of transistor U29*b* and a drain terminal of transistor U30*b* are coupled together at node clkbb2', and are configured to output clock signal clkbb2. A source terminal of transistor U30*b* is coupled to the reference voltage supply VSS.

Buffer 2103 includes transistors U45*a*, U45*b*, U46*a* and U46*b*. In some embodiments, each of transistors U45*a* and U45*b* is a PMOS transistor. In some embodiments, each of transistors U46*a* and U46*b* is an NMOS transistor.

Transistors U45*a* and U46*a* are configured as an inverter 2103*a* configured to output signal cdb1. Transistors U45*b* and U46*b* are configured as an inverter 2103*b* configured to output signal cdb2.

A gate terminal of transistor U45*a* and a gate terminal of transistor U46*a* are configured to receive signal CD at node CD'. Each of the gate terminals of transistor U45*a*, transistor U46*a*, transistor U45*b* and transistor U46*b* are coupled together.

A source terminal of transistor U45*a* is coupled to the voltage supply VDD. A drain terminal of transistor U45*a* and a drain terminal of transistor U46*a* are coupled together at node cdb1', and are configured to output signal cdb1. A source terminal of transistor U46*a* is coupled to the reference voltage supply VSS.

A gate terminal of transistor U45*b* and a gate terminal of transistor U46*b* are configured to receive signal CD at node CD'.

A source terminal of transistor U45*b* is coupled to the voltage supply VDD. A drain terminal of transistor U45*b* and a drain terminal of transistor U46*b* are coupled together at node cdb2', and are configured to output clock signal cdb2. A source terminal of transistor U46*b* is coupled to the reference voltage supply VSS.

Inverter 2106 includes transistors U25-U26. In some embodiments, transistor U25 is a PMOS transistor. In some embodiments, transistor U26 is an NMOS transistor.

A gate terminal of transistor U25 and a gate terminal of transistor U26 are configured to receive scan enable signal SE. The gate terminals of transistor U25 and transistor U26 are coupled together at node SE'. A source terminal of transistor U25 is coupled to the voltage supply VDD. A drain terminal of transistor U25 and a drain terminal of transistor U26 are coupled together at node SEB', and are configured to output inverted scan enable signal SEB. A source terminal of transistor U26 is coupled to the reference voltage supply VSS.

Other configurations, arrangements or other circuits in at least one of portion 2100A or portion 2100B of integrated circuit 2100 are within the scope of the present disclosure.

In some embodiments, in at least FIGS. 21A-21C, at least one of latch circuit 2112 or latch circuit 2116 has a corresponding active region with the number of fins NF1*a* (shown in FIG. 2).

In some embodiments, in at least FIGS. 21A-21C, at least one of clock buffer 2102, buffer 2103, inverter 2106, scan circuit 2110, stacked gate circuit 2114, or output circuit 2118 has a corresponding active region with the number of fins NF2*a* (shown in FIG. 2).

In some embodiments, integrated circuit 2000 achieves one or more of the benefits discussed herein.

In some embodiments, one or more NMOS transistors are changed to one or more PMOS transistors, and vice versa. In some embodiments, one or more of the drains or sources are flipped with the other.

Other groupings, configurations, arrangements or other circuits in portion 2100B of integrated circuit 2100 are within the scope of the present disclosure.

Other configurations, arrangements or other circuits in integrated circuit 2100 are within the scope of the present disclosure.

FIGS. 22A-22C are a diagram of an integrated circuit 2200, in accordance with some embodiments. In some embodiments, integrated circuit 2200 is a flip-flop circuit. In some embodiments, integrated circuit 2200 is an MBFF circuit.

Integrated circuit 2200 is a variation of integrated circuit 2100 (FIGS. 21A-21C), and similar detailed description is therefore omitted. For example, integrated circuit 2200 is a scan flip-flop circuit with an asynchronous set. In some embodiments, the integrated circuit 2200 is triggered by a rising edge of at least a clock signal CP similar to integrated circuit 1000 (FIG. 10), and similar detailed description is therefore omitted.

FIG. 22A is a block diagram of an integrated circuit 2200, in accordance with some embodiments. FIG. 22B is a circuit diagram of a portion 2200A of integrated circuit 2200, in accordance with some embodiments. FIG. 22C is a circuit diagram of a portion 2200B of integrated circuit 2200, in accordance with some embodiments.

Portion 2200A is an embodiment of scan circuit 2110, a latch circuit 2212, stacked gate circuit 2114, a latch circuit 2216 and an output circuit 2118 of integrated circuit 2200 of FIG. 22A, and similar detailed description is omitted.

Portion 2200B is an embodiment of a clock buffer 2102, a buffer 2203, and an inverter 2106 of integrated circuit 2200 of FIG. 22A, and similar detailed description is omitted.

Integrated circuit 2200 is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 2200 includes clock buffer 2102, a buffer 2203, inverter 2106, scan circuit 2110, a latch circuit 2212, stacked gate circuit 2114, a latch circuit 2216 and output circuit 2118.

In some embodiments, integrated circuit 2200 is a DICE circuit where integrated circuit 2200 is configured to provide reliability over other approaches by having a left path (e.g., first portions of at least one of scan circuit 2111, clock buffer 2102, buffer 2203, latch circuit 2212 or latch circuit 2216) and a right path (e.g., first portions of at least one of scan circuit 2111, clock buffer 2102, latch circuit 2212 or latch circuit 2216) that are interlocked with each other, and by separating sensitive nodes from each other by corresponding distances (not shown).

In some embodiments, the first portions of at least one of scan circuit 2111, clock buffer 2102, latch circuit 2212 or latch circuit 2216 include portions where a signal includes clock signal clkb1, clkbb1, signal sdnb1 or signal SDN. In some embodiments, the second portions of at least one of scan circuit 2111, clock buffer 2102, latch circuit 2212 or latch circuit 2216 include portions where a signal includes clock signal clkb2, clkbb2, signal sdnb2 or signal SDN.

In comparison with integrated circuit 2100 of FIGS. 21A-21C, buffer 2203 of integrated circuit 2200 of FIGS. 22A-22C replaces buffer 2103 of FIGS. 21A-21C, latch circuit 2212 of integrated circuit 2200 of FIGS. 22A-22C replaces latch circuit 2112 of FIGS. 21A-21C, latch circuit 2216 of integrated circuit 2200 of FIGS. 22A-22C replaces latch circuit 2116 of FIGS. 21A-21C, and similar detailed description is therefore omitted.

In comparison with integrated circuit 2100 of FIGS. 21A-21C, signal SDN of integrated circuit 2200 of FIGS. 22A-22C replaces signal CD of FIGS. 21A-21C, signal sdnb1 of integrated circuit 2200 of FIGS. 22A-22C replaces signal cdb1 of FIGS. 21A-21C, signal sdnb2 of integrated circuit 2200 of FIGS. 22A-22C replaces signal cdb2 of FIGS. 21A-21C, and similar detailed description is therefore omitted.

In comparison with integrated circuit 2100 of FIGS. 21A-21C, node SDN' of integrated circuit 2200 of FIGS. 22A-22C replaces node CD' of FIGS. 21A-21C, node sdnb1' of integrated circuit 2200 of FIGS. 22A-22C replaces node cdb1' of FIGS. 21A-21C, node sdnb2' of integrated circuit 2200 of FIGS. 22A-22C replaces node cdb2' of FIGS. 21A-21C, and similar detailed description is therefore omitted.

Buffer 2203 includes an inverter 2203*a* and an inverter 2203*b*.

An input terminal of buffer 2203 is configured to receive the signal SDN.

An input terminal of inverter 2203*a* is configured to receive signal SDN on node SDN'. In some embodiments, the node SDN' corresponds to at least the input terminal of inverter 2203*a*.

An output terminal of inverter 2203*a* is configured to output a signal sdnb1 to at least a first buffer input terminal of latch circuit 2212. In some embodiments, the node sdnb1' corresponds to at least one of the output terminal of inverter 2203*a* or the first buffer input terminal of latch circuit 2212.

An input terminal of inverter 2203*b* is configured to receive signal SDN on node SDN'. In some embodiments, the node SDN' corresponds to at least the input terminal of inverter 2203*b*.

An output terminal of inverter 2203*b* is configured to output a signal sdnb2 to at least a second buffer input terminal of latch circuit 2212. In some embodiments, the node sdnb2' corresponds to at least one of the output terminal of inverter 2203*b* or the second buffer input terminal of latch circuit 2212.

In FIGS. 22A-22C, the first buffer input terminal of latch circuit 2212 is configured to receive signal sdnb1, and the second buffer input terminal of latch circuit 2212 is configured to receive signal sdnb2.

In comparison with latch circuit 2112 of FIGS. 21A-21C, latch circuit 2212 is configured to receive signal sdnb1 on node sdnb1' instead of signal cdb1 on node cdb1' of latch circuit 2112, and latch circuit 2212 is configured to receive signal sdnb2 on node sdnb2' instead of signal cdb1 on node cdb1', and similar detailed description is therefore omitted.

In comparison with latch circuit 2116 of FIGS. 21A-21C, latch circuit 2216 is configured to receive signal SDN on node SDN' instead of signal CD on node CD' of latch circuit 2216, and similar detailed description is therefore omitted.

Latch circuit 2212 includes transistors U13*b*1, U13*b*2, U14*b*1, U14*b*2, U15*b*1, U15*b*2, U16*b*1, U16*b*2, U17*a*, U18*a*, U19*a*, U20*a*, U17*b*, U18*b*, U19*b* and U20*b*. In some embodiments, each of transistors U13*b*1, U13*b*2, U15*b*1, U15*b*2, U17*a*, U18*a*, U17*b* and U18*b* is a PMOS transistor. In some embodiments, each of transistors U14*b*1, U14*b*2, U16*b*1, U16*b*2, U19*a*, U20*a*, U19*b* and U20*b* is an NMOS transistor.

Each of a gate terminal of transistor U13*b*2, a gate terminal of transistor U14*b*2, a drain terminal of transistor U43*a* and a drain terminal of transistor U44*a* are coupled together at node sdnb1'. Each of the gate terminal of transistor U13*b*2 and the gate terminal of transistor U14*b*2 is configured to receive signal sdnb1 at node sdnb1'.

A source terminal of transistor U13*b*2 is coupled to the voltage supply VDD. A drain terminal of transistor U13*b*2 is coupled to a source terminal of transistor U13*b*1.

A source terminal of transistor U14*b*1 is coupled to the reference voltage supply VSS.

A source terminal of transistor U14*b*2 is coupled to the reference voltage supply VSS.

A drain terminal of transistor U13*b*1, a drain terminal of transistor U14*b*1 and a drain terminal of transistor U14*b*2 are configured to output a signal ml1_*bx*' at node ml1_*bx*. Each of the drain terminal of transistor U13*b*1, the drain terminal of transistor U14*b*1, the drain terminal of transistor U14*b*2, the gate terminal of transistor U19*a*, and the gate terminal of transistor U18*b* are coupled together at node ml1_*bx*.

The gate terminal of transistor U19*a* and the gate terminal of transistor U18*b* are configured to receive signal ml1_*bx*' at node ml1_*bx*.

Each of a gate terminal of transistor U15*b*1, a gate terminal of transistor U16*b*2, a drain terminal of transistor U43*b* and a drain terminal of transistor U44*b* are coupled together at node sdnb2'. Each of the gate terminal of transistor U15*b*1 and the gate terminal of transistor U16*b*2 is configured to receive signal sdnb2 at node sdnb2'.

A source terminal of transistor U15*b*1 is coupled to the voltage supply VDD.

A drain terminal of transistor U15*b*2 is coupled to a drain terminal of transistor U16*b*1.

A source terminal of transistor U16*b*1 is coupled to the reference voltage supply VSS. A source terminal of transistor U16*b*2 is coupled to the reference voltage supply VSS.

Each of a drain terminal of transistor U15*b*1, a source terminal of transistor U15*b*2 and a drain terminal of transistor U16*b*2 are configured to output a signal ml2_*bx*' at node ml2_*bx*.

Each of the drain terminal of transistor U15*b*1, the source terminal of transistor U15*b*2, the drain terminal of transistor U16*b*2, a gate terminal of transistor U19*b*, and a gate terminal of transistor U18*a* are coupled together at node ml2_*bx*.

Latch circuit 2116 includes transistors U31*b*1, U31*b*2, U32*b*1, U32*b*2, U33*b*1, U33*b*2, U34*b*1, U34*b*2, U35*a*, U36*a*, U37*a*, U38*a*, U35*b*, U36*b*, U37*b* and U38*b*. In some embodiments, each of transistors U31*b*1, U31*b*2, U33*b*1, U33*b*2, U35*a*, U36*a*, U35*b* and U36*b* is a PMOS transistor. In some embodiments, each of transistors U32*b*1, U32*b*2, U34*b*1, U34*b*2, U37*a*, U38*a*, U37*b* and U38*b* is an NMOS transistor.

Each of a gate terminal of transistor U31*b*2 and a gate terminal of transistor U32*b*2 are coupled together at node SDN'. Each of the gate terminal of transistor U31*b*2 and the gate terminal of transistor U32*b*2 are configured to receive signal SDN at node SDN'.

A source terminal of transistor U31*b*1 is coupled to the voltage supply VDD. A source terminal of transistor U31*b*2 is coupled to the voltage supply VDD.

A source terminal of transistor U32*b*1 is coupled to a drain terminal of transistor U32*b*2. A source terminal of transistor U32*b*2 is coupled to the reference voltage supply VSS.

Each of a drain terminal of transistor U31*b*1, a drain terminal of transistor U31*b*2 and a drain terminal of transistor U32*b*1 are configured to output a signal sl1_*b*' at node sl1_*b*. Each of the drain terminal of transistor U31*b*1, the drain terminal of transistor U31*b*2, the drain terminal of transistor U32*b*1, the gate terminal of transistor U37*a*, the gate terminal of transistor U36*b* are coupled together at node sl1_*b*.

Each of a gate terminal of transistor U34*b*2 and a gate terminal of transistor U34*b*1 are coupled together at node SDN'. Each of the gate terminal of transistor U34*b*2 and the gate terminal of transistor U34*b*1 are configured to receive signal SDN at node SDN'.

A source terminal of transistor U33*b*2 is coupled to the voltage supply VDD. A source terminal of transistor U34*b*2 is coupled to the voltage supply VDD.

A source terminal of transistor U33*b*1 is coupled to a drain terminal of transistor U34*b*1. A source terminal of transistor U34*b*1 is coupled to the reference voltage supply VSS.

Each of a drain terminal of transistor U33*b*2, a drain terminal of transistor U34*b*2, and a drain terminal of transistor U33*b*1 are configured to output a signal sl2_*b* at node sl2_*b*'. Each of the drain terminal of transistor U33*b*2, the drain terminal of transistor U34*b*2, the drain terminal of transistor U33*b*1, the gate terminal of transistor U37*b*, and the gate terminal of transistor U36*a* are coupled together at node sl2_*b*.

Other configurations, arrangements or other circuits in at least one of portion 2200A or portion 2200B of integrated circuit 2200 are within the scope of the present disclosure.

In some embodiments, in at least FIGS. 22A-22C, at least one of latch circuit 2212 or latch circuit 2216 has a corresponding active region with the number of fins NF1*a* (shown in FIG. 2).

In some embodiments, in at least FIGS. 22A-22C, at least one of clock buffer 2102, buffer 2203, inverter 2106, scan circuit 2110, stacked gate circuit 2114, or output circuit 2118 has a corresponding active region with the number of fins NF2*a* (shown in FIG. 2).

In some embodiments, integrated circuit 2000 achieves one or more of the benefits discussed herein.

In some embodiments, one or more NMOS transistors are changed to one or more PMOS transistors, and vice versa. In some embodiments, one or more of the drains or sources are flipped with the other.

Other groupings, configurations, arrangements or other circuits in portion 2200B of integrated circuit 2200 are within the scope of the present disclosure.

Other configurations, arrangements or other circuits in integrated circuit 2200 are within the scope of the present disclosure.

Figure 23A:
FIGS. 23A-23B are flow charts of a method of forming or manufacturing an integrated circuit in accordance with some embodiments.
Figure 23A:
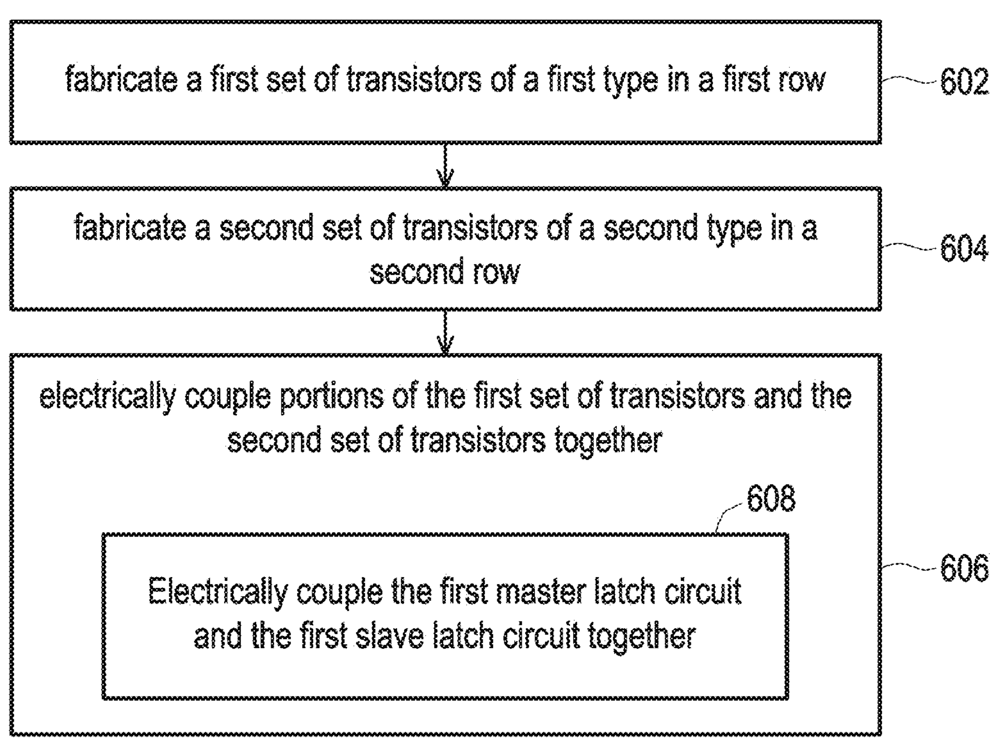
Figure 23B:
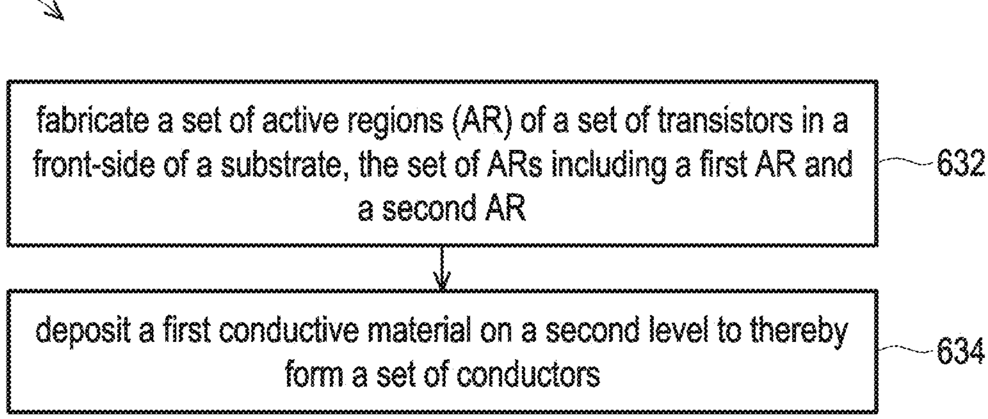

FIGS. 23A-23B are corresponding functional flow charts of corresponding methods 2300A-2300B of manufacturing an IC device, in accordance with some embodiments.

FIG. 23A is a functional flow chart of a method 2300A of manufacturing an IC device, in accordance with some embodiments. It is understood that additional operations may be performed before, during, and/or after the method 2300A depicted in FIG. 23A, and that some other processes may only be briefly described herein.

In some embodiments, methods 2300A and 2300B are an embodiment of operation 2404 of method 2400. In some embodiments, the methods 2300A-2300B are usable to manufacture or fabricate at least integrated circuit 100-2200.

In operation 2302 of method 2300A, a first set of transistors of a first type are fabricated in a first row. In some embodiments, the first row extends in the first direction X. In some embodiments, operation 2302 includes at least operation 2332 of method 2300B.

In some embodiments, the first row or a second row includes ROW1. In some embodiments, the first row or the second row includes ROW2.

In operation 2304 of method 2300A, a second set of transistors of a second type are fabricated in a second row. In some embodiments, operation 2304 includes at least operation 2332 of method 2300B.

In some embodiments, the first type is an n-type, and the second type is a p-type. In some embodiments, the first type is a p-type, and the second type is an n-type.

In some embodiments, the second row extends in the first direction X, and is separated from the first row in the second direction Y. In some embodiments, the second type is different from the first type.

In some embodiments, the first set of transistors and the second set of transistors include a first master latch circuit and a second master latch circuit.

In some embodiments, the first master latch circuit includes NOR circuit 104 and reversed tri-state gate circuit 106. In some embodiments, the first master latch circuit includes NAND circuit 1004 and reversed tri-state gate circuit 106. In some embodiments, the first master latch circuit includes circuit 1604 and reversed tri-state gate circuit 106. In some embodiments, the first master latch circuit includes latch circuit 2112 or 2212.

In some embodiments, the first slave latch circuit includes NAND circuit 110 and reversed tri-state gate circuit 112. In some embodiments, the first slave latch circuit includes NOR circuit 1010 and reversed tri-state gate circuit 112. In some embodiments, the first slave latch circuit includes circuit 1610 and reversed tri-state gate circuit 112. In some embodiments, the first slave latch circuit includes latch circuit 2116 or 2216.

In some embodiments, the first master latch circuit includes a first reverse stacked gate circuit (e.g., reverse stacked gate circuit 106) coupled between a first node and a second node. In some embodiments, the first node includes node ml_ax', and the second node includes node ml_b'. Other nodes for the first node or the second node for method 2300A-2300B are within the scope of the present disclosure.

In some embodiments, the first slave latch circuit includes a second reverse stacked gate circuit (e.g., reverse stacked gate circuit 112) coupled between a third node and a fourth node. In some embodiments, the third node includes node sl_a', and the fourth node includes node sl_bx'. Other nodes for the third node or the fourth node for method 2300A-2300B are within the scope of the present disclosure.

In some embodiments, the first node and the second node are separated from each other by a first distance, and the third node and the fourth node are separated from each other by a second distance. In some embodiments, the first distance includes at least distance D1*a* or D1*b*. In some embodiments, the second distance includes at least distance D2*a* or D2*b*.

In some embodiments, the first distance and the second distance are less than a first range. In some embodiments, the first range is less than 100 nm. Other values for the first range are within the scope of the present disclosure.

In some embodiments, a first portion (202*a*9) of active region 202*a* is in a same column (Column1) as a second portion (202*b*9) of active region 202*b*.

In some embodiments, the first row corresponds to active region 202*a* and the second row corresponds to active region 202*b*. In these embodiments, the first set of transistors include the set of transistors located in at least active region 202*a* and the second set of transistors include the set of transistors located in at least active region 202*b*.

In operation 2306 of method 2300A, portions of the first set of transistors and the second set of transistors are electrically coupled together. In some embodiments, operation 2306 includes operation 2308.

In operation 2308 of method 2300A, the first master latch circuit and the first slave latch circuit are electrically coupled together. In some embodiments, operation 2308 includes at least operation 2334 of method 2300B.

FIG. 23B is a functional flow chart of a method 2300B of manufacturing an IC device, in accordance with some embodiments. It is understood that additional operations may be performed before, during, and/or after the method 2300B depicted in FIG. 23B, and that some other processes may only be briefly described herein.

In operation 2332 of method 2300B, a set of active regions 202 of a set of transistors is formed in a front-side (e.g., first level) of a substrate. In some embodiments, the set of transistors of at least method 2300A-2300B includes one or more transistors in the set of active regions 202. In some embodiments, the set of transistors of at least method 2300A-2300B includes one or more transistors described herein.

In some embodiments, the set of active regions of method 2300A-2300B includes a first active region and a second active region in the first level (e.g., OD) of a substrate.

In some embodiments, the first active region corresponds to a first set of transistors of a first type (e.g., p-type or n-type). In some embodiments, the second active region corresponds to a second set of transistors of a second type (e.g., n-type or p-type) different from the first type.

In some embodiments, operation 2332 further includes at least operation 2332*a*. In some embodiments, operation 2332*a* (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, using a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 2332 further includes fabricating contacts of the set of transistors and fabricating gates of the set of transistors.

In some embodiments, fabricating contacts of the set of transistors includes depositing a conductive material over source/drain regions of at least one of the first or second set of transistors on a third level thereby forming a set of contacts of the set of transistors. In some embodiments, the third level of at least method 2300A-2300B includes a metal over diffusion (MD) level.

In some embodiments, the set of contacts overlap at least the first active region or the second active region.

In some embodiments, fabricating gates of the set of transistors includes forming a set of gate structures of the set of transistors on a fourth level. In some embodiments, the set of gate structures of at least method 2300A-2300B includes at least one or more of gates of the set of gates 204. In some embodiments, the fourth level of at least method 2300A-2300B includes the POLY level.

In some embodiments, a gate region of one or more gates of the set of gates is between the drain region and the source region. In some embodiments, the gate region is over the first well and the substrate. In some embodiments, fabricating the gate regions of operation includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers.

In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 2334 of method 2300B, a first conductive material is deposited on a second level thereby forming a first set of conductors. In some embodiments, the second level of at least method 2300B includes the M0, M1, M2, M3 level or the like. Other metal layers are within the scope of the present disclosure.

In some embodiments, operation 2334 includes at least depositing a first set of conductive regions over the front-side of the integrated circuit. In some embodiments, operation 2334 includes at least depositing a first set of conductive regions over a back-side of the integrated circuit.

In some embodiments, the first set of conductors is electrically coupled to at least the set of contacts by a set of vias. In some embodiments, the first set of conductors is electrically coupled to at least the set of gates by a second set of vias.

In some embodiments, operation 2334 further includes forming a first set of vias and a second set of vias. In some embodiments, the first set of vias are in the VG level. In some embodiments, the first set of vias are formed over the set of gates. In some embodiments, the second set of vias are in the VD level. In some embodiments, the second set of vias are formed over the set of contacts.

In some embodiments, operation 2334 further includes forming a first and second set of self-aligned contacts (SACs) in an insulating layer over the front-side of the wafer. In some embodiments, the first and second set of vias are electrically coupled to at least the set of transistors.

In some embodiments, one or more portions of operation 2334 of method 2300A-2300B includes using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 27:
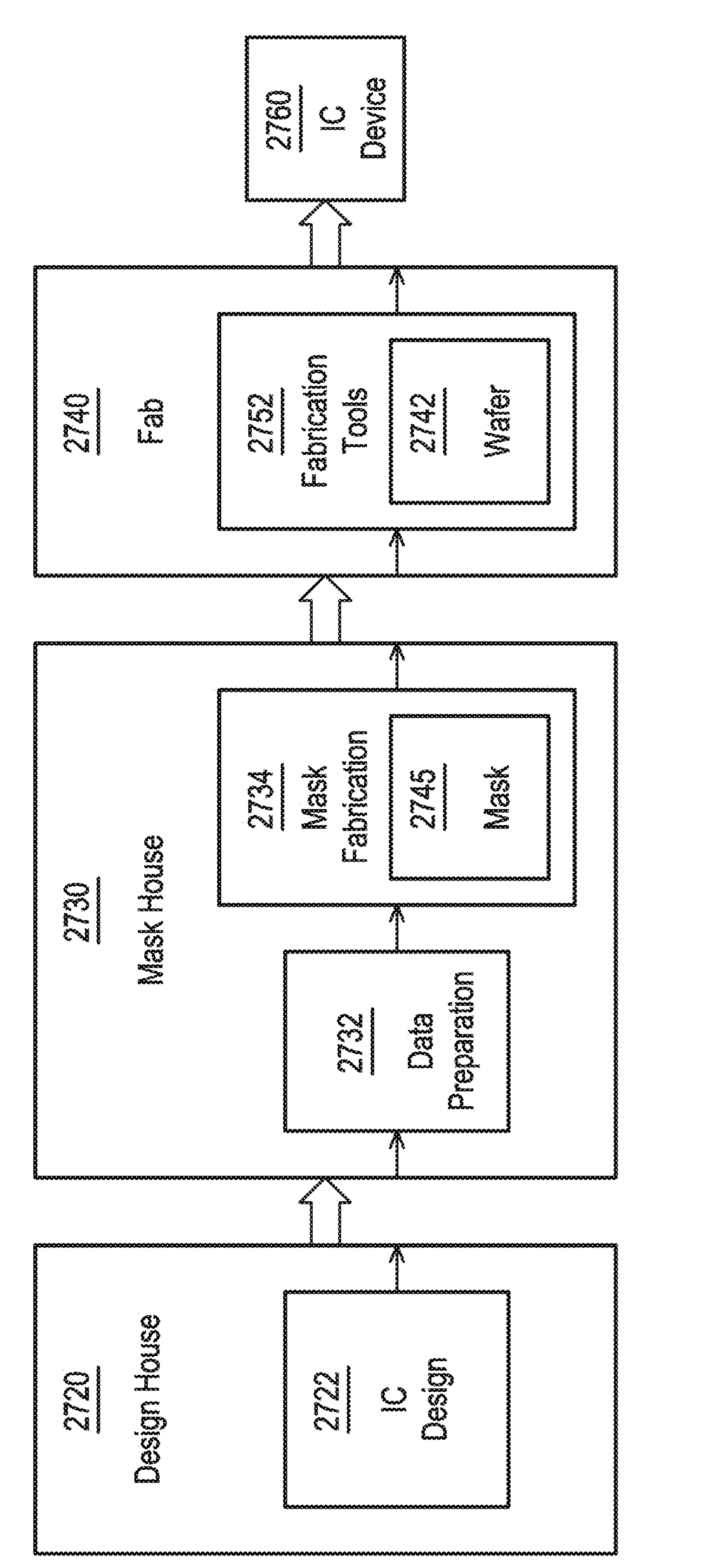
FIG. 27 is a block diagram of an IC manufacturing system, and an IC manufacturing flow associated therewith, in accordance with at least one embodiment of the present disclosure.

In some embodiments, at least one or more operations of method 2300A or 2300B is performed by system 2700 of FIG. 27. In some embodiments, at least one method(s), such as method 2300A or 2300B discussed above, is performed in whole or in part by at least one manufacturing system, including system 2700. One or more of the operations of method 2300A or 2300B is performed by IC fab 2740 (FIG. 27) to fabricate IC device 2760. In some embodiments, one or more of the operations of method 2300A or 2300B is performed by fabrication tools 2752 to fabricate wafer 2742.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 2334, the conductive material is planarized to provide a level surface for subsequent steps.

In some embodiments, one or more of the operations of method 2300A, 2300B, 2400 or 2500 is not performed.

One or more of the operations of methods 2400-2500 is performed by a processing device configured to execute instructions for manufacturing an integrated circuit, such as at least integrated circuit 100-2200. In some embodiments, one or more operations of methods 2400-2500 is performed using a same processing device as that used in a different one or more operations of methods 2400-2500. In some embodiments, a different processing device is used to perform one or more operations of methods 2400-2500 from that used to perform a different one or more operations of methods 2400-2500. In some embodiments, other order of operations of method 2300A, 2300B, 2400 or 2500 is within the scope of the present disclosure. Method 2300A, 2300B, 2400 or 2500 includes exemplary operations, but the operations are not necessarily performed in the order shown. Operations in method 2300A, 2300B, 2400 or 2500 may be added, replaced, changed order, and/or eliminated as appropriate, in accordance with the spirit and scope of disclosed embodiments.

Figure 24:
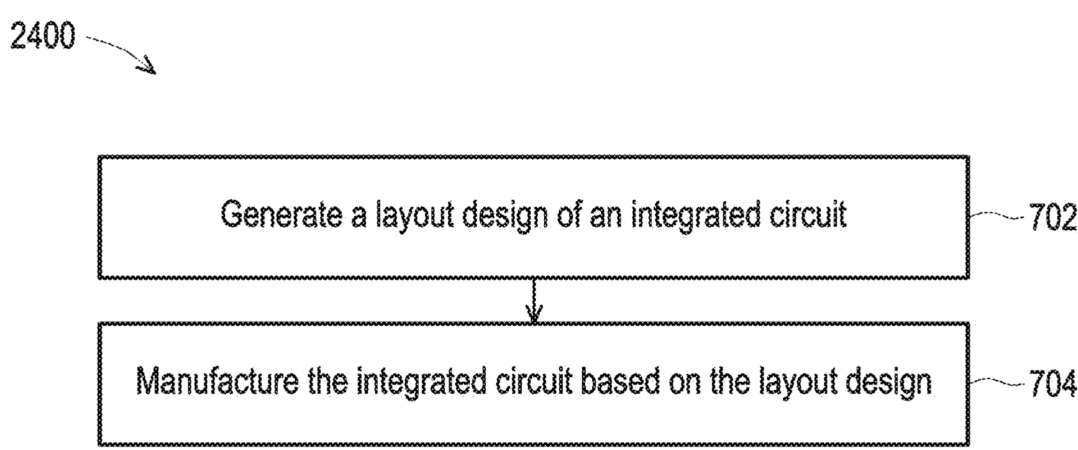
FIG. 24 is a flow chart of a method of manufacturing an IC device, in accordance with some embodiments.

FIG. 24 is a flowchart of a method 2400 of forming or manufacturing an integrated circuit in accordance with some embodiments. It is understood that additional operations may be performed before, during, and/or after the method 2400 depicted in FIG. 24, and that some other operations may only be briefly described herein. In some embodiments, the method 2400 is usable to form integrated circuits, such as at least integrated circuit 100-2200.

In operation 2402 of method 2400, a layout design of an integrated circuit is generated. Operation 2402 is performed by a processing device (e.g., processor 2602 (FIG. 26)) configured to execute instructions for generating a layout design. In some embodiments, the layout design of method 2400 includes one or more patterns similar to one or more features of at least integrated circuit 100-2200. In some embodiments, the layout design of the present application is in a graphic database system (GDSII) file format.

In operation 2404 of method 2400, the integrated circuit is manufactured based on the layout design. In some embodiments, operation 2404 of method 2400 comprises manufacturing at least one mask based on the layout design, and manufacturing the integrated circuit based on the at least one mask. In some embodiments, operation 2404 corresponds to method 2300A of FIG. 23 or method 2300B of FIG. 23B.

Figure 25:
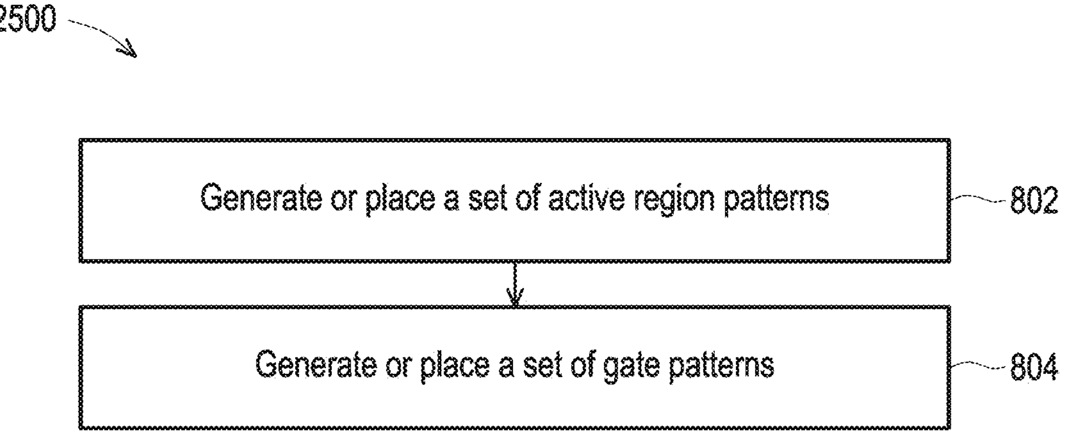
FIG. 25 is a flowchart of a method of generating a layout design of an integrated circuit, in accordance with some embodiments.

FIG. 25 is a flowchart of a method 2500 of generating a layout design of an integrated circuit, in accordance with some embodiments. It is understood that additional operations may be performed before, during, and/or after the method 2500 depicted in FIG. 25, and that some other processes may only be briefly described herein. In some embodiments, method 2500 is an embodiment of operation 2402 of method 2400. In some embodiments, method 2500 is usable to generate one or more layout patterns similar to one or more features of at least integrated circuit 100-2200.

In operation 2502 of method 2500, a set of active region patterns is generated or placed on the layout design. In some embodiments, the set of active region patterns of method 2500 includes one or more active region patterns similar to the set of active region patterns 202.

In some embodiments, the set of active region patterns of method 2500 includes one or more patterns in the OD level or patterns similar to active regions in the OD level.

In operation 2504 of method 2500, a set of gate patterns is generated or placed on the layout design. In some embodiments, the set of gate patterns of method 2500 includes one or more gate patterns similar to the set of gates 204. In some embodiments, the set of gate patterns of method 2500 includes one or more patterns in the POLY level or patterns similar to gates in the POLY level.

Figure 26:
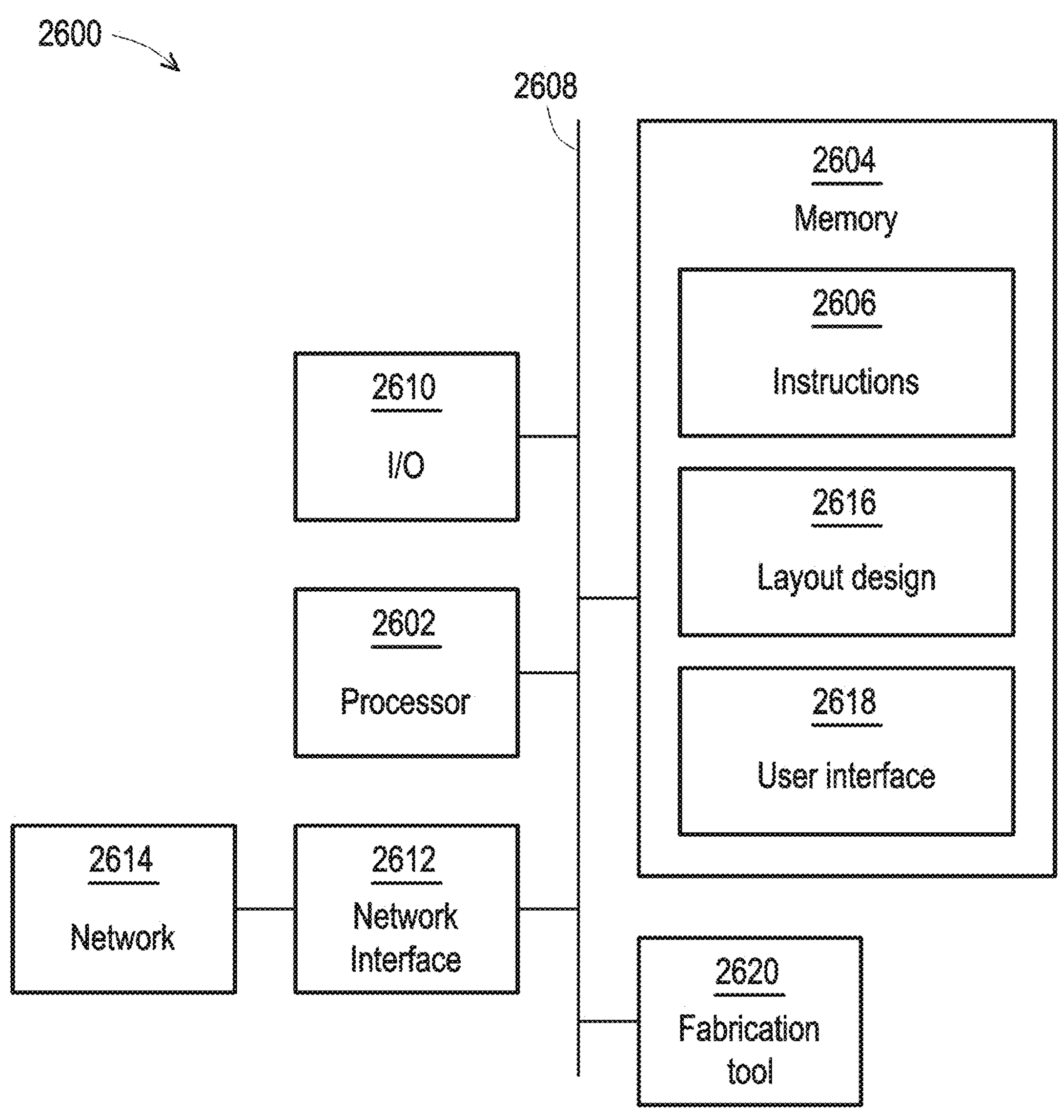
FIG. 26 is a schematic view of a system for designing an IC layout design and manufacturing an IC circuit, in accordance with some embodiments.

FIG. 26 is a schematic view of a system 2600 for designing an IC layout design and manufacturing an IC circuit in accordance with some embodiments.

In some embodiments, system 2600 generates or places one or more IC layout designs described herein. System 2600 includes a hardware processor 2602 and a non-transitory, computer readable storage medium 2604 (e.g., memory 2604) encoded with, i.e., storing, the computer program code 2606, i.e., a set of executable instructions 2606. Computer readable storage medium 2604 is configured for interfacing with manufacturing machines for producing the integrated circuit. The processor 2602 is electrically coupled to the computer readable storage medium 2604 via a bus 2608. The processor 2602 is also electrically coupled to an I/O interface 2610 by bus 2608. A network interface 2612 is also electrically connected to the processor 2602 via bus 2608. Network interface 2612 is connected to a network 2614, so that processor 2602 and computer readable storage medium 2604 are capable of connecting to external elements via network 2614. The processor 2602 is configured to execute the computer program code 2606 encoded in the computer readable storage medium 2604 in order to cause system 2600 to be usable for performing a portion or all of the operations as described in method 2400-2500.

In some embodiments, the processor 2602 is a central processing unit (CPU), a multi-processor, a distributed processing system, an application specific integrated circuit (ASIC), and/or a suitable processing unit.

In some embodiments, the computer readable storage medium 2604 is an electronic, magnetic, optical, electromagnetic, infrared, and/or a semiconductor system (or apparatus or device). For example, the computer readable storage medium 2604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2604 includes a compact disk-read only memory (CD-ROM), a compact disk-read/write (CD-R/W), and/or a digital video disc (DVD).

In some embodiments, the storage medium 2604 stores the computer program code 2606 configured to cause system 2600 to perform method 2400-2500. In some embodiments, the storage medium 2604 also stores information needed for performing method 2400-2500 as well as information generated during performing method 2400-2500, such as layout design 2616, user interface 2618 and fabrication tool 2620, and/or a set of executable instructions to perform the operation of method 2400-2500. In some embodiments, layout design 2616 comprises one or more of layout patterns similar to one or more features of at least integrated circuit 100-2200.

In some embodiments, the storage medium 2604 stores instructions (e.g., computer program code 2606) for interfacing with manufacturing machines. The instructions (e.g., computer program code 2606) enable processor 2602 to generate manufacturing instructions readable by the manufacturing machines to effectively implement method 2400-2500 during a manufacturing process.

System 2600 includes I/O interface 2610. I/O interface 2610 is coupled to external circuitry. In some embodiments, I/O interface 2610 includes a keyboard, keypad, mouse, trackball, trackpad, and/or cursor direction keys for communicating information and commands to processor 2602.

System 2600 also includes network interface 2612 coupled to the processor 2602. Network interface 2612 allows system 2600 to communicate with network 2614, to which one or more other computer systems are connected. Network interface 2612 includes wireless network interfaces such as BLUETOOTH, WIFI, WIMAX, GPRS, or WCDMA; or wired network interface such as ETHERNET, USB, or IEEE-2094. In some embodiments, method 2400-2500 is implemented in two or more systems 2600, and information such as layout design, and user interface are exchanged between different systems 2600 by network 2614.

System 2600 is configured to receive information related to a layout design through I/O interface 2610 or network interface 2612. The information is transferred to processor 2602 by bus 2608 to determine a layout design for producing at least integrated circuit 100-2200. The layout design is then stored in computer readable medium 2604 as layout design 2616. System 2600 is configured to receive information related to a user interface through I/O interface 2610 or network interface 2612. The information is stored in computer readable medium 2604 as user interface 2618. System 2600 is configured to receive information related to a fabrication tool 2620 through I/O interface 2610 or network interface 2612. The information is stored in computer readable medium 2604 as fabrication tool 2620. In some embodiments, the fabrication tool 2620 includes fabrication information utilized by system 2600. In some embodiments, the fabrication tool 2620 corresponds to mask fabrication 2734 of FIG. 27.

In some embodiments, method 2400-2500 is implemented as a standalone software application for execution by a processor. In some embodiments, method 2400-2500 is implemented as a software application that is a part of an additional software application. In some embodiments, method 2400-2500 is implemented as a plug-in to a software application. In some embodiments, method 2400-2500 is implemented as a software application that is a portion of an EDA tool. In some embodiments, method 2400-2500 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 2400-2500 is implemented by a manufacturing device to manufacture an integrated circuit using a set of masks manufactured based on one or more layout designs generated by system 2600. In some embodiments, system 2600 is a manufacturing device configured to manufacture an integrated circuit using a set of masks manufactured based on one or more layout designs of the present disclosure. In some embodiments, system 2600 of FIG. 26 generates layout designs of an integrated circuit that are smaller than other approaches. In some embodiments, system 2600 of FIG. 26 generates layout designs of integrated circuit structure that occupy less area and provide better routing resources than other approaches.

FIG. 27 is a block diagram of an integrated circuit (IC) manufacturing system 2700, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 2700.

In FIG. 27, IC manufacturing system 2700 (hereinafter "system 2700") includes entities, such as a design house 2720, a mask house 2730, and an IC manufacturer/fabricator ("fab") 2740, that interact with one another in the design, development, and manufacturing cycles and/or services related to manufacturing an IC device 2760. The entities in system 2700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 2720, mask house 2730, and IC fab 2740 is owned by a single larger company. In some embodiments, one or more of design house 2720, mask house 2730, and IC fab 2740 coexist in a common facility and use common resources.

Design house (or design team) 2720 generates an IC design layout 2722. IC design layout 2722 includes various geometrical patterns designed for an IC device 2760. The geometrical patterns correspond to patterns of metal, oxide, or semiconductor layers that make up the various components of IC device 2760 to be fabricated. The various layers combine to form various IC features. For example, a portion of IC design layout 2722 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 2720 implements a proper design procedure to form IC design layout 2722. The design procedure includes one or more of logic design, physical design or place and route. IC design layout 2722 is presented in one or more data files having information of the geometrical patterns. For example, IC design layout 2722 can be expressed in a GDSII file format or DFII file format.

Mask house 2730 includes data preparation 2732 and mask fabrication 2734. Mask house 2730 uses IC design layout 2722 to manufacture one or more masks 2745 to be used for fabricating the various layers of IC device 2760 according to IC design layout 2722. Mask house 2730 performs mask data preparation 2732, where IC design layout 2722 is translated into a representative data file (RDF). Mask data preparation 2732 provides the RDF to mask fabrication 2734. Mask fabrication 2734 includes a mask writer. A mask writer converts the RDF to an image on a substrate, such as a mask (reticle) 2745 or a semiconductor wafer 2742. The design layout 2722 is manipulated by mask data preparation 2732 to comply with particular characteristics of the mask writer and/or requirements of IC fab 2740. In FIG. 27, mask data preparation 2732 and mask fabrication 2734 are illustrated as separate elements. In some embodiments, mask data preparation 2732 and mask fabrication 2734 can be collectively referred to as mask data preparation.

In some embodiments, mask data preparation 2732 includes optical proximity correction (OPC) which uses lithography enhancement techniques to compensate for image errors, such as those that can arise from diffraction, interference, other process effects and the like. OPC adjusts IC design layout 2722. In some embodiments, mask data preparation 2732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 2734, which may undo part of the modifications performed by OPC in order to meet mask creation rules.

In some embodiments, mask data preparation 2732 includes lithography process checking (LPC) that simulates processing that will be implemented by IC fab 2740 to fabricate IC device 2760. LPC simulates this processing based on IC design layout 2722 to create a simulated manufactured device, such as IC device 2760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 2722.

It should be understood that the above description of mask data preparation 2732 has been simplified for the purposes of clarity. In some embodiments, data preparation 2732 includes additional features such as a logic operation (LOP) to modify the IC design layout according to manufacturing rules. Additionally, the processes applied to IC design layout 2722 during data preparation 2732 may be executed in a variety of different orders.

After mask data preparation 2732 and during mask fabrication 2734, a mask 2745 or a group of masks 2745 are fabricated based on the modified IC design layout 2722. In some embodiments, mask fabrication 2734 includes performing one or more lithographic exposures based on IC design 2722. In some embodiments, an electron-beam (e-beam) or a mechanism of multiple e-beams is used to form a pattern on a mask (photomask or reticle) 2745 based on the modified IC design layout 2722. The mask 2745 can be formed in various technologies. In some embodiments, the mask 2745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 2745 includes a transparent substrate (e.g., fused quartz) and an opaque material (e.g., chromium) coated in the opaque regions of the binary mask. In another example, the mask 2745 is formed using a phase shift technology. In the phase shift mask (PSM) version of mask 2745, various features in the pattern formed on the mask are configured to have proper phase difference to enhance the resolution and imaging quality. In various examples, the phase shift mask can be attenuated PSM or alternating PSM. The mask(s) generated by mask fabrication 2734 is used in a variety of processes. For example, such a mask(s) is used in an ion implantation process to form various doped regions in the semiconductor wafer, in an etching process to form various etching regions in the semiconductor wafer, and/or in other suitable processes.

IC fab 2740 is an IC fabrication entity that includes one or more manufacturing facilities for the fabrication of a variety of different IC products. In some embodiments, IC Fab 2740 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 2740 includes wafer fabrication tools 2752 (hereinafter "fabrication tools 2752") configured to execute various manufacturing operations on semiconductor wafer 2742 such that IC device 2760 is fabricated in accordance with the mask(s), e.g., mask 2745. In various embodiments, fabrication tools 2752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 2740 uses mask(s) 2745 fabricated by mask house 2730 to fabricate IC device 2760. Thus, IC fab 2740 at least indirectly uses IC design layout 2722 to fabricate IC device 2760. In some embodiments, a semiconductor wafer 2742 is fabricated by IC fab 2740 using mask(s) 2745 to form IC device 2760. In some embodiments, the IC fabrication includes performing one or more lithographic exposures based at least indirectly on IC design 2722. Semiconductor wafer 2742 includes a silicon substrate or other proper substrate having material layers formed thereon. Semiconductor wafer 2742 further includes one or more of various doped regions, dielectric features, multilevel interconnects, and the like (formed at subsequent manufacturing steps).

System 2700 is shown as having design house 2720, mask house 2730 or IC fab 2740 as separate components or entities. However, it is understood that one or more of design house 2720, mask house 2730 or IC fab 2740 are part of the same component or entity.

One aspect of this description relates to a flip-flop. In some embodiments, the flip-flop includes a first input circuit coupled to a first node, and being configured to generate a first signal responsive to at least a first data signal, a first clock signal, or a second clock signal inverted from the first clock signal. In some embodiments, the flip-flop further includes a first NAND logic gate coupled between the first node and a second node, and being configured to generate a second signal responsive to the first signal and a first set signal. In some embodiments, the flip-flop further includes a first stacked gate circuit coupled between the first node and a third node, the first stacked gate circuit being configured to generate a third signal responsive to at least the first signal. In some embodiments, the flip-flop further includes a first NOR logic gate coupled between the third node and a fourth node, and being configured to generate a fourth signal responsive to the third signal and a second set signal inverted from the first set signal. In some embodiments, the flip-flop further includes a first output circuit coupled to the fourth node, and being configured to generate a first output signal responsive to the fourth signal. In some embodiments, the flip-flop further includes a first set buffer circuit coupled to the first NOR logic gate, the first set buffer circuit being configured to generate the second set signal responsive to the first set signal.

Another aspect of this description relates to a flip-flop. In some embodiments, the flip-flop includes a first input circuit coupled to a first node, and being configured to generate a first signal responsive to at least a first data signal, a first clock signal or a second clock signal inverted from the first clock signal. In some embodiments, the flip-flop further includes a first NAND logic gate coupled between the first node and a second node, and being configured to generate a second signal responsive to the first signal and a first set signal. In some embodiments, the flip-flop further includes a first stacked gate circuit coupled between the first node and a third node, the first stacked gate circuit being configured to generate a third signal responsive to at least the first signal. In some embodiments, the flip-flop further includes a first NOR logic gate coupled between the third node and a fourth node, and being configured to generate a fourth signal responsive to the third signal and a second set signal inverted from the first set signal. In some embodiments, the flip-flop further includes a first reverse stacked gate circuit coupled between the first node and the second node, the first reverse stacked gate circuit being configured to set the first signal responsive to the second signal. In some embodiments, the flip-flop further includes a first set buffer circuit coupled to the first NOR logic gate, the first set buffer circuit being configured to generate the second set signal responsive to the first set signal.

Still another aspect of this description relates to a method of fabricating a flip-flop. In some embodiments, the method includes forming a first set of transistors of a first type in a first row, the first row extending in a first direction, and forming a second set of transistors of a second type in a second row, the second row extending in the first direction and being separated from the first row in a second direction different from the first direction, the second type being different from the first type, wherein the first set of transistors and the second set of transistors include a first master latch circuit and a first slave latch circuit. In some embodiments, the method further includes electrically coupling the first master latch circuit and the first slave latch circuit together. In some embodiments, the first master latch circuit includes a first reversed tri-state gate circuit coupled between a first node and a second node. In some embodiments, the first slave latch circuit includes a second reversed tri-state gate circuit coupled between a third node and a fourth node. In some embodiments, the first node and the second node are separated from each other by a first distance. In some embodiments, the third node and the fourth node are separated from each other by a second distance, and the first distance and the second distance being less than a first range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop comprising:

a first input circuit coupled to a first node, and being configured to generate a first signal responsive to at least a first data signal, a first clock signal, or a second clock signal inverted from the first clock signal;

a first NAND logic gate coupled between the first node and a second node, and being configured to generate a second signal responsive to the first signal and a first set signal;

a first stacked gate circuit coupled between the first node and a third node, the first stacked gate circuit being configured to generate a third signal responsive to at least the first signal;

a first NOR logic gate coupled between the third node and a fourth node, and being configured to generate a fourth signal responsive to the third signal and a second set signal inverted from the first set signal;

a first output circuit coupled to the fourth node, and being configured to generate a first output signal responsive to the fourth signal; and a first set buffer circuit coupled to the first NOR logic gate, the first set buffer circuit being configured to generate the second set signal responsive to the first set signal.

2. The flip-flop of claim 1, wherein the first input circuit comprises:

a first P-type transistor having a gate of the first P-type transistor configured to receive one of the first clock signal or the second clock signal, a source of the first P-type transistor coupled to a first intermediate node, and a drain of the first P-type transistor coupled with at least the first node; and a first N-type transistor having a gate of the first N-type transistor configured to receive another of the first clock signal or the second clock signal, a source of the first N-type transistor coupled to a second intermediate node, and a drain of the first N-type transistor coupled with the first node.

3. The flip-flop of claim 2, wherein the first input circuit further comprises:

a second P-type transistor having a drain of the second P-type transistor, a gate of the second P-type transistor configured to receive a scan enable signal, and a source of the second P-type transistor coupled to a voltage supply;

a third P-type transistor having a gate of the third P-type transistor configured to receive the first data signal, a source of the third P-type transistor coupled to the drain of the second P-type transistor, and a drain of the third P-type transistor coupled with at least the first intermediate node and the source of the first P-type transistor;

a fourth P-type transistor having a drain of the fourth P-type transistor, a gate of the fourth P-type transistor configured to receive a first scan in signal, and a source of the fourth P-type transistor coupled to the voltage supply; and a fifth P-type transistor having a gate of the fifth P-type transistor configured to receive an inverted scan enable signal, a source of the fifth P-type transistor coupled to the drain of the fourth P-type transistor, and a drain of the fifth P-type transistor coupled with at least the first intermediate node, the source of the first P-type transistor and the drain of the third P-type transistor.

4. The flip-flop of claim 3, wherein the first input circuit further comprises:

a second N-type transistor having a drain of the second N-type transistor, a gate of the second N-type transistor configured to receive the inverted scan enable signal, and a source of the second N-type transistor coupled to a reference voltage supply;

a third N-type transistor having a gate of the third N-type transistor configured to receive the first data signal, a source of the third N-type transistor coupled to the drain of the second N-type transistor, and a drain of the third N-type transistor coupled with at least the second intermediate node and the source of the first N-type transistor;

a fourth N-type transistor having a drain of the fourth N-type transistor, a gate of the fourth N-type transistor configured to receive the first scan in signal, and a source of the fourth N-type transistor coupled to the reference voltage supply; and a fifth N-type transistor having a gate of the fifth N-type transistor configured to receive the scan enable signal, a source of the fifth N-type transistor coupled to the drain of the fourth N-type transistor, and a drain of the fifth N-type transistor coupled with at least the second intermediate node, the source of the first N-type transistor and the drain of the third N-type transistor, wherein the flip-flop is a scan flip-flop.

5. The flip-flop of claim 1, wherein the first stacked gate circuit comprises:

a first P-type transistor having a drain of the first P-type transistor, a gate of the first P-type transistor configured to receive the first signal and being coupled to at least the first node, and a source of the first P-type transistor coupled to a voltage supply;

a second P-type transistor having a gate of the second P-type transistor configured to receive one of the first clock signal or the second clock signal, a source of the second P-type transistor coupled to the drain of the first P-type transistor, and a drain of the second P-type transistor coupled with at least the third node;

a first N-type transistor having a drain of the first N-type transistor, a gate of the first N-type transistor configured to receive the first signal and being coupled to at least the first node and the gate of the first P-type transistor, and a source of the first N-type transistor coupled to a reference voltage supply; and a second N-type transistor having a gate of the second N-type transistor configured to receive another of the first clock signal or the second clock signal, a source of the second N-type transistor coupled to the drain of the first N-type transistor, and a drain of the second N-type transistor coupled with at least the third node and the drain of the second P-type transistor.

6. The flip-flop of claim 1, further comprising:

a first reverse stacked gate circuit coupled between the first node and the second node, the first reverse stacked gate circuit being configured to set the first signal responsive to the second signal; and a second reverse stacked gate circuit coupled between the third node and the fourth node, the second reverse stacked gate circuit being configured to set the third signal responsive to the fourth signal.

7. The flip-flop of claim 1, wherein the first node and the second node are separated from each other by a first distance, and the third node and the fourth node are separated from each other by a second distance.

8. The flip-flop of claim 7, wherein the first distance is less than or equal to 100 nanometers, and the second distance is less than or equal to 100 nanometers.

9. A flip-flop comprising:

a first input circuit coupled to a first node, and being configured to generate a first signal responsive to at least a first data signal, a first clock signal or a second clock signal inverted from the first clock signal;

a first NAND logic gate coupled between the first node and a second node, and being configured to generate a second signal responsive to the first signal and a first set signal;

a first stacked gate circuit coupled between the first node and a third node, the first stacked gate circuit being configured to generate a third signal responsive to at least the first signal;

a first NOR logic gate coupled between the third node and a fourth node, and being configured to generate a fourth signal responsive to the third signal and a second set signal inverted from the first set signal;

a first reverse stacked gate circuit coupled between the first node and the second node, the first reverse stacked gate circuit being configured to set the first signal responsive to the second signal; and a first set buffer circuit coupled to the first NOR logic gate, the first set buffer circuit being configured to generate the second set signal responsive to the first set signal.

10. The flip-flop of claim 9, wherein the first input circuit comprises:

a first P-type transistor having a gate of the first P-type transistor configured to receive one of the first clock signal or the second clock signal, a source of the first P-type transistor coupled to a first intermediate node, and a drain of the first P-type transistor coupled with at least the first node; and a first N-type transistor having a gate of the first N-type transistor configured to receive another of the first clock signal or the second clock signal, a source of the first N-type transistor coupled to a second intermediate node, and a drain of the first N-type transistor coupled with the first node.

11. The flip-flop of claim 10, wherein the first input circuit further comprises:

a second P-type transistor having a drain of the second P-type transistor, a gate of the second P-type transistor configured to receive a scan enable signal, and a source of the second P-type transistor coupled to a voltage supply;

a third P-type transistor having a gate of the third P-type transistor configured to receive the first data signal, a source of the third P-type transistor coupled to the drain of the second P-type transistor, and a drain of the third P-type transistor coupled with at least the first intermediate node and the source of the first P-type transistor;

a fourth P-type transistor having a drain of the fourth P-type transistor, a gate of the fourth P-type transistor configured to receive a first scan in signal, and a source of the fourth P-type transistor coupled to the voltage supply; and a fifth P-type transistor having a gate of the fifth P-type transistor configured to receive an inverted scan enable signal, a source of the fifth P-type transistor coupled to the drain of the fourth P-type transistor, and a drain of the fifth P-type transistor coupled with at least the first intermediate node, the source of the first P-type transistor and the drain of the third P-type transistor.

12. The flip-flop of claim 11, wherein the first input circuit further comprises:

a second N-type transistor having a drain of the second N-type transistor, a gate of the second N-type transistor configured to receive the inverted scan enable signal, and a source of the second N-type transistor coupled to a reference voltage supply;

a third N-type transistor having a gate of the third N-type transistor configured to receive the first data signal, a source of the third N-type transistor coupled to the drain of the second N-type transistor, and a drain of the third N-type transistor coupled with at least the second intermediate node and the source of the first N-type transistor;

a fourth N-type transistor having a drain of the fourth N-type transistor, a gate of the fourth N-type transistor configured to receive the first scan in signal, and a source of the fourth N-type transistor coupled to the reference voltage supply; and a fifth N-type transistor having a gate of the fifth N-type transistor configured to receive the scan enable signal, a source of the fifth N-type transistor coupled to the drain of the fourth N-type transistor, and a drain of the fifth N-type transistor coupled with at least the second intermediate node, the source of the first N-type transistor and the drain of the third N-type transistor, wherein the flip-flop is a scan flip-flop.

13. The flip-flop of claim 12, further comprising:

a first inverter coupled to the gate of the fifth P-type transistor and the gate of the second N-type transistor, and configured to receive the scan enable signal, and configured to generate the inverted scan enable signal.

14. The flip-flop of claim 9, wherein the first stacked gate circuit comprises:

a first P-type transistor having a drain of the first P-type transistor, a gate of the first P-type transistor configured to receive the first signal and being coupled to at least the first node, and a source of the first P-type transistor coupled to a voltage supply;

a second P-type transistor having a gate of the second P-type transistor configured to receive one of the first clock signal or the second clock signal, a source of the second P-type transistor coupled to the drain of the first P-type transistor, and a drain of the second P-type transistor coupled with at least the third node;

a first N-type transistor having a drain of the first N-type transistor, a gate of the first N-type transistor configured to receive the first signal and being coupled to at least the first node and the gate of the first P-type transistor, and a source of the first N-type transistor coupled to a reference voltage supply; and a second N-type transistor having a gate of the second N-type transistor configured to receive another of the first clock signal or the second clock signal, a source of the second N-type transistor coupled to the drain of the first N-type transistor, and a drain of the second N-type transistor coupled with at least the third node and the drain of the second P-type transistor.

15. The flip-flop of claim 9, further comprising:

a second reverse stacked gate circuit coupled between the third node and the fourth node, the second reverse stacked gate circuit being configured to set the third signal responsive to the fourth signal.

16. The flip-flop of claim 9, further comprising:

a first clock circuit coupled to the first stacked gate circuit and the first reverse stacked gate circuit, and configured to receive a third clock signal, and configured to generate the first clock signal.

17. The flip-flop of claim 16, further comprising:

a second clock circuit coupled to the first clock circuit, the first stacked gate circuit and the first reverse stacked gate circuit, and configured to receive the first clock signal, and configured to generate the second clock signal.

18. The flip-flop of claim 9, wherein the first node and the second node are separated from each other by a first distance, and the third node and the fourth node are separated from each other by a second distance.

19. The flip-flop of claim 18, wherein the first distance is less than or equal to 100 nanometers, and the second distance is less than or equal to 100 nanometers.

20. A flip-flop comprising:

a first input circuit coupled to a first node, and being configured to generate a first signal responsive to at least a first data signal, a first clock signal, or a second clock signal inverted from the first clock signal;

a first NAND logic gate coupled between the first node and a second node, and being configured to generate a second signal responsive to the first signal and a first set signal;

a first stacked gate circuit coupled between the first node and a third node, the first stacked gate circuit being configured to generate a third signal responsive to at least the first signal;

a first NOR logic gate coupled between the third node and a fourth node, and being configured to generate a fourth signal responsive to the third signal and a second set signal inverted from the first set signal;

a first reverse stacked gate circuit coupled between the first node and the second node, the first reverse stacked gate circuit being configured to set the first signal responsive to the second signal;

a first output circuit coupled to the fourth node, and being configured to generate a first output signal responsive to the fourth signal; and a first set buffer circuit coupled to the first NOR logic gate, the first set buffer circuit being configured to generate the second set signal responsive to the first set signal.

* * * * *